United States Patent
Odagawa et al.

(10) Patent No.: US 7,018,725 B2
(45) Date of Patent: *Mar. 28, 2006

(54) MAGNETO-RESISTANCE EFFECT ELEMENT MAGNETO-RESISTANCE EFFECT MEMORY CELL, MRAM, AND METHOD FOR PERFORMING INFORMATION WRITE TO OR READ FROM THE MAGNETO-RESISTANCE EFFECT MEMORY CELL

(75) Inventors: Akihiro Odagawa, Nara (JP); Hiroshi Sakakima, Kyotanabe (JP); Masayoshi Hiramoto, Ikoma (JP); Nozomu Matsukawa, Yamatokoriyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 910 days.

This patent is subject to a terminal disclaimer.

(21) Appl. No.: 10/034,895

(22) Filed: Dec. 28, 2001

(65) Prior Publication Data
US 2002/0058158 A1    May 16, 2002

Related U.S. Application Data

(62) Division of application No. 09/596,116, filed on Jun. 16, 2000, now Pat. No. 6,436,526.

(30) Foreign Application Priority Data
Jun. 17, 1999 (JP) ................. 11-170486
Dec. 13, 1999 (JP) ................. 11-352962

(51) Int. Cl.
*B32B 5/66* (2006.01)

(52) U.S. Cl. ............ 428/692; 428/694 R; 428/694 T; 428/694 TM; 428/694 TS; 428/336; 324/113; 360/126; 338/32 R

(58) Field of Classification Search ........... 428/692, 428/694 R, 694 T, 694 TM, 694 TS, 900, 428/336; 324/113; 360/126; 338/32 R
See application file for complete search history.

(56) References Cited

U.S. PATENT DOCUMENTS

| 5,640,343 | A | 6/1997 | Gallagher et al. ........ 365/171 |
| 5,650,958 | A | 7/1997 | Gallagher et al. ........ 365/173 |
| 5,686,838 | A | 11/1997 | van den Berg ........... 324/252 |
| 5,734,605 | A | 3/1998 | Zhu et al. .................. 365/173 |
| 5,793,697 | A | 8/1998 | Scheuerlein ........... 365/230.07 |
| 5,801,984 | A | 9/1998 | Parkin ....................... 365/158 |
| 5,838,608 | A | 11/1998 | Zhu et al. .................. 365/158 |

(Continued)

FOREIGN PATENT DOCUMENTS
EP    0 681 338    11/1995

(Continued)

OTHER PUBLICATIONS

Official Action dated Jul. 27, 2002 for Korean Patent Application No. 10-2000-0033485.

(Continued)

*Primary Examiner*—Leszek Kiliman
(74) *Attorney, Agent, or Firm*—Renner, Otto, Boisselle & Sklar, LLP

(57) ABSTRACT

A magneto-resistive effect element includes a first ferromagnetic film; a second ferromagnetic film; and a first nonmagnetic film interposed between the first ferromagnetic film and the second ferromagnetic film. The first ferromagnetic film has a magnetization more easily rotatable than a magnetization of the second ferromagnetic film by an external magnetic field. The first ferromagnetic film has an effective magnetic thickness of about 2 nm or less.

55 Claims, 16 Drawing Sheets

U.S. PATENT DOCUMENTS

| | | | |
|---|---|---|---|
| 5,841,611 A | 11/1998 | Sakakima et al. | 360/113 |
| 5,841,692 A | 11/1998 | Gallagher et al. | 365/173 |
| 6,436,526 B1 * | 8/2002 | Odagawa et al. | 428/332 |
| 6,767,655 B1 * | 7/2004 | Hiramoto et al. | 428/692 |

FOREIGN PATENT DOCUMENTS

| | | |
|---|---|---|
| EP | 0 910 092 | 4/1999 |
| EP | 1 003 176 | 5/2000 |

OTHER PUBLICATIONS

European Search Report, Application No. EP 00 11 2886, dated Mar. 5, 2001.

Patent Abstracts of Japan; vol. 1995, No. 04, May 31, 1995 & JP 07 014710 A (Fujitsu Ltd.), Jan. 17, 1995 abstract.

Sakakima et al.; "Magnetoresistance in CoMdB/Co(Fe)/Cu/Co(Fe) spin-valves"; Journal of Magnetism and Magnetic Materials; vol. 165, No. 1/03, 1997; pp. 108-110.

Lu et al.; "Bias voltage and temperature dependence of magnetotunneling effect"; 1998 American Institute of Physics; Jun. 1, 1998; pp. 6515-6517/.

European Search Report, Application No. EP 00 11 2886, dated Oct. 8, 2001.

\* cited by examiner

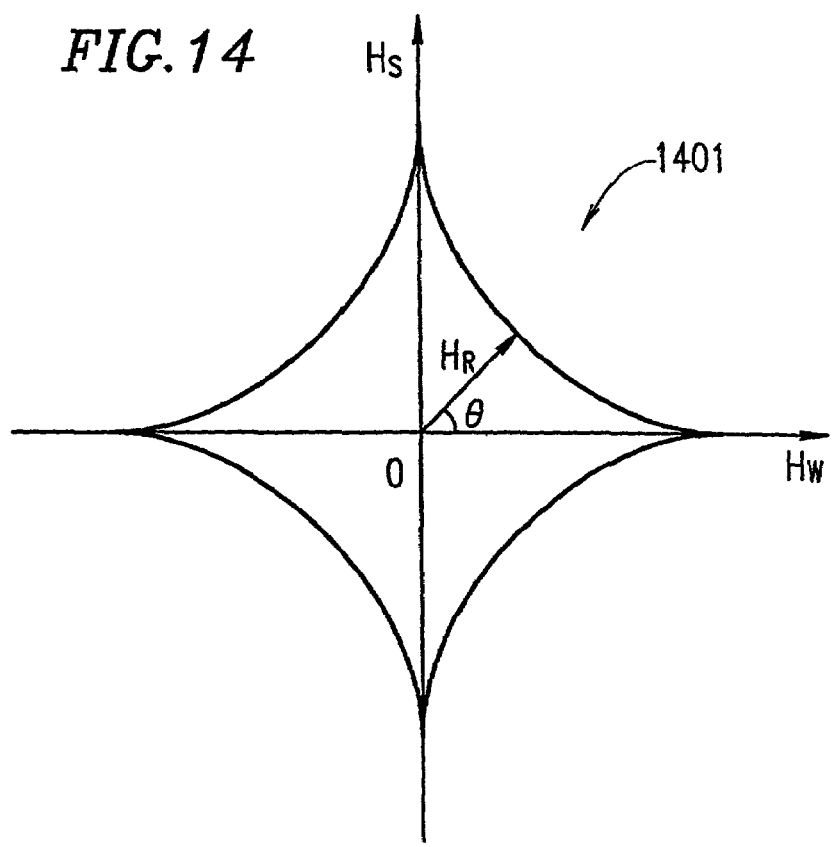
Hw: Magnetic field generated by word line
Hs: Magnetic field generated by sense line
HR: Synthesized magnetic field
θ : Angle of HR with respect to Hw

MAGNETO-RESISTANCE EFFECT ELEMENT MAGNETO-RESISTANCE EFFECT MEMORY CELL, MRAM, AND METHOD FOR PERFORMING INFORMATION WRITE TO OR READ FROM THE MAGNETO-RESISTANCE EFFECT MEMORY CELL

This is a division of application Ser. No. 09/596,116 filed Jun. 16, 2000, now U.S. Pat. No. 6,436,526.

BACKGROUND OF THE INVENTION

1. Field of the Invention

The present invention relates to a microscopic magneto-resistive effect element and a microscopic magneto-resistive effect memory cell, an MRAM including a plurality of such magneto-resistive effect elements or a plurality of magneto-resistive effect memory cells integrated at a high density, and a method for performing information write or read to or from the microscopic magneto-resistive effect memory cell.

2. Description of the Related Art

A magnetic random access memory (MRAM) using a magneto-resistive (MR) film was proposed by L. J. Schwee, Proc. INTERMAG Conf. IEEE Trans. on Magn. Kyoto (1972) pp. 405. Various types of MRAMs including word lines as current lines for generating a magnetic field and sense lines using MR films for reading data have been studied. One of such studies is described in A. V. Pohm et al., IEEE Trans. on Magn. 28 (1992) pp. 2356. Such memory devices generally use an NiFe film or the like exhibiting an anisotropic MR effect (AMR) having an MR change ratio of about 2%, and thus the level of an output signal needs to be improved.

M. N. Baibich et al., Phys. Rev. Lett. 61 (1988) pp. 2472 describes that an artificial lattice film formed of magnetic films exchange-coupled through a nonmagnetic film to each other shows a giant MR effect (GMR). K. T. M. Ranmuthu et al., IEEE Trans. on Magn. 29 (1993) pp. 2593 proposes an MRAM using a GMR film formed of magnetic films anti-ferromagnetically exchanged-coupled to each other. The GMR film exhibits a relatively large MR change ratio, but disadvantageously requires a larger magnetic field to be applied and thus requires a larger current for writing and reading information than an AMR film.

One exemplary type of non-coupling GMR film is a spin valve film. B. Dieny et al., J. Magn. Magn. Mater. 93 (1991) pp. 101 describes a spin valve film using an antiferromagnetic film. H. Sakakima et al., Jpn. J. Appl. Phys. 33 (1994) pp. L1668 describes a spin valve film using a semi-hard magnetic film. These spin valve films require a magnetic field as small as that required by the AMR films and still exhibit a larger MR change ratio than the AMR films. Y. Irie et al., Jpn. J. Appl. Phys. 34 (1995) pp. L415 describes an MRAM, formed of a spin valve film using an antiferromagnetic film or a hard magnetic film, which performs a non-destructive read out (NDRO).

The nonmagnetic film used for the above-described GMR films is a conductive film formed of Cu or the like. Tunneling GMR films (TMR) using $Al_2O_3$, MgO or the like as the nonmagnetic film have actively been studied, and MRAMs using the TMR film have been proposed.

It is known that the MR effect provided when a current flows perpendicular to the surface of a GMR film (CPPMR) is larger than the MR effect provided when a current flows parallel to the surface of the GMR film (CIPMR). A TMR film, which has a relatively high impedance, is expected to provide a sufficiently large output.

However, reduction in the size of an MRAM generates the following problems. A magnetic film usually has a thickness of about 1 nm to about 10 nm. In an MRAM having a width of on the order of submicrometers, the strength of an anti-magnetic field component is not negligible, and thus a relatively large magnetic field is required to magnetize the magnetic film. A relatively large magnetic coercive force is also required to maintain the magnetized state of the magnetic film. Thus, it is difficult to invert the magnetization by a magnetic field which is generated by a current flowing in word lines.

SUMMARY OF THE INVENTION

According to one aspect of the invention, a magneto-resistive effect element includes a first ferromagnetic film; a second ferromagnetic film; and a first nonmagnetic film interposed between the first ferromagnetic film and the second ferromagnetic film. The first ferromagnetic film has a magnetization more easily rotatable than a magnetization of the second ferromagnetic film by an external magnetic field. The first ferromagnetic film has an effective magnetic thickness of about 2 nm or less.

In one embodiment of the invention, at least one of the first ferromagnetic film and the second ferromagnetic film has a magnetization direction in a planar direction thereof.

In one embodiment of the invention, the second ferromagnetic film is formed of XMnSb, where X is at least one element selected from the group consisting of Ni, Pt, Pd and Cu.

In one embodiment of the invention, the first ferromagnetic film includes an amorphous magnetic film, and a third ferromagnetic film in contact with the first nonmagnetic film and interposed between the amorphous magnetic film and the first nonmagnetic film.

In one embodiment of the invention, the third ferromagnetic film has a thickness of about 0.2 nm or more and about 2 nm or less.

In one embodiment of the invention, the third ferromagnetic film has a thickness of about 0.8 nm or more and about 1.2 nm or less.

In one embodiment of the invention, the amorphous magnetic film includes at least one selected from the group consisting of CoFeB and CoMnB.

In one embodiment of the invention, the first ferromagnetic film includes a second nonmagnetic film, a fourth ferromagnetic film, and a fifth ferromagnetic film. The fourth ferromagnetic film and the fifth ferromagnetic film are antiferromagnetically exchange-coupled with each other through the second nonmagnetic film.

In one embodiment of the invention, the fourth ferromagnetic film and the fifth ferromagnetic film have different strengths of saturated magnetization from each other.

In one embodiment of the invention, the fourth ferromagnetic film and the fifth ferromagnetic film have different thicknesses from each other.

In one embodiment of the invention, the fourth ferromagnetic film and the fifth ferromagnetic film have a thickness difference of about 2 nm or less.

In one embodiment of the invention, the second nonmagnetic film is formed of Ru.

In one embodiment of the invention, the second nonmagnetic film is formed of one of Rh, Ir and Re.

In one embodiment of the invention, the second nonmagnetic film has a thickness of about 0.6 nm or more and about 0.8 nm or less.

In one embodiment of the invention, at least one of the fourth ferromagnetic film and the fifth ferromagnetic film contains at least one element selected from the group consisting of Ni, Co and Fe as a main component.

In one embodiment of the invention, the fourth ferromagnetic film and the fifth ferromagnetic film are magnetization-rotated while being kept anti-parallel to each other.

In one embodiment of the invention, the second ferromagnetic film includes a third nonmagnetic film, a sixth ferromagnetic film, and a seventh ferromagnetic film. The sixth ferromagnetic film and the seventh ferromagnetic film are antiferromagnetically exchange-coupled with each other through the third nonmagnetic film.

In one embodiment of the invention, the third nonmagnetic film is formed of Ru.

In one embodiment of the invention, the third nonmagnetic film is formed of one of Rh, Ir and Re.

In one embodiment of the invention, the third nonmagnetic film has a thickness of about 0.6 nm or more and about 0.8 nm or less.

In one embodiment of the invention, at least one of the sixth ferromagnetic film and the seventh ferromagnetic film contains at least one element selected from the group consisting of Ni, Co and Fe as a main component.

In one embodiment of the invention, the first nonmagnetic film is an insulating film.

In one embodiment of the invention, the insulating film contains at least one selected from the group consisting of $Al_2O_3$, MgO, a carbide and a nitride.

According to another aspect of the invention, a magneto-resistive effect memory cell includes a first ferromagnetic film; a second ferromagnetic film; a first nonmagnetic film interposed between the first ferromagnetic film and the second ferromagnetic film; and at least one conductive film for causing a magnetization rotation of at least the first ferromagnetic film. The first ferromagnetic film has a magnetization more easily rotatable than a magnetization of the second ferromagnetic film by an external magnetic field. The first ferromagnetic film has an effective magnetic thickness of about 2 nm or less.

In one embodiment of the invention, at least one of the first ferromagnetic film and the second ferromagnetic film has a magnetization direction in a planar direction thereof.

In one embodiment of the invention, the second ferromagnetic film is formed of XMnSb, where X is at least one element selected from the group consisting of Ni, Pt, Pd and Cu.

In one embodiment of the invention, the first ferromagnetic film includes an amorphous magnetic film, and a third ferromagnetic film in contact with the first nonmagnetic film and interposed between the amorphous magnetic film and the first nonmagnetic film.

In one embodiment of the invent ion, the third ferromagnetic film has a thickness of about 0.2 nm or more and about 2 nm or less.

In one embodiment of the invention, the third ferromagnetic film has a thickness of about 0.8 nm or more and about 1.2 nm or less.

In one embodiment of the invention, the amorphous magnetic film includes at least one selected from the group consisting of CoFeB and CoMnB.

In one embodiment of the invention, the first ferromagnetic film includes a second nonmagnetic film, a fourth ferromagnetic film, and a fifth ferromagnetic film. The fourth ferromagnetic film and the fifth ferromagnetic film are antiferromagnetically exchange-coupled with each other through the second nonmagnetic film.

In one embodiment of the invention, the fourth ferromagnetic film and the fifth ferromagnetic film have different strengths of saturated magnetization from each other.

In one embodiment of the invention, the fourth ferromagnetic film and the fifth ferromagnetic film have different thicknesses from each other.

In one embodiment of the invention, the fourth ferromagnetic film and the fifth ferromagnetic film have a thickness difference of about 2 nm or less.

In one embodiment of the invention, the second nonmagnetic film is formed of Ru.

In one embodiment of the invention, the second nonmagnetic film is formed of one of Rh, Ir and Re.

In one embodiment of the invention, the second nonmagnetic film has a thickness of about 0.6 nm or more and about 0.8 nm or less.

In one embodiment of the invention, at least one of the fourth ferromagnetic film and the fifth ferromagnetic film contains at least one element selected from the group consisting of Ni, Co and Fe as a main component.

In one embodiment of the invention, the fourth ferromagnetic film and the fifth ferromagnetic film are magnetization-rotated while being kept anti-parallel to each other.

In one embodiment of the invention, the second ferromagnetic film includes a third nonmagnetic film, a sixth ferromagnetic film, and a seventh ferromagnetic film. The sixth ferromagnetic film and the seventh ferromagnetic film are antiferromagnetically exchange-coupled with each other through the third nonmagnetic film.

In one embodiment of the invention, the third nonmagnetic film is formed of Ru.

In one embodiment of the invention, the third nonmagnetic film is formed of one of Rh, Ir and Re.

In one embodiment of the invention, the third nonmagnetic film has a thickness of about 0.6 nm or more and about 0.8 nm or less.

In one embodiment of the invention, at least one of the sixth ferromagnetic film and the seventh ferromagnetic film contains at least one element selected from the group consisting of Ni, Co and Fe as a main component.

In one embodiment of the invention, the first nonmagnetic film is an insulating film.

In one embodiment of the invention, the insulating film contains at least one selected from the group consisting of $Al_2O_3$, MgO, a carbide and a nitride.

In one embodiment of the invention, at least two layer structures are provided, each layer structure including the first ferromagnetic film, the second ferromagnetic film, and the first nonmagnetic film interposed between the first ferromagnetic film and the second ferromagnetic film. The at least two layer structures are stacked with at least one fourth nonmagnetic film interposed therebetween.

In one embodiment of the invention, the second ferromagnetic films of the at least two layer structures have different magnetic coercive forces from each other.

According to still another aspect of the invention, an MRAM includes a plurality of the above-described magneto-resistive effect memory cells. The plurality of conductive films are arranged in at least one prescribed direction.

According to still another aspect of the invention, a magneto-resistive effect element includes a first ferromagnetic film; a second ferromagnetic film; and a nonmagnetic film interposed between the first ferromagnetic film and the second ferromagnetic film. The first ferromagnetic film has a magnetization more easily rotatable than a magnetization of the second ferromagnetic film by an external magnetic field. The first ferromagnetic film includes an amorphous magnetic film, and a third ferromagnetic film in contact with the nonmagnetic film and interposed between the amorphous magnetic film and the nonmagnetic film.

In one embodiment of the invention, at least one of the first ferromagnetic film and the second ferromagnetic film has a magnetization direction in a planar direction thereof.

In one embodiment of the invention, the nonmagnetic film is an insulating film.

According to still another aspect of the invention, a magneto-resistive effect element includes a first ferromagnetic film; a second ferromagnetic film; and a first nonmagnetic film interposed between the first ferromagnetic film and the second ferromagnetic film. The first ferromagnetic film has a magnetization more easily rotatable than a magnetization of the second ferromagnetic film by an external magnetic field. The first ferromagnetic film includes a second nonmagnetic film, a third ferromagnetic film, and a fourth ferromagnetic film. The third ferromagnetic film and the fourth ferromagnetic film are antiferromagnetically exchange-coupled with each other through the second nonmagnetic film.

In one embodiment of the invention, at least one of the first ferromagnetic film and the second ferromagnetic film has a magnetization direction in a planar direction thereof.

In one embodiment of the invention, the third ferromagnetic film and the fourth ferromagnetic film have different strengths of saturated magnetization from each other.

In one embodiment of the invention, the third ferromagnetic film and the fourth ferromagnetic film have different thicknesses from each other.

In one embodiment of the invention, the third ferromagnetic film and the fourth ferromagnetic film are magnetization-rotated while being kept anti-parallel to each other.

In one embodiment of the invention, the second ferromagnetic film includes a third nonmagnetic film, a fifth ferromagnetic film, and a sixth ferromagnetic film. The fifth ferromagnetic film and the sixth ferromagnetic film are antiferromagnetically exchange-coupled with each other through the third nonmagnetic film.

In one embodiment of the invention, the first nonmagnetic film is an insulating film.

According to still another aspect of the invention, a magneto-resistive effect memory cell includes a first ferromagnetic film; a second ferromagnetic film; a first nonmagnetic film interposed between the first ferromagnetic film and the second ferromagnetic film; and at least one conductive film for causing a magnetization rotation of at least the first ferromagnetic film. The first ferromagnetic film has a magnetization more easily rotatable the a magnetization of the second ferromagnetic film by an external magnetic field. The first ferromagnetic film includes an amorphous magnetic film, and a third nonmagnetic film in contact with the first nonmagnetic film and interposed between the amorphous film and the first nonmagnetic film.

In one embodiment of the invention, at least one of the first ferromagnetic film and the second ferromagnetic film has a magnetization direction in a planar direction thereof.

In one embodiment of the invention, the first nonmagnetic film is an insulating film.

In one embodiment of the invention, at least two layer structures are provided, each layer structure including the first ferromagnetic film, the second ferromagnetic film, and the first nonmagnetic film interposed between the first ferromagnetic film and the second ferromagnetic film. The at least two layer structures are stacked with at least one second nonmagnetic film interposed therebetween.

In one embodiment of the invention, the second ferromagnetic films of the at least two layer structures have different magnetic coercive forces from each other.

According to still another aspect of the invention, an MRAM includes a plurality of the above-described magneto-resistive effect memory cells. The plurality of conductive films are arranged in at least one prescribed direction.

According to still another aspect of the invention, a magneto-resistive effect memory cell includes a first ferromagnetic film; a second ferromagnetic film; a first nonmagnetic film interposed between the first ferromagnetic film and the second ferromagnetic film; and at least one conductive film for causing a magnetization rotation of at least the first ferromagnetic film. The first ferromagnetic film has a magnetization more easily rotatable than a magnetization of the second ferromagnetic film by an external magnetic field. The first ferromagnetic film includes a second nonmagnetic film, a third ferromagnetic film, and a fourth ferromagnetic film. The third ferromagnetic film and the fourth ferromagnetic film are antiferromagnetically exchange-coupled with each other through the second nonmagnetic film.

In one embodiment of the invention, a magneto-resistive effect memory cell at least one of the first ferromagnetic film and the second ferromagnetic film has a magnetization direction in a planar direction thereof.

In one embodiment of the invention, the third ferromagnetic film and the fourth ferromagnetic film have different strengths of saturated magnetization from each other.

In one embodiment of the invention, the third ferromagnetic film and the fourth ferromagnetic film have different thicknesses from each other.

In one embodiment of the invention, the third ferromagnetic film and the fourth ferromagnetic film are magnetization-rotated while being kept anti-parallel to each other.

In one embodiment of the invention, the second ferromagnetic film includes a third nonmagnetic film, a fifth ferromagnetic film, and a sixth ferromagnetic film. The fifth ferromagnetic film and the sixth ferromagnetic film are antiferromagnetically exchange-coupled with each other through the third nonmagnetic film.

In one embodiment of the invention, the first nonmagnetic film is an insulating film.

In one embodiment of the invention, at least two layer structures are provided, each layer structure including the first ferromagnetic film, the second ferromagnetic film, and the first nonmagnetic film interposed between the first ferromagnetic film and the second ferromagnetic film. The at least two layer structures are stacked with at least one fourth nonmagnetic film interposed therebetween.

In one embodiment of the invention, the second ferromagnetic films of the at least two layer structures have different magnetic coercive forces from each other.

According to still another aspect of the invention, an MRAM includes a plurality of the above-described magneto-resistive effect memory cells. The plurality of conductive films are arranged in at least one prescribed direction.

According to still another aspect of the invention, a method for writing information to and reading information from a magneto-resistive effect memory cell is provided. The magneto-resistive effect memory cell includes a first ferromagnetic film, a second ferromagnetic film, a nonmagnetic film interposed between the first ferromagnetic film and the second ferromagnetic film, and at least one conductive film. The first ferromagnetic film has a magnetization more easily rotatable than a magnetization of the second ferromagnetic film by an external magnetic field. The method includes the steps of causing a first current to flow in the at least one conductive film to cause a magnetization rotation of at least the first ferromagnetic film, thereby writing information in the magneto-resistive effect memory cell; and causing a second current to flow in the first ferromagnetic film, the nonmagnetic film, and the second ferromagnetic film, and causing a third current, which is a combination of a positive bias current and a negative bias current, to flow in the at least one conductive film, thereby reading a voltage value corresponding to the second current and thus reading information written in the magneto-resistive element memory cell.

In one embodiment of the invention, the third current has a level which causes a magnetization rotation of the first ferromagnetic film but does not cause a magnetization rotation of the second ferromagnetic film.

According to still anther aspect of the invention, a method for writing information to and reading information from an MRAM including a plurality of magneto-resistive effect memory cells is provided. Each magneto-resistive effect memory cell includes a first ferromagnetic film, a second ferromagnetic film, a nonmagnetic film interposed between the first ferromagnetic film and the second ferromagnetic film, and at least one conductive film. The first ferromagnetic film has a magnetization more easily rotatable than a magnetization of the second ferromagnetic film by an external magnetic field. The plurality of conductive films are arranged in at least one prescribed direction. The method includes the steps of causing a first current to flow in the at least one conductive film of a first magneto-resistive effect memory cell of the plurality of magneto-resistive effect memory cells to cause a magnetization rotation of at least the first ferromagnetic film of the first magneto-resistive effect memory cell, thereby writing information in the first magneto-resistive effect memory cell; and causing a second current to flow in the first ferromagnetic film, the nonmagnetic film, and the second ferromagnetic film of the first magneto-resistive effect memory cell, and causing a third current, which is a combination of a positive bias current and a negative bias current, to flow in the at least one conductive film of the first magneto-resistive effect memory cell, thereby reading a voltage value corresponding to the second current and thus reading information written in the first magneto-resistive effect memory cell.

In one embodiment of the invention, the third current has a level which causes a magnetization rotation of the first ferromagnetic film but does not cause a magnetization rotation of the second ferromagnetic film.

In one embodiment of the invention, the method further includes the step of causing a fourth current to flow in the at least one conductive film of a second magneto-resistive effect memory cell other than the first magneto-resistive effect memory cell, the fourth current flowing in a direction for canceling a magnetic field leaked to a third magneto-resistive effect memory cell other than the first magneto-resistive effect memory cell.

In one embodiment of the invention, the second magneto-resistive effect memory cell is identical with the third magneto-resistive effect memory cell.

According to still another aspect of the invention, a method for reading information from a magneto-resistive effect memory cell is provided. The magneto-resistive effect memory cell includes a first ferromagnetic film, a second ferromagnetic film, a nonmagnetic film interposed between the first ferromagnetic film and the second ferromagnetic film, and at least one conductive film. The first ferromagnetic film has a magnetization more easily rotatable than a magnetization of the second ferromagnetic film by an external magnetic field. The method includes the step of causing a first current to flow in the first ferromagnetic film, the nonmagnetic film, and the second ferromagnetic film, and causing a second current, which is a combination of a positive bias current and a negative bias current, to flow in the at least one conductive film, thereby reading a voltage value corresponding to the first current and thus reading information written in the magneto-resistive effect memory cell.

In one embodiment of the invention, the second current has a level which causes a magnetization rotation of the first ferromagnetic film but does not cause a magnetization rotation of the second ferromagnetic film.

According to still another aspect of the invention, a method for reading information from an MRAM including a plurality of magneto-resistive effect memory cells is provided. Each magneto-resistive effect memory cell includes a first ferromagnetic film, a second ferromagnetic film, a nonmagnetic film interposed between the first ferromagnetic film and the second ferromagnetic film, and at least one conductive film. The first ferromagnetic film has a magnetization more easily rotatable than a magnetization of the second ferromagnetic film by an external magnetic field. The plurality of conductive films are arranged in at-least one prescribed direction. The method includes the step of causing a first current to flow in the first ferromagnetic film, the nonmagnetic film, and the second ferromagnetic film of a first magneto-resistive effect memory cell of the plurality of magneto-resistive effect memory cells, and causing a second current, which is a combination of a positive bias current and a negative bias current, to flow in the at least one conductive film of the first magneto-resistive effect memory cell, thereby reading a voltage value corresponding to the first current and thus reading information written in the first magneto-resistive effect memory cell.

In one embodiment of the invention, the second current has a level which causes a magnetization rotation of the first ferromagnetic film but does not cause a magnetization rotation of the second ferromagnetic film.

In one embodiment of the invention, the method further includes the step of causing a third current to flow in the at least one conductive film of a second magneto-resistive effect memory cell other than the first magneto-resistive effect memory cell, the third current flowing in a direction for canceling a magnetic field leaked to a third magneto-resistive effect memory cell other than the first magneto-resistive effect memory cell.

In one embodiment of the invention, the second magneto-resistive effect memory cell is identical with the third magneto-resistive effect memory cell.

According to still another aspect of the invention, a method for writing multiple levels of a signal to and reading multiple levels of a signal from a magneto-resistive effect memory cell is provided. The magneto-resistive effect memory cell includes at least two layer structures; at least one first nonmagnetic film interposed between the at least two layer structures; and at least one conductive film. Each of the at least two layer structures includes a first ferromagnetic film, a second ferromagnetic film, and a second nonmagnetic film interposed between the first ferromagnetic film and the second ferromagnetic film. The first ferromagnetic film has a magnetization more easily rotatable than a magnetization of the second ferromagnetic film. The method includes the steps of causing a first current in the at least one conductive film to cause a magnetization rotation of at least one of the first ferromagnetic film and the second ferromagnetic film of each of the at least two layer structures, or to cause a magnetization rotation of none of the first ferromagnetic film and the second ferromagnetic film of each of the at least two layer structures, thereby writing multiple levels of a signal in the magneto-resistive effect memory cell; and causing a second current to each of the at least two layer structures to compare a resistance value corresponding to the second current and a reference resistance value, thereby reading the multiple levels of the signal written in the magneto-resistive effect memory cell.

In one embodiment of the invention, the method further includes the step of causing a current which rises in a gradually increasing manner to flow in the at least one conductive film.

According to still another aspect of the invention, a method for writing multiple levels of a signal to a magneto-resistive effect memory cell is provided. The magneto-resistive effect memory cell includes at least two layer structures; at least one first nonmagnetic film interposed between the at least two layer structures; and at least one conductive film. Each of the at least two layer structures includes a first ferromagnetic film, a second ferromagnetic film, and a second nonmagnetic film interposed between the first ferromagnetic film and the second ferromagnetic film. The first ferromagnetic film has a magnetization more easily rotatable than a magnetization of the second ferromagnetic film. The method includes the steps of causing a first current to flow in the at least one conductive film to cause a magnetization rotation of at least one of the first ferromagnetic film and the second ferromagnetic film of each of the at least two layer structures, or to cause a magnetization rotation of none of the first ferromagnetic film and the second ferromagnetic film of each of the at least two layer structures, thereby writing multiple levels of a signal in the magneto-resistive effect memory cell.

According to still another aspect of the invention, a method for reading multiple levels of a signal from a magneto-resistive effect memory cell is provided. The magneto-resistive effect memory cell includes at least two layer structures; at least one first nonmagnetic film interposed between the at least two layer structures; and at least one conductive film. Each of the at least two layer structures includes a first ferromagnetic film, a second ferromagnetic film, and a second nonmagnetic film interposed between the first ferromagnetic film and the second ferromagnetic film. The first ferromagnetic film has a magnetization more easily rotatable than a magnetization of the second ferromagnetic film. The method includes the steps of causing a first current to flow in each of the at least two layer structures to compare a resistance value corresponding to the first current and a reference resistance value, thereby reading multiple levels of a signal written in the magneto-resistive effect memory cell.

In one embodiment of the invention, the method further includes the step of causing a current which rises in a gradually increasing manner to flow in the at least one conductive film.

According to still another aspect of the invention, a method for writing multiple levels of a signal to and reading multiple levels of a signal from an MRAM including a plurality of magneto-resistive effect memory cells is provided. Each magneto-resistive effect memory cell includes at least two layer structures; at least one first nonmagnetic film interposed between the at least two layer structures; and at least one conductive film. Each of the at least two layer structures includes a first ferromagnetic film, a second ferromagnetic film, and a second nonmagnetic film interposed between the first ferromagnetic film and the second ferromagnetic film. The first ferromagnetic film has a magnetization more easily rotatable than a magnetization of the second ferromagnetic film. The plurality of conductive films are arranged in at least one prescribed direction. The method includes the steps of causing a first current to flow in the at least one conductive film of a first magneto-resistive effect memory cell of the plurality of magneto-resistive effect memory cells to cause a magnetization rotation of at least one of the first ferromagnetic film and the second ferromagnetic film of each of the at least two layer structures of the first magneto-resistive effect memory cell, or to cause a magnetization rotation of none of the first ferromagnetic film and the second ferromagnetic film of each of the at least two layer structures of the first magneto-resistive effect memory cell, thereby writing multiple levels of a signal in the first magneto-resistive effect memory cell; and causing a second current to flow in each of the at least two layer structures of the first magneto-resistive effect memory cell to compare a resistance value corresponding to the second current and a reference resistance value, thereby reading the multiple levels of the signal written in the first magneto-resistive effect memory cell.

In one embodiment of the invention, the method further includes the step of causing a current which rises in a gradually increasing manner to flow in the at least one conductive film.

In one embodiment of the invention, the method further includes the step of causing a third current to flow in the at least one conductive film of a second magneto-resistive effect memory cell other than the first magneto-resistive effect memory cell, the third current flowing in a direction for canceling a magnetic field leaked to a third magneto-resistive effect memory cell other than the first magneto-resistive effect memory cell.

In one embodiment of the invention, the second magneto-resistive effect memory cell is identical with the third magneto-resistive effect memory cell.

According to still another aspect of the invention, a method for writing multiple levels of a signal in an MRAM including a plurality of magneto-resistive effect memory cells is provided. Each magneto-resistive effect memory cell includes at least two layer structures; at least one first nonmagnetic film interposed between the at least two layer structures; and at least one conductive film. Each of the at least two layer structures includes a first ferromagnetic film, a second ferromagnetic film, and a second nonmagnetic film interposed between the first ferromagnetic film and the second ferromagnetic film. The first ferromagnetic film has a magnetization more easily rotatable than a magnetization of the second ferromagnetic film. The plurality of conductive films are arranged in at least one prescribed direction. The method includes the steps of causing a first current of flow in the at least one conductive film of a first magneto-resistive effect memory cell of the plurality of magneto-resistive effect memory cells to cause a magnetization rotation of at least one of the first ferromagnetic film and the second ferromagnetic film of each of the at least two layer structures of the first magneto-resistive effect memory cell, or to cause a magnetization rotation of none of the first ferromagnetic film and the second ferromagnetic film of each of the at least two layer structures of the first magneto-resistive effect memory cell, thereby writing multiple levels of a signal in the first magneto-resistive effect memory cell.

In one embodiment of the invention, the method further includes the step of causing a second current to flow in the at least one conductive film of a second magneto-resistive effect memory cell other than the first magneto-resistive effect memory cell, the second current flowing in a direction for canceling a magnetic field leaked to a third magneto-resistive effect memory cell other than the first magneto-resistive effect memory cell.

In one embodiment of the invention, the second magneto-resistive effect memory cell is identical with the third magneto-resistive effect memory cell.

According to still another aspect of the invention, a method for reading multiple levels of a signal from an MRAM including a plurality of magneto-resistive effect memory cells is provided. Each magneto-resistive effect memory cell includes at least two layer structures; at least one first nonmagnetic film interposed between the at least two layer structures; and at least one conductive film. Each of the at least two layer structures includes a first ferromagnetic film, a second ferromagnetic film, and a second nonmagnetic film interposed between the first ferromagnetic film and the second ferromagnetic film. The first ferromagnetic film has a magnetization more easily rotatable than a magnetization of the second ferromagnetic film. The plurality of conductive films are arranged in at least one prescribed direction. The method includes the steps of causing a first current to flow in each of the at least two layer structures of a first magneto-resistive effect memory cell of the plurality of magneto-resistive effect memory cells to compare a resistance value corresponding to a the first current and a reference resistance value, thereby reading multiple levels of a signal written in the first magneto-resistive effect memory cell.

In one embodiment of the invention, the method further includes the step of causing a current which rises in a gradually increasing manner to flow in the at least one conductive film.

In one embodiment of the invention, the method further includes the step of causing a second current to flow in the at least one conductive film of a second magneto-resistive effect memory cell other than the first magneto-resistive effect memory cell, the second current flowing in a direction for canceling a magnetic field leaked to a third magneto-resistive effect memory cell other than the first magneto-resistive effect memory cell.

In one embodiment of the invention, the second magneto-resistive effect memory cell is identical with the third magneto-resistive effect memory cell.

According to one aspect of the present invention, a free layer in which the magnetization direction is relatively easily rotatable by the external magnetic field includes a ferromagnetic film having a small magnetic coercive force even though being thin, and an amorphous film. According to another aspect of the present invention, a free layer includes a synthesized ferrimagnetic film including ferromagnetic films which are antiferromagnetically exchange-coupled to each other.

Thus, the invention described herein makes possible the advantages of providing a microscopic magnetic magneto-resistive effect element and a microscopic magneto-resistive effect memory cell which include a ferromagnetic film and are sufficiently easily operable as a result of the strength of the anti-magnetic component of the ferromagnetic film being reduced, an MRAM including a plurality of such magneto-resistive effect elements or a plurality of magneto-resistive effect memory cells integrated at a high density, and a method for performing information write or read to or from the microscopic magneto-resistive effect memory cell.

These and other advantages of the present invention will become apparent to those skilled in the art upon reading and understanding the following detailed description with reference to the accompanying figures.

BRIEF DESCRIPTION OF THE DRAWINGS

FIG. 14 is an asteroid-type magnetic field curve of the MR effect memory cell in the twentieth example;

DESCRIPTION OF THE EMBODIMENTS

Hereinafter, the present invention will be described by way of illustrative examples with reference to the accompanying drawings.

EXAMPLE 1

Figure 1:
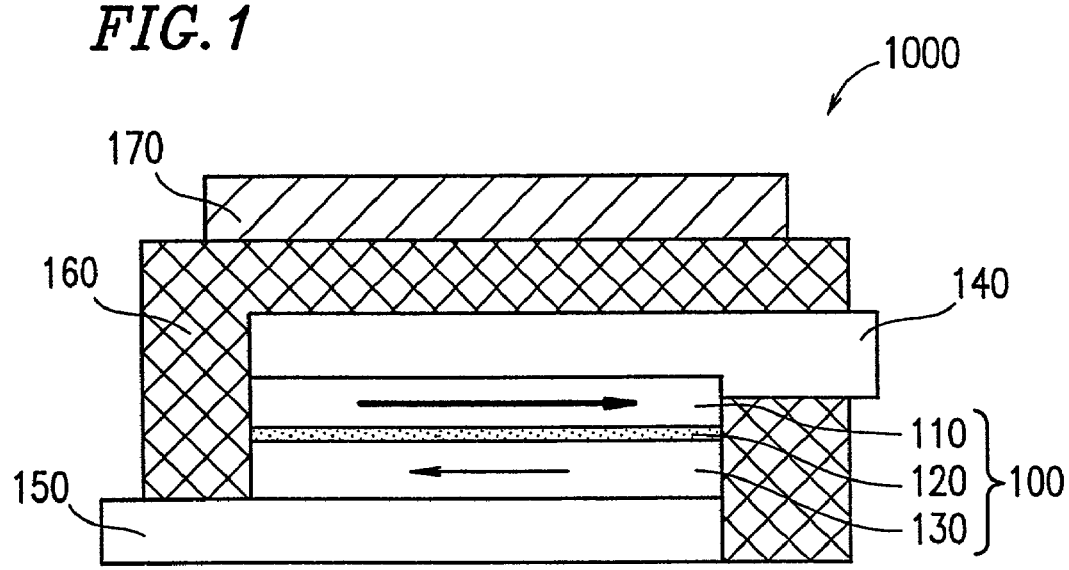
FIG. 1 is a cross-sectional view of an MR effect memory cell in a first example according to the present invention.

FIG. 1 shows a cross-sectional view of an MR effect memory cell 1000 in a first example according to the present invention.

The MR effect memory cell 1000 is a spin valve-type MR effect memory cell using a hard magnetic film (hereinafter, referred to as an "HM spin valve-type MR effect memory cell").

The MR effect memory cell 1000 includes a MR portion 100, conductive films 140, 150 and 170, and an insulating film 160. The conductive films 140 and 150 respectively act as a part of a sense line and a bit line, or vice versa when the MR effect memory cell 1000 is incorporated into an MRAM. The conductive film 170 acts as a part of a word line when the MR effect memory cell 1000 is incorporated into an MRAM. The MR portion 100 includes a hard magnetic film 110 (second ferromagnetic film) a nonmagnetic insulating film 120, and a soft magnetic film 130 (first ferromagnetic film). The soft magnetic film 130 is more easily magnetization-rotated than the hard magnetic film 110 by an external magnetic field. The MR portion 100 is electrically connected with the conductive films 140 and 150. The conductive film 170 is provided above the MR portion 100 with the insulating film 160 interposed therebetween.

In the drawings attached to this specification, the arrows shown in magnetic films represent the directions of the magnetization of the respective magnetic films. It should be noted that the magnetization direction of each magnetic film is not limited to the magnetization direction shown in the drawings and is variable in various examples. The magnetization direction can also be changed by a writing operation and a reading operation.

The MR effect memory cell 1000 operates as follows. Information is written by causing magnetization inversion of the hard magnetic film 110 by a magnetic field generated by a current which flows in the conductive film 170 (word line). Information is read by causing magnetization inversion of the soft magnetic film 130 without causing magnetization inversion of the hard magnetic film 110. A magnetic field can be generated by causing a current to flow in the conductive film 140 or 150 which acts as the sense line in addition to the conductive film 170. In this case, it is preferable that the sense line formed of a plurality of conductive films 140 or conductive films 150 and the word lines formed of a plurality of conductive films 170 are perpendicular to each other.

Such an information write and read operation realizes a non-destructive read out (NDRO) of the MR effect memory cell 1000. In this case, magnetization inversion requires two magnetic field strength threshold values, i.e., a writing threshold value Hh and a reading threshold value Hs which respectively correspond to a magnetic coercive force of the hard magnetic film 110 and a magnetic coercive force of a soft magnetic film 130.

Figure 2A:
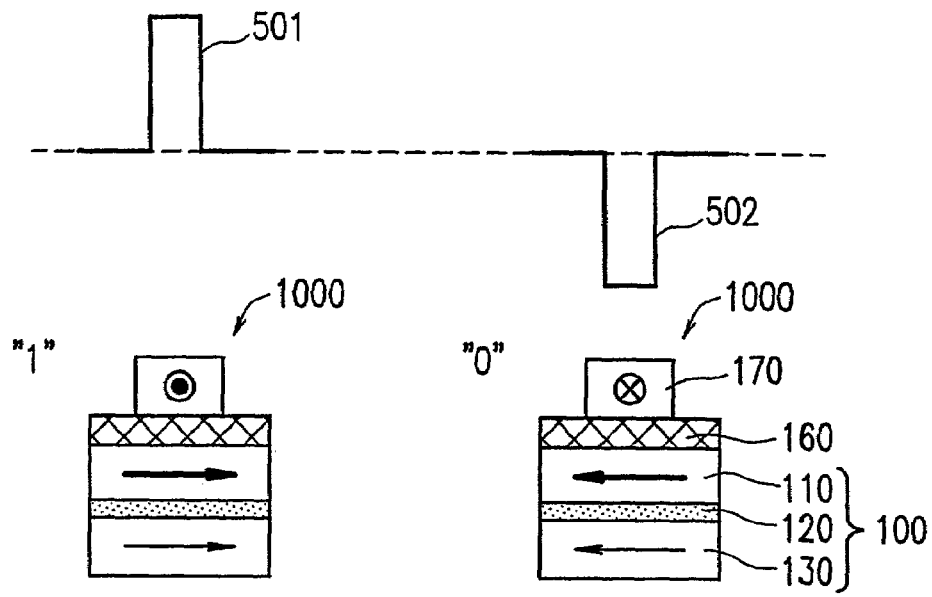
FIGS. 2A and 2B are diagrams illustrating an operation principle of the MR effect memory cell in the first example.
Figure 2B:
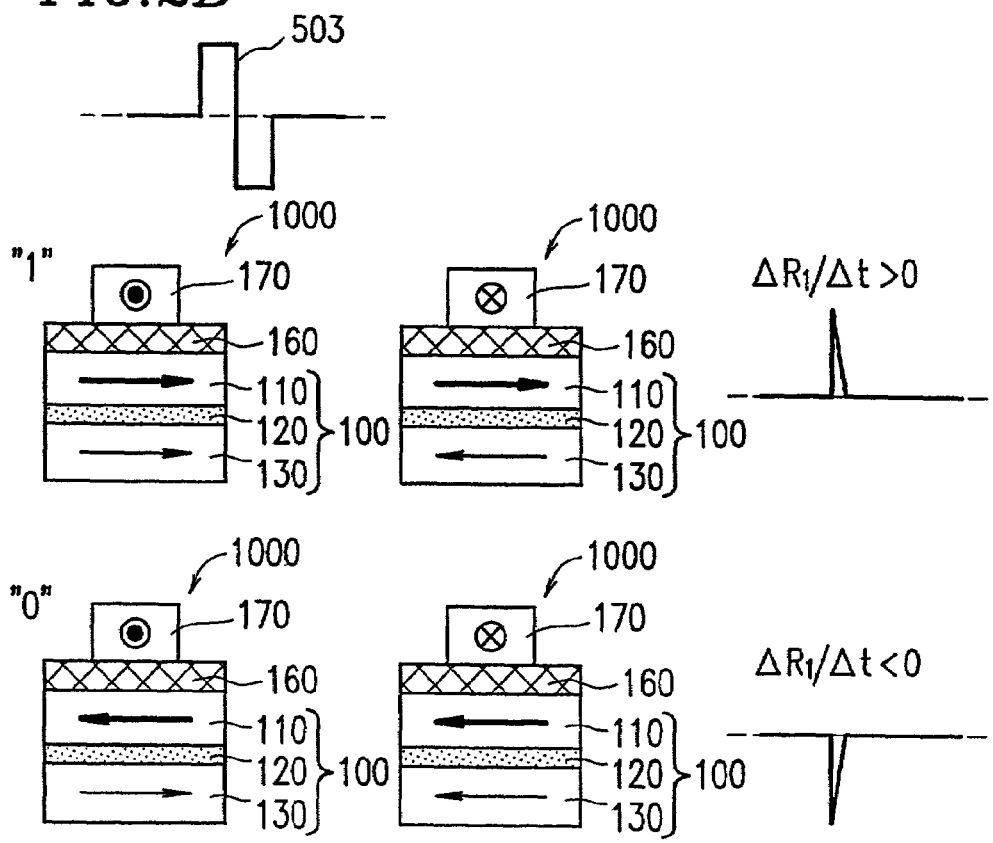

FIGS. 2A and 2B show an operation principle of the MR effect memory cell 1000. A signal or data is written in the MR effect memory cell 1000 as follows. A positive pulse current 501 or a negative pulse current 502 is caused to flow in the conductive film 170 to apply a magnetic field which exceeds the writing threshold value Hh corresponding to the magnetic coercive force of the hard magnetic film 110 to the hard magnetic film 110, thus causing magnetization inversion of the hard magnetic film 110. The level of the signal, i.e., "1" or "0" is written corresponding to the magnetization direction of the hard magnetic film 110.

The written signal or data is read as follows. While a constant current flows in the conductive films 140 and 150 (FIG. 1), a weak pulse current is caused to flow in the conductive film 170, thus generating a magnetic field having a strength which is equal to or more than the threshold value Hs corresponding to the magnetic coercive force of the soft magnetic film 130 and is equal to or less than the threshold value Hh corresponding to the magnetic coercive force of the hard magnetic film 110. The signal is read by determining whether the magnetization inversion of the soft magnetic film 130 is caused or not. Specifically, the level of the signal, i.e., the data storage state is identified to be "1" or "0" by monitoring a change in the resistance value of the MR portion 100 through the conductive films 140 and 150.

When a current similar to the positive pulse current 501 is caused to flow in the conductive film 170 while the MR effect memory cell 1000 is in the data storage state of "1" (FIG. 2A), the resistance value of the MR portion 100 is not changed. When a current similar to the positive pulse current 501 is caused to flow in the conductive film 170 while the MR effect memory cell 1000 is in the data storage state of "0" (FIG. 2A), the resistance value of the MR portion 100 increases. When a current similar to the negative pulse current 502 is caused to flow in the conductive film 170, the result is opposite to the above.

When a pulse current 503 having a combination of positive and negative pulses is caused to flow in the conductive film 170 while the MR effect memory cell 1000 is in the data storage state of "1", the resistance value of the MR portion 100 changes from 0 to a positive value. Thus, the change ratio ($\Delta R_1/\Delta t$) is positive. By contrast, when the pulse current 503 is caused to flow in the conductive film 170 while the MR effect memory cell 1000 is in the data storage state of "0", the change ratio ($\Delta R_1/\Delta t$) is negative. It should be noted that the pulse current 503 has a level which does not cause magnetization inversion of the hard magnetic film 110 but can cause magnetization inversion of the soft magnetic film 130.

The above-described operation principle allows a signal to be read from the MR effect memory cell 1000. In an HM spin valve-type MR effect memory cell such as the MR effect memory cell 1000, the magnetization state of the hard magnetic film 110 does not change while a signal is being read and thus an NDRO is possible.

A semi-hard magnetic film is usable instead of the hard magnetic film 110.

The hard magnetic film 110 and the soft magnetic film 130 can be located opposite of each other.

Especially when the conductive film 170 is used for applying a magnetic field to the MR portion 100, the soft magnetic film 130 is preferably located as close as possible to the conductive film 170.

Herein, an example of a so-called constant current mode is described, in which a change in the resistance value occurring while a constant current is applied is detected as a voltage change. Alternatively, a so-called constant voltage mode is usable, in which a change in the current level occurring while a constant voltage is applied is detected as a current change.

The structure of the MR effect memory cell 1000 is usable as an MR effect element. The MR effect element is usable as a magnetic head, and a magnetic field applied from a recording medium or the like is sensed by the MR portion 100. The conductive film 170 can be eliminated when the MR effect element is used as a magnetic head.

EXAMPLE 2

Figure 3:
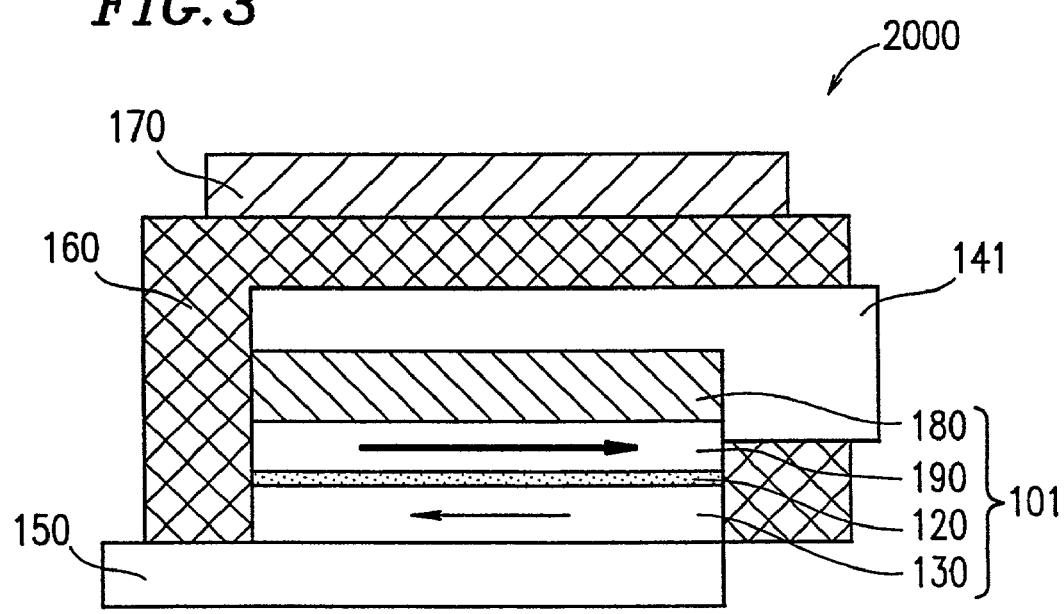
FIG. 3 is a cross-sectional view of an MR effect memory cell in a second example according to the present invention.

FIG. 3 shows a cross-sectional view of an MR effect memory cell 2000 in a second example according to the present invention. Throughout this specification, identical elements previously discussed with respect to figures bear identical reference numerals and the detailed descriptions thereof will be omitted.

The MR effect memory cell 2000 is a spin valve-type MR effect memory cell using an antiferromagnetic film (hereinafter, referred to as an "AF spin valve-type MR effect memory cell").

The MR effect memory cell 2000 includes a MR portion 101, conductive films 141, 150 and 170, and an insulating film 160. The conductive films 141 and 150 respectively act as a part of a sense line and a bit line, or vice versa when the MR effect memory cell 2000 is incorporated into an MRAM. The conductive film 170 acts as a part of a word line when the MR effect memory cell 2000 is incorporated into an MRAM. The MR portion 101 includes an antiferromagnetic film 180, a ferromagnetic film 190 (second ferromagnetic film) exchange-coupled with the antiferromagnetic film 180, a nonmagnetic insulating film 120, and a soft magnetic film 130 (first ferromagnetic film). The MR portion 101 is electrically connected with the conductive films 141 and 150. The soft magnetic film 130 is more easily magnetization-rotated than the ferromagnetic film 190 by an external magnetic field.

A magnetic field generated by a current flowing in the conductive film 170 (word line) does not cause magnetization inversion in the ferromagnetic film 190 but causes magnetization inversion only in the soft magnetic film 130 which is magnetically separated from the ferromagnetic film 190 by the nonmagnetic insulating film 120. Accordingly, information write and read is performed only by magnetization inversion of the soft magnetic film 130. Therefore, although it is difficult to realize an NDRO, there is only one magnetic field threshold value required for causing magnetization inversion and thus the operation principle is simple.

Figure 4A:
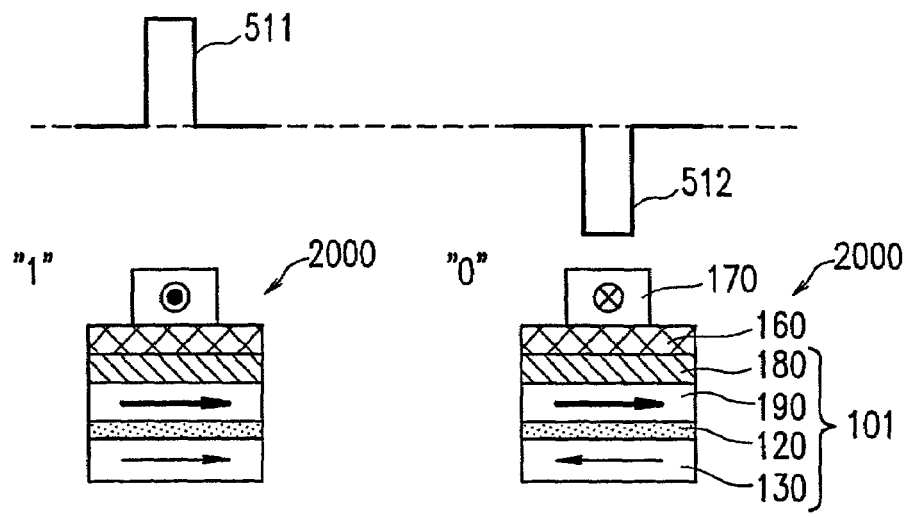
FIGS. 4A through 4C are diagrams illustrating an operation principle of the MR effect memory cell in the second example.
Figure 4B:
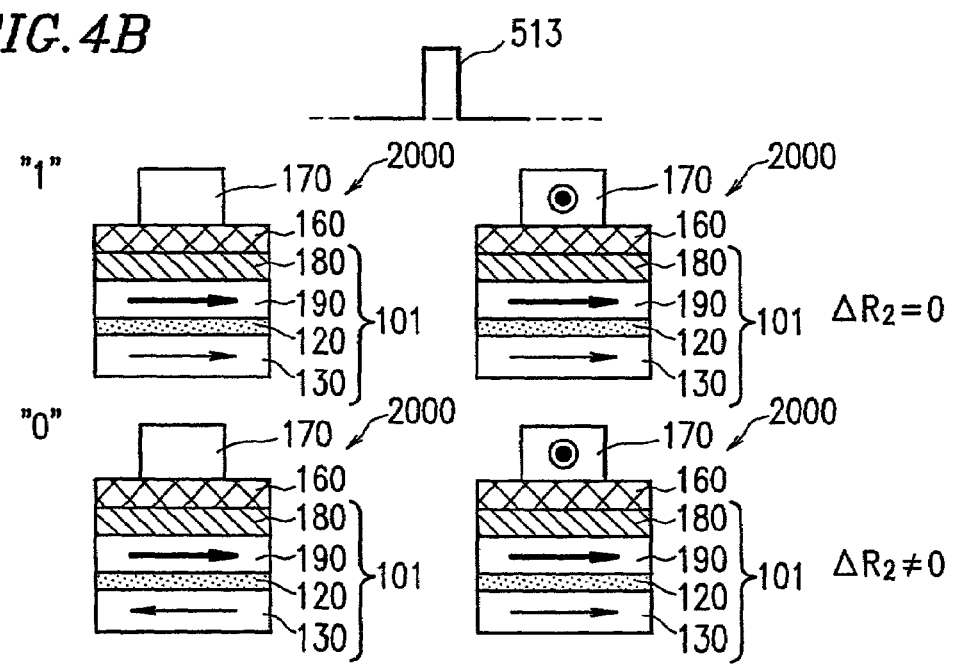

FIGS. 4A and 4B show an operation principle of the MR effect memory cell 2000.

The ferromagnetic film 190 is exchange-coupled with the antiferromagnetic 180, and the magnetization of the ferromagnetic film 190 is pinned in one direction.

A signal or data is written in the MR effect memory cell 2000 as follows. A positive pulse current 511 or a negative pulse current 512 is caused to flow in the magnetic film 170 to apply a magnetic field which is equal to or more than the reading threshold value Hs corresponding to a magnetic coercive force of the soft magnetic film 130 to the soft magnetic film 130, thus causing magnetization inversion of the soft magnetic film 130. The level of the signal, i.e., "1" or "0" is written corresponding to the magnetization direction of the soft magnetic film 130.

The written signal or data is read as follows. While a constant current flows in the conductive films 141 and 150 (FIG. 3), a positive or negative weak pulse current is caused to flow in the conductive film 170, thus generating a magnetic field having a strength which is equal to or more than the threshold value Hs corresponding to the magnetic coercive force of the soft magnetic film 130. The signal is read by determining whether the magnetization inversion of the soft magnetic film 130 is caused or not. Specifically, the level of the signal, i.e., the data storage state is identified to be "1" or "0" by monitoring a change in the resistance value of the MR portion 101 through the conductive films 141 and 150.

When a positive pulse current 513 is caused to flow in the conductive film 170 while the MR effect memory cell 2000 is in the data storage state of "1" (FIG. 4B), the resistance of the MR portion 101 is not changed ($\Delta R_2 = 0$). When the positive pulse current 513 is caused to flow in the conductive film 170 while the MR effect memory device 2000 is in the data storage state of "0" (FIG. 4B), the resistance of the MR portion 101 changes ($\Delta R_2 \neq 0$). When a negative pulse current (not shown) is caused to flow in the conductive film 170, the result is opposite to the above. It should be noted that the pulse current 503 has a level which does not cause magnetization inversion of the hard magnetic film 110 but can cause magnetization inversion of the soft magnetic film 130.

The above-described operation principle allows a signal to be read from the MR effect memory cell 2000. In an AF spin valve-type MR effect memory cell such as the MR effect memory cell 2000, the signal which has been written is destroyed when the signal is read. Accordingly, an NDRO is difficult to be realized but not impossible. A method for realizing an NDRO will be described below with reference to FIG. 4C.

When a signal is read by a method of detecting a difference $\Delta R_3$ between the resistance value of the MR portion 101 and a reference resistance value $R_1$, the state of the signal, i.e., "1" or "0" can be read without causing a pulse current to flow in the conductive film 170. Since the signal which is written is not destroyed when being read in this case, an NDRO can be realized. The reference resistance value $R_1$ preferably is a value in the variable range of values of the resistance of the MR portion 101. When a plurality of MR effect memory cells are integrated, a resistance value of one of the plurality of MR effect memory cells is preferably used as the reference resistance value $R_1$.

As an antiferromagnetic film 180, a magnetization rotation prevention film is usable.

The ferromagnetic film 190 and the soft magnetic film 130 can be located opposite of each other.

The structure of the MR effect memory cell 2000 is usable as an MR effect element as in the first example.

The hard magnetic film 110 of the MR effect memory cell 1000 in the first example and the ferromagnetic film 190 of the MR effect memory cell 2000 in the second example correspond to a pinned layer of an MR effect element. Exemplary suitable metal and alloy materials used for the hard magnetic film 110 and the ferromagnetic film 190 include Co, Co—Fe, Ni—Fe, and Ni—Fe—Co. Specifically, Co and a Co—Fe alloy are suitable for obtaining a high MR ratio, and thus a Co-rich material is preferably used for an interface between the hard magnetic film 110 or ferromagnetic film 190 and the nonmagnetic insulating film 120.

XMnSb (X is preferably at least one element selected from the group consisting of Ni, Pt, Pd and Cu) has a sufficiently high magnetic polarization ratio and thus provides a sufficiently high MR ratio when used in an MR effect element.

Exemplary suitable oxide magnetic materials used for the hard magnetic film 110 and the ferromagnetic film 190 include $MFe_2O_4$ (M is preferably at least one element selected from the group consisting of Fe, Co and Ni). $MFe_2O_4$ is ferromagnetic up to a relatively high temperature. Co-rich or Ni-rich $MFe_2O_4$ has a higher resistance value than Fe-rich $MFe_2O_4$. Co-rich $MFe_2O_4$ has a relatively large magnetic anisotropy. The hard magnetic film 110 and the ferromagnetic film 190 having desirable characteristics can be obtained by adjusting the composition ratio of the components.

The hard magnetic film 110 and the ferromagnetic film 190 preferably have a thickness of about 1 nm or more and about 10 nm or less.

A magnetization rotation prevention film used as the antiferromagnetic film 180 which is in contact with the ferromagnetic film 190 can be formed of an irregular alloy such as, for example, Ir—Mn, Rh—Mn, Ru—Mn, or Cr—Pt—Mn. When the magnetization rotation prevention film is formed in a magnetic field, the magnetization rotation prevention film can be exchange-coupled with the ferromagnetic film 190, which simplifies the production process of the MR effect memory cell 2000. Exemplary regular alloys usable for the magnetization rotation prevention film include Ni—Mn and Pt—(Pd)—Mn. These regular alloys need to be heat-treated for regularization but have a sufficient level of stability against heat. Among the regular alloys, Pt—Mn is especially preferable. Exemplary usable oxide materials include $\alpha$-$Fe_2O_3$, NiO, or $LTO_3$ (L is a rare earth element excluding Ce, and T is Fe, Cr, Mn, or Co). When these materials having a relatively low level of conductivity are used, the conductive film 141 is preferably located so as to be in direct contact with the ferromagnetic film 190 as shown in FIG. 3.

The soft magnetic film 130 of the MR effect memory cells 1000 and 2000 in the first and second examples corresponds to a free layer of an MR effect element. Exemplary suitable materials for the soft magnetic film 130 include Co, Co—Fe, Ni—Fe, and Ni—Fe—Co alloys. Preferable Ni—Fe—Co alloys include $Ni_xFe_yCo_z$ ($0.6 \leq x \leq 0.9$, $0 \leq y \leq 0.3$, $0 \leq z \leq 0.4$), which is Ni-rich; and $Ni_{x'}Fe_{y'}Co_{z'}$ ($0 \leq x' \leq 0.4$, $0 \leq y' \leq 0.5$, $0.2 \leq z' \leq 0.95$), which is Co-rich.

The alloys having the above-mentioned compositions have a low magnetic distortion ($1 \times 10^{-5}$) which is required for sensors or MR heads.

EXAMPLES 3 THROUGH 20

In general, when the magnetization direction of a ferromagnetic film is in a planar direction of the film, and w is the planar size of the film and d is the thickness of the film, the strength of an anti-magnetic field component inside the ferromagnetic film, which is in the same direction as an external magnetic field component directed in the planar direction of the ferromagnetic film, increases as d/w increases. In other words, as the size of the MR effect element is reduced in accordance with an increase in the integration degree of an MRAM, the strength of the anti-magnetic field component of the ferromagnetic film increases. Thus, a stronger magnetic field is required in order to magnetize the ferromagnetic film. A larger magnetic coercive force is required in order to stabilize the magnetized state. As a result, magnetization inversion by a magnetic field generated by a current flowing through a word line becomes more difficult.

As can be appreciated from the above, when the width of an MR effect element is as small as on the order of submicrometers, the anti-magnetic field component of the ferromagnetic film is not negligible. Thus, a stronger magnetic field is required in order to magnetize the ferromagnetic field.

According to the present invention, a free layer in which the magnetization direction is relatively easily rotatable by an application an external magnetic field includes a ferromagnetic film having a small magnetic coercive force even though being thin, and an amorphous film. Alternatively, a free layer includes a synthesized ferrimagnetic film including ferromagnetic films which are antiferromagnetically exchange-coupled to each other. By forming the free layer to have such structures, a microscopic MR effect memory cell or element can be provided, and an MRAM including a plurality of such MR effect memory cells integrated at a high density can also be provided, as described in the following examples.

EXAMPLE 3

Figure 5A:
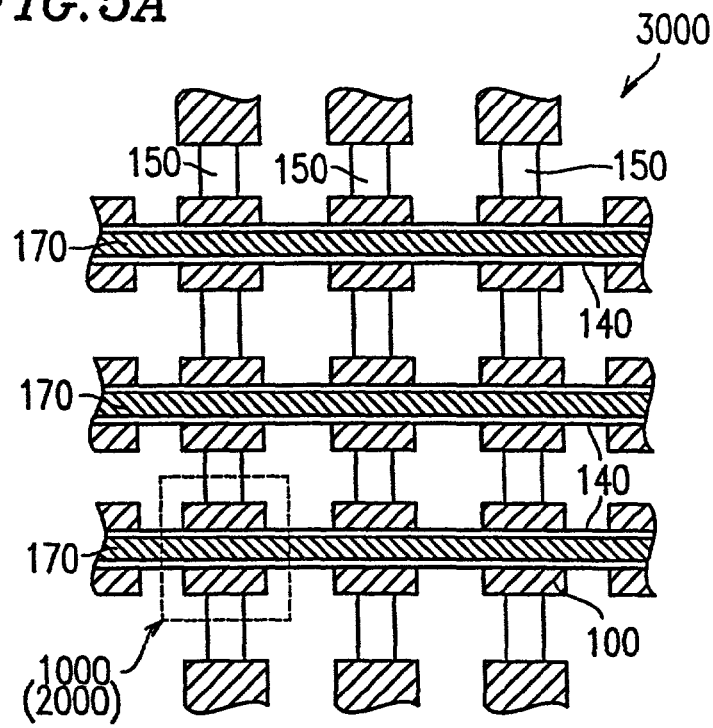
FIG. 5A is a plan view of an MRAM in a third example according to the present invention.
Figure 5B:
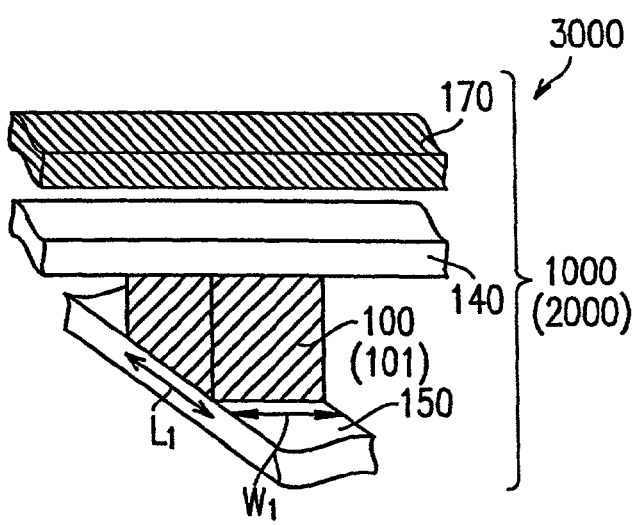
FIG. 5B is a partial isometric view of the MRAM shown in FIG. 5A.

FIG. 5A is a partial plan view of an MRAM 3000 in a third example according to the present invention, and FIG. 5B is a partial isometric view of the MRAM 3000.

The MRAM 3000 includes a plurality of MR effect memory cells 1000 in the first example or a plurality of MR effect memory cells 2000 in the second example which are arranged in a matrix. The MR effect memory cells 1000 and 2000 are CPPMR elements.

Herein, the MR portion 100 (or 101) has a shape of prism, but can have a shape of circular cylinder, elliptical cylinder, truncated cone or truncated pyramid. A face of the MR portion 100 (or 101) which is in contact with the conductive films 140 or the like preferably has a relationship of $L_1 > W_1$ where $L_1$ represents the width and $W_1$ represent the length as shown in FIG. 5B in order to provide an anisotropy in shape.

Figure 5C:
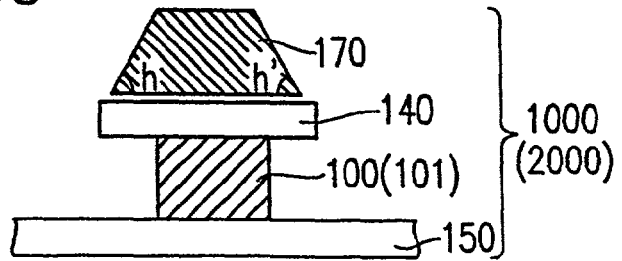
FIG. 5C is an exemplary partial cross-sectional view of the MRAM shown in FIG. 5A.

FIG. 5C is a cross-sectional view illustrating a preferable cross-sectional shape of the conductive film 170 which is more preferable for efficiently applying a magnetic field to the MR portion 100 (or 101). Letters h and h' each represent an angle made by a side of the cross-section facing the MR portion 100 (or 101) and another side. Preferably, at least one of angles h and h' is an acute angle.

Due to the cross-sectional shape of the conductive film 170 as shown in FIG. 5C, the current flowing in the conductive film 170 at a uniform density is caused to flow in the vicinity of the MR portion 100 (or 101) in a larger amount than in the rest of the conductive film 170. Thus, the magnetic field can be efficiently applied to the MR portion 100 (or 101). Such a cross-sectional shape is especially preferable when the aspect ratio (width/thickness) of the cross-section of the conductive film 170 is reduced due to the size reduction of the MRAM 3000.

As can be appreciated from the above, the free layer in the MR 100 (or 101) is preferably located as close as possible to the conductive film 170 in order to efficiently apply the magnetic field. Such an arrangement is preferable because it increases an operation margin for selecting an MR portion in the MRAM 3000 even when a synthesized magnetic field generated by the conductive film 170 (word line) and the sense line 150 (or 140) which are perpendicular to each other is used. This occurs because the level of the current required for causing a magnetization rotation is lowest at the operation point where the strength of the magnetic field generated by the conductive film 170 (word line) and the strength of the magnetic field generated by the sense line 150 are equal to each other (i.e., when $\theta = 45°$ in FIG. 14).

As shown in FIGS. 5A and 5B, in the MRAM 3000 including the CPPMR elements, the MR effect memory cells 1000 or 2000 are connected parallel to each other. Accordingly, even when the number N of the MR effect memory cells increases, the S/N ratio is not substantially reduced.

Figure 6A:
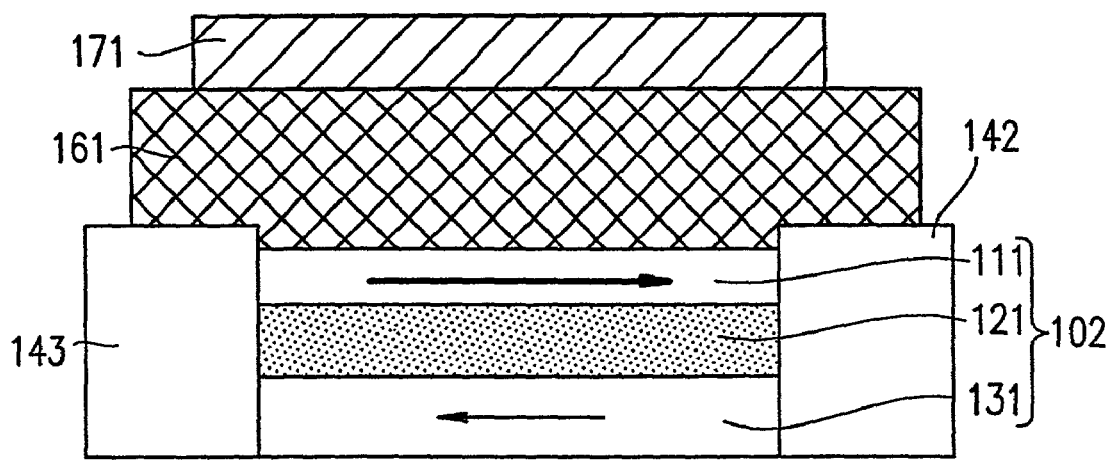
FIG. 6A is a cross-sectional view of an MR effect memory cell in the third example.
Figure 6B:
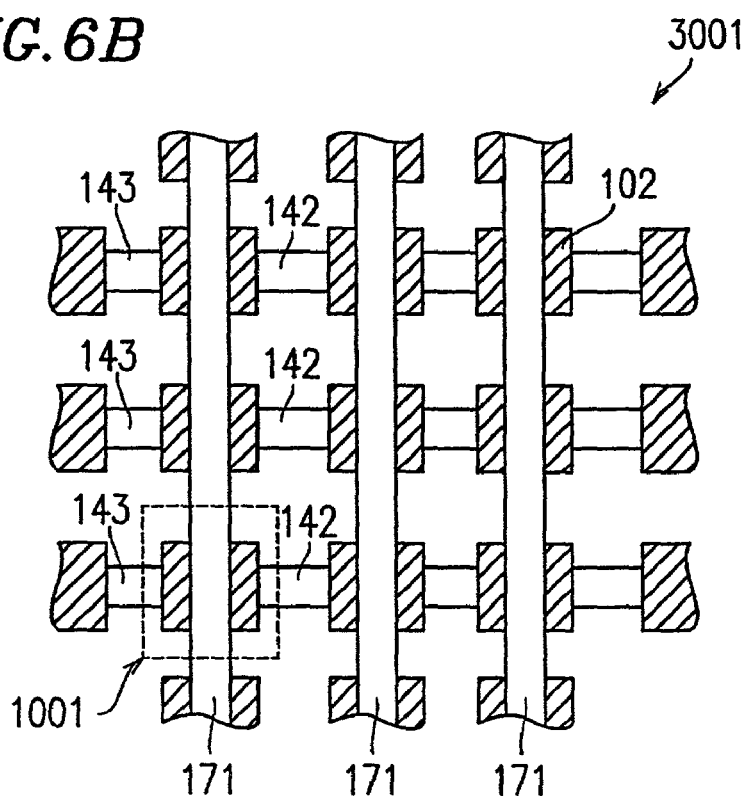
FIG. 6B is a plan view of the MR effect memory cell in the third example.

FIG. 6A is a cross-sectional view of an MR effect memory cell 1001 according to the present invention, and FIG. 6B is a plan view of an MRAM 3001 including a plurality of the MR effect memory cells 1001 arranged in a matrix.

The MR effect memory cell 1001 includes a MR portion 102, conductive films 142, 143 and 171, and an insulating film 161. The conductive films 142 and 143 respectively act as a part of a sense line and a bit line, or vice versa when the MR effect memory cell 1001 is incorporated into an MRAM. The conductive film 171 acts as a part of a word line when the MR effect memory cell 1001 is incorporated into an MRAM. The MR portion 102 includes a hard magnetic film 111, a nonmagnetic film 121, and a soft magnetic film 131. The MR portion 102 is electrically connected with the conductive films 142 and 143. The conductive film 171 is provided above the MR portion 102 with the insulating film 161 interposed therebetween. The MR effect memory cell 1001 having the above-described structure is a CIPMR element.

As shown in FIG. 6B, the MR effect memory cells 1001 are connected in series. In such a case, when the number N of the MR effect memory cells 1001 increases, the S/N ratio of the entirety of the MRAM 3001 is considered to be reduced although the MR ratio of each MR effect memory cell 1001 remains the same.

In some of the figures in the present application, including FIGS. 5A and 6B, the MR portion is represented as being larger than the sense, word and other lines. This is merely for clarity, and the size relationship between the MR portion and the lines is not limited to this. In order to efficiently apply a magnetic field to the MR portion, each line preferably covers the MR portions.

The MRAMs 3000 and 3001 are memory devices using a magnetic property, and thus are nonvolatile unlike semiconductor DRAMs utilizing accumulation of charges. Unlike semiconductor flash memory devices, there is no limit in the number of times of write/read operations in principle, and a time period required for write and erase operations is as short as on the order of nanoseconds.

The operation principle of each MR effect memory cell is as described in the first and second examples. For producing the MRAM 3000 or 3001, a plurality of MR effect memory cells 1000, 1001 or 2000 are provided in a matrix. Specifically, a plurality of word lines are first provided in a lattice, and then the MR effect memory cells 1000, 1001 or 2000 are provided respectively adjacent to intersections of the word lines. In FIGS. 5A, 5B and 6B, the word lines (conductive film 170 or 171) are shown in only one direction (i.e., row direction or column direction) for simplicity and in conformity to FIGS. 1, 3 and 6A. The lattice arrangement of the word lines will be described in detail in the following examples.

A magnetic field generated by two intersecting word lines adjacent to a selected MR portion at address (N, M) is applied to the selected MR portion. One of the two word lines can be replaced with one sense line.

In an MRAM including a plurality of MR effect memory cells 1000 shown in FIG. 1, when a synthesized magnetic field generated by the two word lines exceeds the value of a switching magnetic field represented by an asteroid-type curve of the hard magnetic film 110, information is written. When the above-mentioned synthesized magnetic field does not exceed the value of the switching magnetic field but exceeds the value of a switching magnetic field of the soft magnetic film 130, an NDRO of information is performed from a desired MR effect memory cell 1000.

In an MRAM including a plurality of MR effect memory cells 2000 shown in FIG. 3, the operation is basically the same as that of the MRAM including MR effect memory cells 1000 in that a synthesized magnetic field causes magnetization inversion of the soft magnetic film 130.

Information stored in these MRAMs can be read in the following manner. A pulse current is caused to flow in two word lines adjacent to a MR portion at address (N, M), and information stored in the MR portion is read based on a change in the resistance value which is monitored through the sense line and the bit line connected to the MR portion.

Figure 4C:
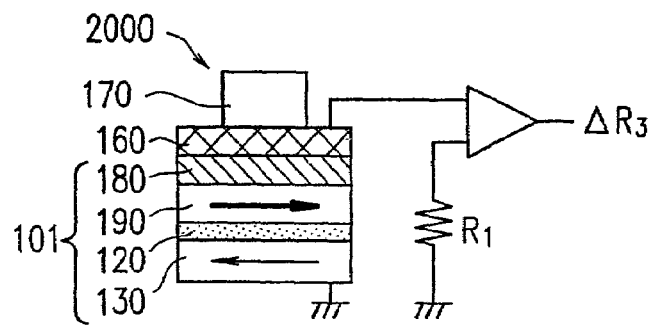

As described with reference to FIG. 4C in the second example, an NDRO of the information stored in the MR portion at address (N, M) is realized by comparing the resistance value of the MR portion and a reference resistance value.

Alternatively, each word line and each sense line can be provided with a switching device such as, for example, a transistor. An MR portion at address (N, M) can be selected by selecting the word line of row N and the sense line (or bit line) of column M by an address designating signal. In order to prevent an inflow of a signal pulse through another path and a return of a harmonic component caused by an increase in speed of signal pulse transfer and thus to transfer the signal pulse efficiently, each MR portion is preferably provided with a diode or a transistor. Especially in order to deal with a high speed pulse response, a MOS transistor is preferably used.

As the MR effect memory cells are integrated at a higher density, the problem of leakage of a magnetic field generated by word lines to an area other than the selected MR portion becomes more serious. In order to alleviate an interference effect on the area other than the selected MR portion caused by the leaked magnetic field, a pulse current is preferably caused to flow not only in a pair of word lines generating a magnetic field in the MR portion at address (N, M) but also in at least one more pair of word lines in the vicinity of or interposing the above-mentioned MR portion. In this manner, the magnetic field leaked to another MR portion, other than the MR portion at address (N, M), can be cancelled by a magnetic field generated by word lines corresponding to the another MR portion or by a magnetic field generated by word lines corresponding to still another MR portion. Thus, influence of the leaked magnetic fields is reduced.

EXAMPLE 4

FIGS. 7A through 7D are cross-sectional views of an MR effect memory cell 4000 in a fourth example according to the present invention.

The MR effect memory cell 4000 includes a MR portion 200, an insulating film 162, and a conductive film 172. The MR portion 200 includes hard magnetic films 112, 113 and 114, soft magnetic films 132, 133 and 134, nonmagnetic insulating films 122, 123 and 124, and nonmagnetic films 222 and 223. The conductive film 172, which acts as a part of a word line when the MR effect memory cell 4000 is incorporated in an MRAM, is provided above the MR portion 200 with the insulating film 162 interposed therebetween.

The MR portion 200 includes a plurality of soft magnetic film/nonmagnetic insulating film/hard magnetic film structures stacked with a nonmagnetic film interposed between each structure of the plurality. In the MR portion 200 shown in FIG. 7A through 7D, three such structures are stacked. The number of such structures is optional.

In the fourth example, the hard magnetic films 112, 113 and 114 have different magnetic coercive forces, and as a result, there are a plurality of magnetic field threshold values for writing. Accordingly, four different levels of a signal can be stored in one MR effect memory cell 4000. The magnetic coercive force of each of the hard magnetic films 112, 113 and 114 can be changed by changing the composition or the thickness of the respective film. By a method of detecting a difference $\Delta R_4$ between the resistance value of the MR portion 200 and a reference resistance value $R_2$, the four levels of the signal stored (e.g., "0", "1", "2" and "3") can be read.

Since the MR effect memory cell 4000 includes three soft magnetic film/nonmagnetic insulating film/hard magnetic film structures, there are four patterns of magnetization directions as shown in FIGS. 7A through 7D. Accordingly, four levels (e.g., "0", "1", "2" and "3") can be stored in one MR effect memory cell 4000.

Figure 7A:
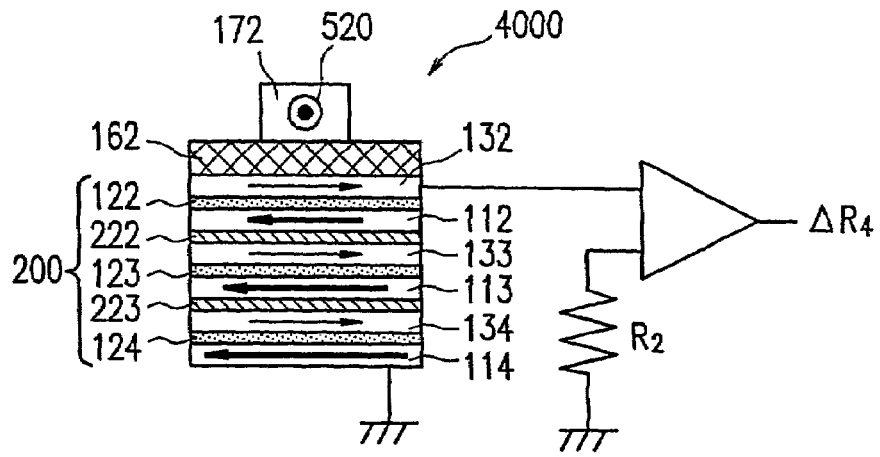
FIGS. 7A through 7D are cross-sectional views of an MR effect memory cell in a fourth example according to the present invention.
Figure 7B:
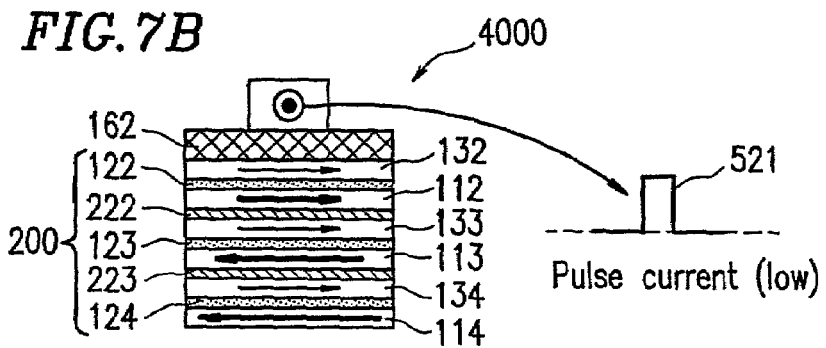
Figure 7C:
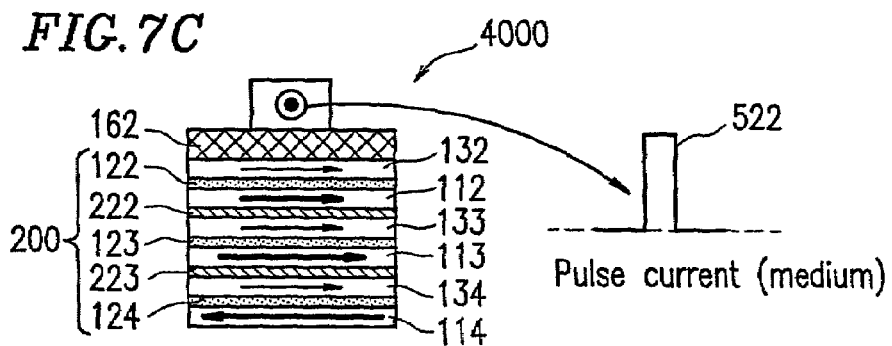
Figure 7D:
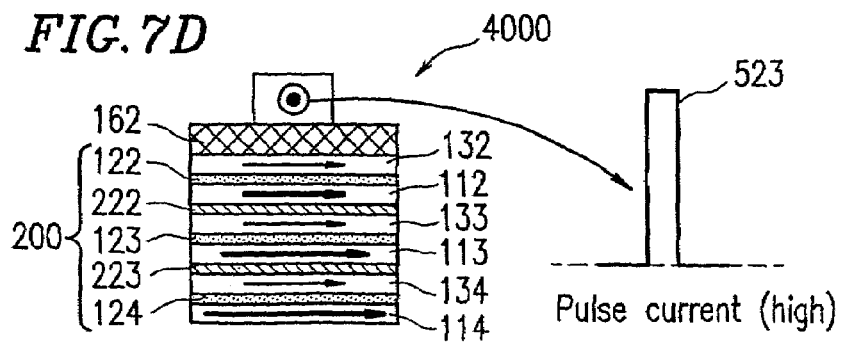

Information is written in the MR effect memory cell 4000 by causing magnetization inversion of the hard magnetic films 112, 113 and 114 by a magnetic field which is generated by pulse currents 521, 522 and 523 flowing in the conductive film 172. In the fourth example, the magnetic coercive force of the hard magnetic film 112 is smallest and the magnetic coercive force of the hard magnetic film 114 is largest. By adjusting the level of the pulse current flowing in the conductive film 172, the hard magnetic film or films in which magnetization inversion is caused can be selected among the hard magnetic films 112, 113 and 114. In the fourth example, the level of the pulse current flowing in the conductive film 172 gradually increases from the state in FIG. 7B toward the state in FIG. 7D. In FIG. 7A, the level of a pulse current 520 flowing in the conductive film 172 is still lower than the level of a pulse current 521 in FIG. 7B. In FIG. 7A, magnetization inversion occurs in none of the hard magnetic films; and in FIG. 7D, magnetization inversion occurs in all of the hard magnetic films 112, 113 and 114.

Information is read from the MR effect memory cell 4000 by a method of detecting the difference $\Delta R_4$ between the resistance value of the MR portion 200 and the reference resistance value $R_2$ as described above.

Information can also be read by causing a current to flow in the conductive film 172 and reading a change in the resistance value of the MR portion 200. In this case, the change in the resistance value of the MR portion 200 can be detected by, for example, a comparison with the reference resistance value $R_2$.

The soft magnetic films 132, 133 and 134 can have different magnetic coercive forces. In such a case, many levels of the signal can be stored in one MR effect memory cell 4000 by precisely adjusting the level of the pulse current flowing in the conductive film 172 and determining the film or films in which magnetization inversion is to be caused and the film or films in which magnetization inversion is not to be caused among the soft magnetic films 132, 133 and 134. These levels of the signal are preferably read by a method of detecting the difference $\Delta R_4$ between the resistance value of the MR portion 200 and the reference resistance value $R_2$ as described above.

Alternatively, the magnetization direction of all the hard magnetic films 112, 113 and 114 can be pinned, in which case the levels of the signal can be stored by causing the magnetization inversion only in an arbitrary one of the soft magnetic films 132, 133 and 134 as described in the second example.

EXAMPLE 5

In a fifth example according to the present invention, the MR portion 100 (FIG. 1) will be described in more detail. FIGS. 8A through 8D are cross-sectional views of various examples of the MR portion 100 in the fifth example.

Figure 8A:
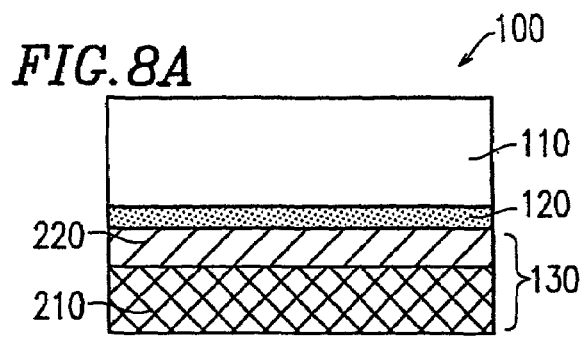
FIGS. 8A through 8D are cross-sectional views of a MR portion in a fifth example according to the present invention.

Referring to FIG. 8A, the soft magnetic film 130, which is a free layer, includes an interface magnetic film 220 in contact with the nonmagnetic insulating film 120 and a nonmagnetic film 210 in order to increase the MR ratio. The free layer needs to have a soft magnetic property and thus can be formed of a Ni-rich material. In the example of FIG. 8A, the interface magnetic film 220 is formed of a Co-rich material, and the nonmagnetic film 210 is formed of, for example, CoFeB or CoMnB. Due to such a structure, even when the soft magnetic film 130 has a thickness of about 2 nm or less, a sufficiently high MR ratio can be provided without spoiling the soft magnetic property. An MR effect memory cell including such a free layer is satisfactorily stable against heat. In other words, an MR effect memory cell including a free layer having a magnetic effective thickness of about 2 nm or less can be realized when the free layer (soft magnetic film 130) includes the interface magnetic film 220 and the nonmagnetic film 210. The interface magnetic film can be formed of an alloy material containing at least one element of Co, Ni and Fe or $Ni_x$—$Co_y$—$Fe_z$ as a main component, where $0 \leq x \leq 0.4$, $0.2 \leq y \leq 0.95$, $0 \leq z \leq 0.5$.

When the interface magnetic film 220 is excessively thick, the soft magnetic property is deteriorated and thus the MR ratio is reduced. In order to avoid this, the interface magnetic film 220 needs to have a thickness of 2 nm or less, preferably about 1.2 nm or less. The interface magnetic film 220, however, needs to have a thickness of about 0.2 nm or more, preferably about 0.8 nm or more, in order to effectively act. The interface magnetic film 220 is preferably formed of Co or a Co—Fe alloy having a sufficiently high concentration of Co.

Figures 8B, 8C:
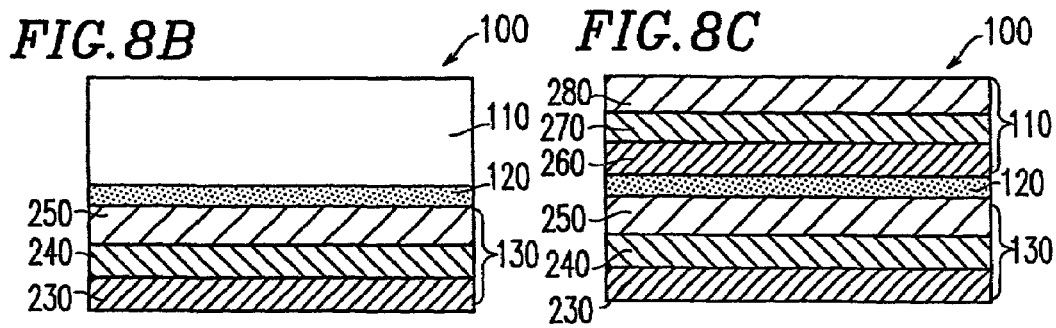

Referring to FIG. 8B, the soft magnetic film (free layer) 130 of the MR portion 100 has an exchange-coupled ferrimagnetic film structure. The soft magnetic film 130 acting as an exchange-coupled ferrimagnetic films includes two ferromagnetic films 230 and 250 and a nonmagnetic film 240. The two ferromagnetic films 230 and 250 are exchange-coupled to each other through the nonmagnetic film 240. This exchange coupling can be made antiferromagnetic by forming the nonmagnetic film 240 to have an appropriate thickness (for example, when the nonmagnetic film 240 is formed of Ru, the thickness of the nonmagnetic film 240 is about 0.6 nm or more and about 0.8 nm or less). In the example of FIG. 8B, the ferromagnetic films 230 and 250 have different thicknesses from each other or have different strengths of saturated magnetization from each other.

The nonmagnetic film 240 is preferably formed of a nonmagnetic metal material which relatively easily causes exchange coupling between magnetic films, for example, Cu, Ag or Au. In consideration of the stability against heat at the interface between the ferromagnetic film 230 and the nonmagnetic film 240 and the interface between the ferromagnetic film 250 and the nonmagnetic film 240, the nonmagnetic film 240 is more preferably formed of, for example, Ru, Rh, Ir, or Re. Ru is especially preferable. The ferromagnetic films 230 and 250 are preferably formed of a metal magnetic material containing at least one of Ni, Co and Fe as a main component.

The strength of saturated magnetization of a ferromagnetic film is determined by multiplying the magnitude of a magnetic moment, inherent to the material, determining the magnetization by the volume of the ferromagnetic film (corresponding to the number of magnetic moments included in the ferromagnetic film). In the case of the structure shown in FIG. 8B, the exchange-coupled ferromagnetic films 230 and 250 have an equal size in the planar direction thereof. Accordingly, the strength of the saturated magnetization in the planar direction of each of the ferromagnetic films 230 and 250 is determined by the magnitude of the magnetic moment inherent in the material thereof and the thickness thereof. In the soft magnetic film (free layer) 130 having such an exchange-coupled ferrimagnetic film structure, the effective magnetic thickness of the soft magnetic film 130 is substantially the difference in the thickness between the ferromagnetic films 230 and 250. By causing the ferromagnetic films 230 and 250 to have a thickness difference, the ferromagnetic films 230 and 250 have a magnetization difference. Reduction in the effective magnetic thickness of the soft magnetic film 130 is effective in improving the sensitivity of the MR portion 100 and a device including the MR portion 100.

Especially in order to cause the ferromagnetic films 230 and 250 to have a magnetization difference by having a thickness difference, the thickness difference between the ferromagnetic films 230 and 250 is preferably about 2 nm or less. Since the effective magnetic thickness of the soft magnetic film 130 is substantially the difference in the thickness between the ferromagnetic films 230 and 250, the soft magnetic film 130 is about 2 nm or less.

For causing magnetization inversion of the free layer in which the thickness difference between two ferromagnetic films is about 2 nm or less, a stronger external magnetic field is required as the anti-magnetic field component becomes stronger. In production of an MRAM, an external magnetic field is generated by word lines (or sense lines) and is applied to the MR portions. Even when the word lines are formed of a low resistance copper (Cu), the maximum possible level of current which can flow in the word lines is about 50 MA/cm$^2$. In consideration of an operation margin in light of the operation stability of the MRAM, the thickness difference between the ferromagnetic films estimated based on the external magnetic field which can be generated is preferably on the order of several nanometers or less. As a result of tests using the structure of FIG. 8B, it has been found that the difference thickness between the ferromagnetic films 230 and 250 is most preferably about 2 nm or less. The effective magnetic thickness of the free layer (soft magnetic film 130) is preferably about 0.2 nm or more since, otherwise, the soft magnetic property of the free layer is deteriorated.

Figure 8D:
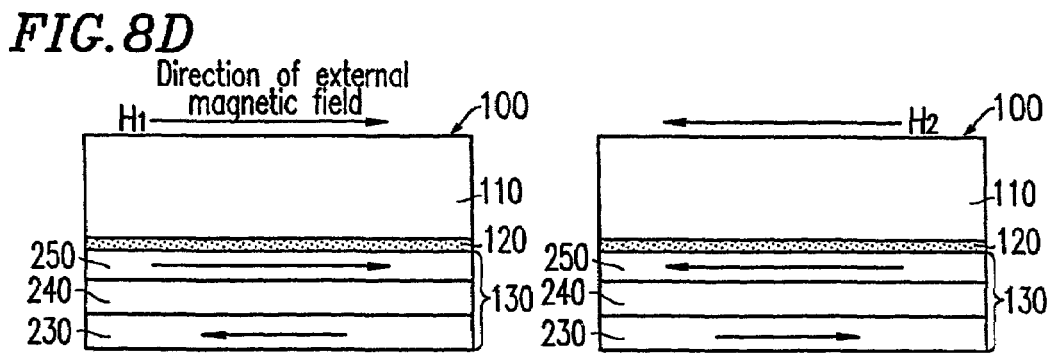

The magnetization rotation of the soft magnetic film 130 is preferably performed as a rotation of an effective magnetization direction caused by the magnetization direction difference between the two ferromagnetic films 230 and 250 while the magnetization directions of the ferromagnetic films 230 and 250 are maintained anti-parallel against an application of an external magnetic field. The reason is that a magnetization rotation which destroys the anti-parallel state of the magnetization directions of the two ferromagnetic films by an application of an external magnetic field is not preferable because such a magnetization rotation needs to overcome the exchange coupling of the ferromagnetic films 230 and 250 and thus requires a stronger external magnetic field than the magnetization rotation performed while maintaining the anti-parallel state. As shown in FIG. 8D, it is effective for a low magnetic field operation of an MR effect memory cell to cause a magnetization rotation while the magnetization vectors of the ferromagnetic films 230 and 250 are maintained anti-parallel to each other against an application of an external magnetic field.

Figures 8E, 8F, 8G:
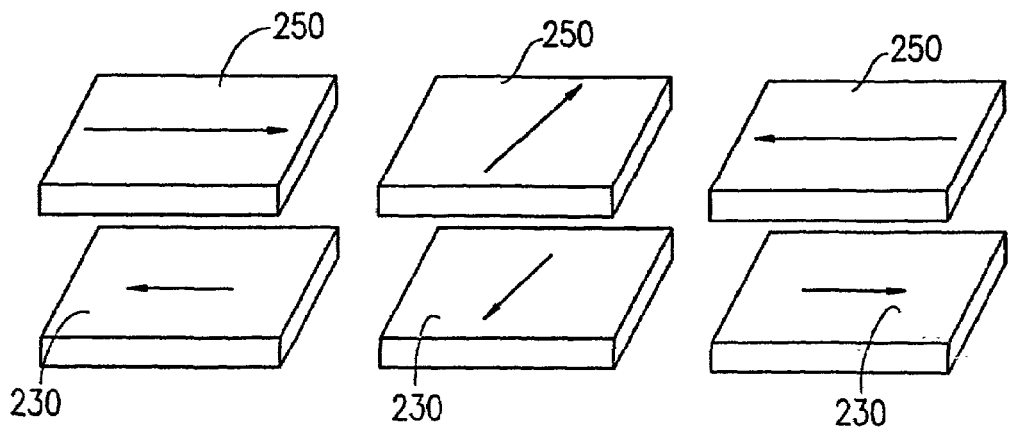
FIGS. 8E through 8G are isometric views of ferromagnetic films in a soft magnetic film of an MR portion in the fifth example according to the present invention.

FIG. 8D shows a change in the magnetization direction of the ferromagnetic films 230 and 250 occurring when the direction of the external magnetic field changes from $H_1$ to $H_2$. FIGS. 8E, 8F and 8G are isometric views of the ferromagnetic films 230 and 250 in the soft magnetic film 130. As the direction of the external magnetic field changes from $H_1$ to $H_2$, the magnetization directions of the ferromagnetic films 230 and 250 change from the directions shown in FIG. 8E to FIG. 8F and further to FIG. 8G. The magnetization rotation of the soft magnetic film 130 is performed as a rotation of an effective magnetization direction caused by the magnetization direction difference between the two ferromagnetic films 230 and 250 while the magnetization directions of the ferromagnetic films 230 and 250 are maintained anti-parallel. In FIGS. 8E, 8F and 8G, the other films or layers of the MR portion 100 are not shown for the sake of simplicity.

As a RAM using an MR effect element such as an MRAM is reduced in size to a submicrometer order, the processing precision is lowered and also the processed element itself is liable to be influenced by each particle of a magnetic film. As a result, it is difficult to divide the magnetic film of the element into magnetic domains. Forming a free layer having an exchange-coupled ferrimagnetic film structure as in FIG. 8B is effective in dividing the free layer into magnetic domains.

The MR portion shown in FIG. 8B has a satisfactory level of stability against heat by the combination of (i) the division of the free layer into magnetic domains and (ii) the magnetic coupling of the two ferromagnetic films by an antiferromagnetic exchange coupling energy.

The above-described exchange-coupled ferrimagnetic film structure is also usable for a hard magnetic film 110 which is a pinned layer, as shown in FIG. 8C. In FIG. 5C, the hard magnetic film 110 includes ferromagnetic films 260 and 280 and a nonmagnetic film 270. The nonmagnetic film 270 is preferably formed of a nonmagnetic metal material which relatively easily causes exchange coupling between magnetic films, for example, Cu, Ag or Au. In consideration of the stability against heat at the interface between the ferromagnetic film 260 and the nonmagnetic film 270 and the interface between the ferromagnetic film 280 and the nonmagnetic film 270, the nonmagnetic film 270 is more preferably formed of, for example, Ru, Rh, Ir, or Re. Ru is especially preferable.

The ferromagnetic films 260 and 280 of the hard magnetic film 110 as the exchange-coupled ferrimagnetic film are preferably formed of a metal magnetic material containing at least one of Ni, Co and Fe as a main component.

The exchange coupling between the ferromagnetic films 260 and 280 can be made antiferromagnetic by forming the nonmagnetic film 270 to have an appropriate thickness (for example, about 0.4 to about 1 nm). When the nonmagnetic film 270 is formed of Ru, the thickness of the nonmagnetic film 270 is about 0.6 nm or more and about 0.8 nm or less). In the case where the antiferromagnetic film (magnetization rotation prevention film) 180 is adjacent to the ferromagnetic films 260 and 280, the pinning effect can be improved.

The structures of the MR portion 100 shown in the fifth example are applicable to the MR portion 101 (FIG. 3) and the MR portion 102 (FIGS. 6A and 6B).

The nonmagnetic insulating film 120 is preferably formed of an oxide such as, for example, $Al_2O_3$ or MgO, a carbide and a nitride. The nonmagnetic insulating film 120 can also be formed of a wide-gap semiconductor having an energy gap value of about 2 to about 6 eV.

Preferable metals usable for the nonmagnetic film 121 (FIG. 6A) include, for example, Cu, Ag, Au and Ru. Cu is especially preferable.

The nonmagnetic film 121 needs to have a thickness of at least about 0.9 nm in order to weaken the interaction between the magnetic films interposing the nonmagnetic insulating film 120 or 121. The thickness of the nonmagnetic film 121 needs to be about 10 nm or less, preferably about 3 nm or less since, otherwise, the MR ratio becomes excessively low. When the thickness of the nonmagnetic film 121 is about 3 nm or less, the flatness of film or layer is important. When the flatness is not sufficient, two ferromagnetic films which are supposed to be magnetically separated from each other by the nonmagnetic film 121 are magnetically coupled to reduce the MR ratio and the sensitivity. The height of the roughness of an interface between the nonmagnetic film and each of the ferromagnetic films is preferably about 0.5 nm or less.

The nonmagnetic insulating film 120 needs to have a thickness of at least about 0.3 nm in order to guarantee the insulating property. The thickness of the nonmagnetic insulating film 120 needs to be about 3 nm or less, since, otherwise, the tunneling current cannot flow. When the thickness of the nonmagnetic film 120 is about 3 nm or less, the flatness of film or layer is important. When the flatness is not sufficient, the nonmagnetic insulating film 120 is broken and causes a tunneling leak or the two ferromagnetic films (hard magnetic film 110 and the soft magnetic film 130) are magnetically coupled to reduce the MR ratio and the sensitivity. The height of the roughness of an interface between the nonmagnetic film and each of the ferromagnetic films is preferably about 0.5 nm or less, more preferably 0.3 nm or less.

The MR portion 100, 101 and 102 in the fifth example are each usable as an MR effect element as in the first and second examples.

EXAMPLE 6

In a sixth example according to the present invention, a method for producing the MR effect memory cell 1000 described in the first example with reference to FIG. 1 will be described. In this specification, ratios used to indicate the composition are all atomic ratios.

Referring to FIG. 1, the MR portion 100 was produced using, as sputtering targets, $Ni_{0.68}Co_{0.2}Fe_{0.12}$ (for the soft magnetic film 130), Al (for the nonmagnetic insulating film 120), $Al_2O_3$ (for the nonmagnetic insulating film 120), and $Co_{0.75}Pt_{0.25}$ (for the hard magnetic film 110). For sputtering, a multi-origin sputtering apparatus (not shown) was used. The basic structure of the MR portion 100 was NiCoFe (15)/$Al_2O_3$ (1.5)/CoPt (10). In such a representation of the structure, the numeral in the parentheses represents the thickness (unit: nm), and "/" represents that the substances mentioned before and after the "/" are combined. The thickness of each film or layer was controlled by a shutter.

Regarding a method for forming the nonmagnetic insulating film 120 ($Al_2O_3$), the inventors attempted method A of forming an Al film and then oxidizing the Al film and method B of sputtering $Al_2O_3$, and evaluated the resultant nonmagnetic insulating films obtained in both methods. For oxidation in method A, three methods were attempted: (i) natural oxidation in a vacuum tank, (ii) natural oxidation while being moisturized in a vacuum tank, and (iii) oxidation in plasma in a vacuum tank. The nonmagnetic insulating film obtained by any of the methods (methods A and B) was satisfactory.

After the MR portion 100 was produced, CoPt for the hard magnetic film 110 was magnetized, and the MR ratio of the MR portion 100 was measured at room temperature at an applied magnetic field of 100 Oe. The MR ratio of the MR portion 100 obtained using method A was about 30%, and the MR ratio of the MR portion 100 obtained using method B was about 18%. The magnetic field width generated by the MR portion 100 obtained using method A was about 5 Oe, and the magnetic field width generated by the MR portion 100 obtained using method B was about 10 Oe. The size of the MR portion 100 in a planar direction thereof was about 0.25 $\mu m^2$.

The MR effect memory cell 1000 shown in FIG. 1 was produced including the MR portion 100 produced using method A, having a higher MR ratio. The conductive films 140 and 150 acting as a part of either a sense line and a bit line were formed of Pt or Au, and the conductive film 170 acting as a part of a word line was formed of, for example, Al, AuCr, Ti/Au, Ta/Pt, Cr/Cu/Pt/Ta or TiW. The insulation film 160 for insulating the MR portion 100 and the conductive film 170 was formed of, for example, $CaF_2$, $SiO_2$ or $Si_3N_4$.

The operation of the MR effect memory cell 1000 produced in this manner was confirmed in the following manner.

Figure 9A:
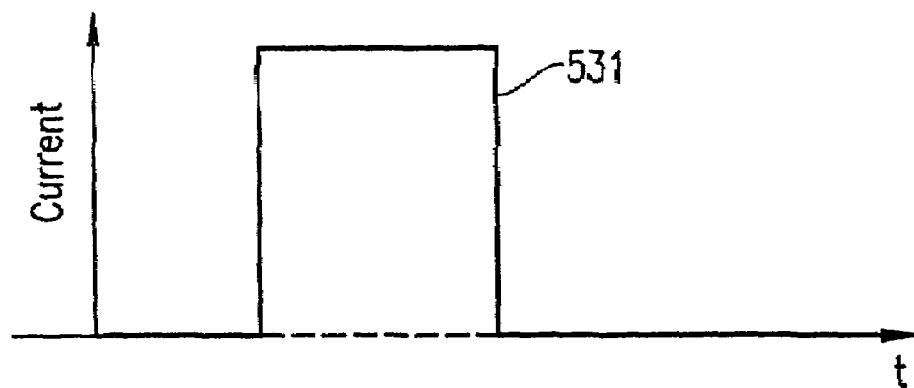
FIGS. 9A and 9B are graphs illustrating an operation of an MR effect memory cell in a sixth example according to the present invention.

A pulse current 531 shown in FIG. 9A was caused to flow in the conductive film 170 (word line) to magnetize the hard magnetic film 110 in one direction. Then, a pulse current 532 shown in FIG. 9B was caused to flow in the conductive film 170, and a change in the voltage value (i.e., a change in the resistance value $\Delta R_s/\Delta t$) of the MR effect memory cell 1000 measured through the conductive films 140 and 150 (sense line and bit line) was monitored. As a result, a pulse 533 shown in FIG. 9B corresponding to the written information was detected. Thus, it was found that the desired MR effect memory cell 1000 using a nonmagnetic insulating film was realized.

EXAMPLE 7

In a seventh example according to the present invention, a method for producing the MR effect memory cell 2000 described in the second example with reference to FIG. 3 will be described.

The MR portion 101 was produced in a manner similar to that described in the sixth example.

Referring to FIG. 3, the MR portion 101 was produced using, as sputtering targets, $Co_{0.9}Fe_{0.1}$ (for the soft magnetic film 130), Al (for the nonmagnetic insulating film 120), $Ni_{0.2}Fe_{2.8}O_4$ (for the ferromagnetic film 190), IrMn (for the antiferromagnetic film 180, i.e., the magnetization rotation prevention layer). The basic structure of the MR portion 101 was $Co_{0.9}Fe_{0.1}$ (7)/$Al_2O_3$ (1.8)/$Ni_{0.2}Fe_{2.8}O_4$ (10)/IrMn (15). The nonmagnetic insulating film 120 of $Al_2O_3$ was formed by method A described in the sixth example.

The MR ratio of the MR portion 101 was measured at room temperature at an applied magnetic field of 100 Oe. The MR ratio of the MR portion 101 was about 26%. The size of the MR portion 101 in a planer direction thereof was about 0.7 $\mu m^2$.

The MR effect memory cell 2000 shown in FIG. 3 was produced including the MR portion 101 in a manner similar to that described in the sixth example. The conductive films 141 and 150 were formed of Au, and the conductive film, 170 was formed of AuCr. The insulation film 160 was formed of $SiO_2$ in this example, but can be formed of, for example, $CaF_2$, $Al_2O_3$ or $Si_3N_4$.

The operation of the MR effect memory cell 2000 produced in this manner was confirmed in the following manner.

Figure 10A:
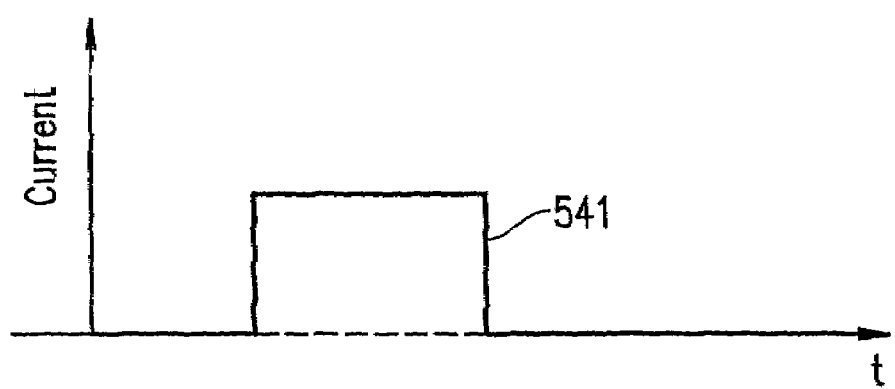
FIGS. 10A and 10B are graphs illustrating an operation of an MR effect memory cell in a seventh example according to the present invention.

A pulse current 541 shown in FIG. 10A was caused to flow in the conductive film 170 to magnetize the soft magnetic film 130 in one direction. Then, a pulse current 542 shown in FIG. 10B was caused to flow in the conductive film 170, and a change in the voltage value ($\Delta V_1$) of the MR effect memory cell 2000 measured through the conductive films 141 and 150 was monitored. As a result, a voltage change 543 shown in FIG. 10B corresponding to the written information was detected. Thus, it was found that the desired MR effect memory cell 2000 using a nonmagnetic insulating film was realized.

EXAMPLE 8

In an eighth example according to the present invention, a method for producing the MR portion 100 described in the fifth example with reference to FIG. 8A will be described.

The MR portion 100 was produced in a manner similar to that described in the sixth example.

Referring to FIG. 8A, the MR portion 100 was produced using, as sputtering targets, $Co_{0.9}Fe_{0.1}$ (for the interface magnetic film 220), Co (for the interface magnetic film 220 and the hard magnetic film 110), Al for the nonmagnetic insulating film 120), and CoMnB (for the ferromagnetic film 210). Two types of MR portions 100 were produced. One type had a first basic structure of CoMnB (1)/Co (1)/$Al_2O_3$ (1.5)/Co (2), and the other type had a second basic structure of CoFeB (1)/$Co_{0.9}Fe_{0.1}$ (1)/$Al_2O_3$ (1.5)/Co (2). For both types of MR portions 100, the nonmagnetic insulating film 120 of $Al_2O_3$ was formed by method A described in the sixth example.

A substrate (not shown) on which the MR portion 100 was to be formed was formed of, for example, a Si substrate having a surface thereof thermally oxidized or an $Al_2O_3$.TiC. On the substrate, a single layer film or a laminate film formed of, for example, Ta, Cu, NiFe or Pt in accordance with a purpose of use was provided as an underlying layer. On the underlying layer, the MR portion 100 was provided. On the MR portion 100, a single layer film or a laminate film formed of, for example, Ta, Cu, NiFe or Pt in accordance with a purpose of use, was provided as a cap layer.

The MR ratio of each type of MR portion 100 was measured at room temperature at an applied magnetic field of 100 Oe. The MR ratio of the MR portion 100 having the first basic structure was about 32%. The MR ratio of the MR portion 100 having the second basic structure was about 29%. The size of the MR portion 100 in a planar direction thereof was about 0.25 $\mu m^2$.

The MR effect memory cells 1000 shown in FIG. 1 were produced including each type of MR portion 100. The conductive films 140 and 150 were formed of Au and Cu, and the conductive film 170 was formed of AuCr. The insulation film 160 for insulating the MR portion 100 and the conductive film 170 was formed of $SiO_2$ in this example, but can be formed of, for example, $CaF_2$, $Al_2O_3$ or $Si_3N_4$.

Figure 9B:
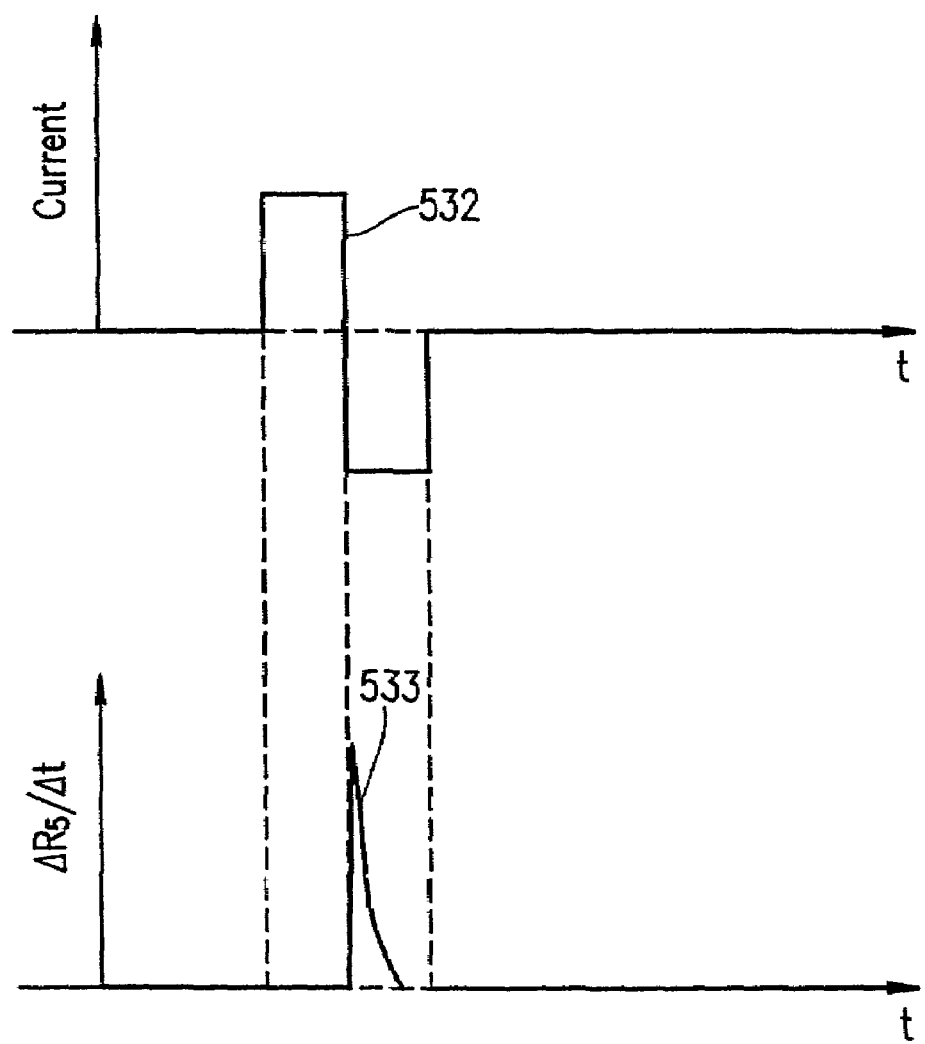

The operation of each type of MR effect memory cell 1000 produced in this manner was confirmed by the method described in the sixth example with reference to FIGS. 9A and 9B. As a result, in both types of MR effect memory cells 1000, the pulse 543 shown in FIG. 9B corresponding to the written information was detected. Thus, it was found that the desired MR effect memory cells 1000 according to the present invention was realized.

EXAMPLE 9

In a ninth example according to the present invention, a method for producing the MR effect memory cell 4000 described in the fourth example will be described.

The MR portion 200 was produced in a manner similar to that described in the sixth example.

Referring to FIG. 7A through 7D, the MR portion 200 was produced using, as sputtering targets, $Ni_{0.68}Co_{0.2}Fe_{0.12}$ (for the soft magnetic films 132, 133 and 134), Al (for the nonmagnetic insulating films 122, 123 and 124), and $Co_{0.9}Fe_{0.1}$, Co and $Co_{0.5}Fe_{0.5}$ (for the hard magnetic films 112, 113 and 114 having different magnetic coercive forces). The magnitudes of the magnetic coercive forces of the hard magnetic films have the relationship of $Co_{0.9}Fe_{0.1}>Co>Co_{0.5}Fe_{0.5}$.

The MR portion 200 had a three-layer structure of $Ni_{0.68}Co_{0.2}Fe_{0.12}$ (10)/$Al_2O_3$ (1.5)/$Co_{0.9}Fe_{0.1}$ (15)/$Al_2O_3$ (15)/$Ni_{0.68}Co_{0.2}Fe_{0.12}$ (10)/$Al_2O_3$ (1.5)/Co (15)/$Al_2O_3$ (15)/$Ni_{0.68}Co_{0.2}Fe_{0.12}$ (10)/$Al_2O_3$ (1.5)/$Co_{0.5}Fe_{0.5}$ (15). The nonmagnetic insulating films 122, 123 and 124 of $Al_2O_3$ were formed by method A described in the sixth example.

The MR ratio of the MR portion 200 was measured at room temperature at an applied magnetic field of 100 Oe. The MR ratio of the MR portion 200 was about 28%. The size of the MR portion 200 in a planar direction thereof was about 0.25 $\mu m^2$.

The MR effect memory cell 4000 was produced including the MR portion 200 in a manner similar to that described in the sixth example.

The conductive films acting as a part of a sense line and a bit line (corresponding to the conductive films 140 and 150 in the first example; not shown in FIGS. 7A through 7D) were formed of Au, and the conductive film 172 was formed of AuCr. The insulation film 162 for insulating the MR portion 200 and the conductive film 172 was formed of $SiO_2$ in this example, but can be formed of, for example, $CaF_2$, $Al_2O_3$ or $Si_3N_4$.

The operation of the MR effect memory cell 4000 produced in this manner was confirmed in the following manner.

Figure 11A:
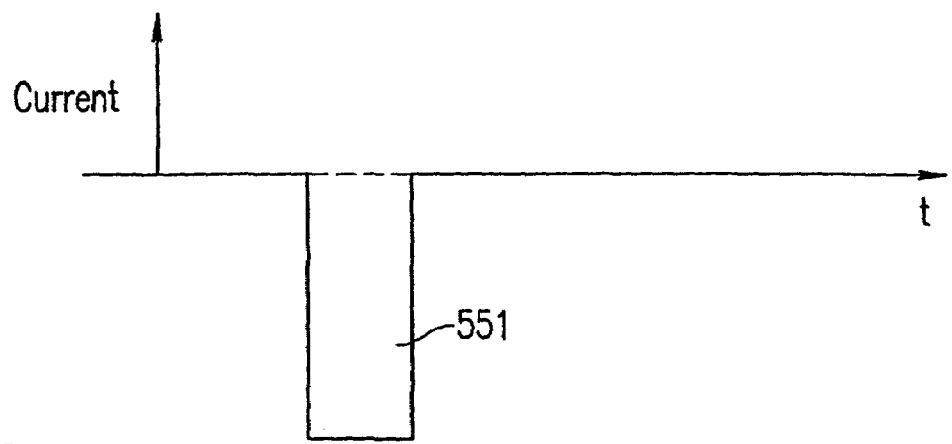
FIGS. 11A and 11B are graphs illustrating an operation of an MR effect memory cell in a ninth example according to the present invention.
Figure 11B:
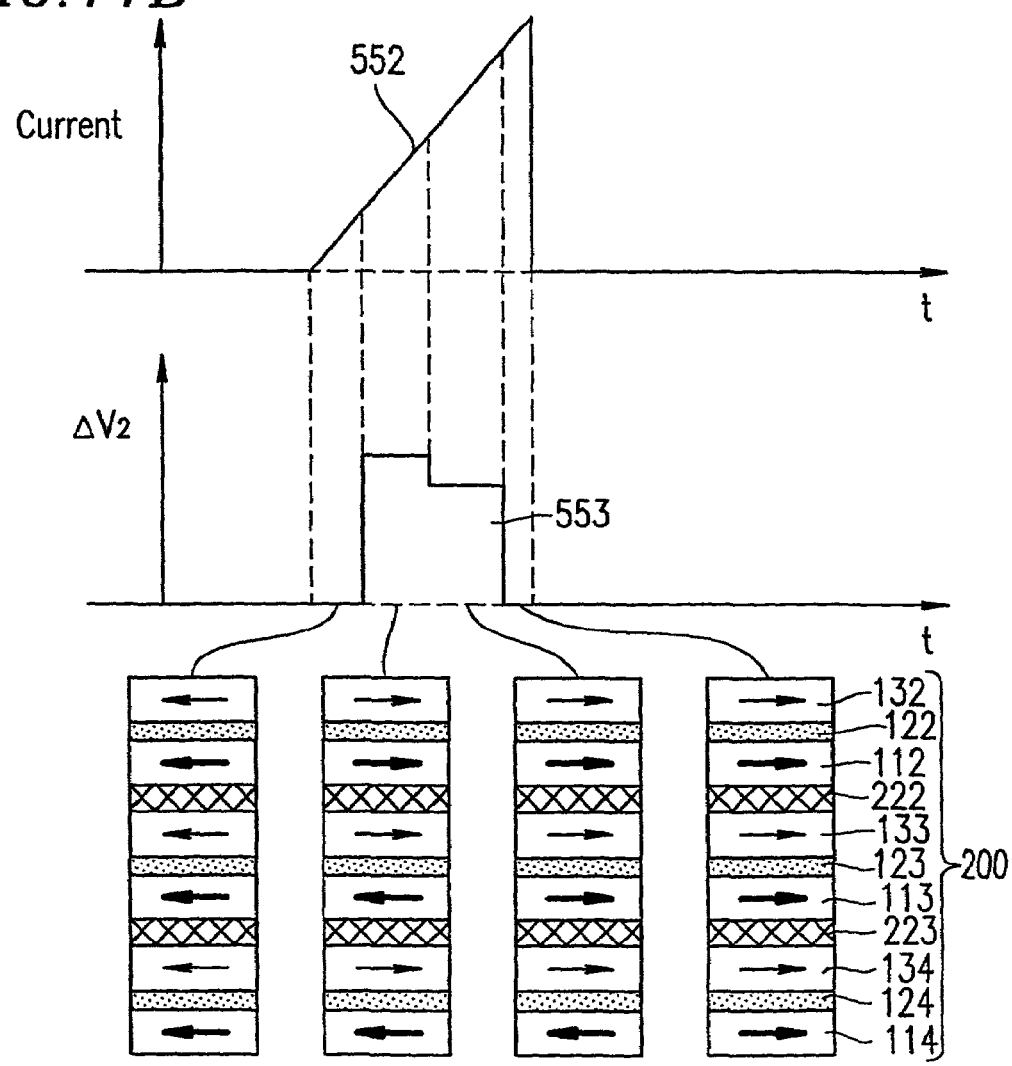

A pulse current 551 shown in FIG. 11A was caused to flow in the conductive film 172 to magnetize the hard magnetic films 112, 113 and 114 in one direction. Next, a pulse current 552 shown in FIG. 11B which rises in a gradually increasing manner is caused to flow in the conductive film 172 to sequentially invert the magnetization directions of the hard magnetic films 112, 113 and 114. A change in the voltage value ($\Delta V_2$) was monitored through the sense line and the bit line. As a result, a voltage change 553 shown in FIG. 11B corresponding to the written information was detected. Thus, it was found that multiple levels of a signal were written in the MR effect memory cell 4000.

In the MR effect memory cell 4000 of the present invention, multiple level of a signal can be written by applying an appropriate bias current. Information written in the effect memory cell 4000 can be read based on a voltage change $\Delta V_2$ occurring while a constant bias voltage is applied.

EXAMPLE 10

In a tenth example according to the present invention, a method for producing the MR portion 100 described in the fifth example with reference to FIG. 8B will be described.

The MR portion 100 was produced in a manner similar to that described in the sixth example.

Referring to FIG. 8B, the MR portion 100 was produced using, as targets, $Co_{0.9}Fe_{0.1}$ or $Ni_{0.81}Fe_{0.19}$ (for the ferromagnetic films 230 and 250 in the exchange-coupled ferrimagnetic film), Ru (for the nonmagnetic film 240), Al (for the nonmagnetic insulating film 120), and $Co_{0.9}Fe_{0.1}$ (for the hard magnetic film 110). Two types of MR portions 100 were produced. One type had a first basic structure of $Co_{0.9}Fe_{0.1}$ (1.9)/Ru (0.7)/$Co_{0.9}Fe_{0.1}$ (2.9)/$Al_2O_3$ (1.2)/$Co_{0.9}Fe_{0.1}$ (20). The other type had a second basic structure of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (20). The nonmagnetic insulating film 120 of $Al_2O_3$ was formed by method A described in the sixth example.

The MR ratio of each type of MR portion 100 was measured at room temperature at an applied magnetic field of 100 Oe. The MR ratio of the MR portion 100 of both types was about 25%. The size of the MR portion 100 in a planar direction thereof was about 0.05 μm².

It was found that the MR portion 100 in this example has a smaller anti-magnetic force than a MR portion having a basic structure of $Co_{0.9}Fe_{0.1}$ (4.8)/$Al_2O_3$ (1.2)/$Co_{0.9}Fe_{0.1}$ (20) or $Ni_{0.81}Fe_{0.19}$ (5)/$Al_2O_3$ (1.2)/$Co_{0.9}Fe_{0.1}$ (20). The MR portion 100 in this example has a smaller anti-magnetic force because the influence of an anti-magnetic field is reduced by the structure shown in FIG. 8B.

The MR effect memory cell 1000 described in the first example was produced including each type of MR portion 100. The conductive films 140 and 150 were formed of Au and Cu, and the conductive film 170 was formed of AuCr. The insulation film 160 for insulating the MR portion 100 and the conductive film 170 was formed of $SiO_2$ in this example, but can be formed of, for example, $CaF_2$, $Al_2O_3$ or $Si_3N_4$.

The operation of the MR effect memory cell 1000 produced in this manner was confirmed by the method described in the sixth example with reference to FIGS. 9A and 9B. As a result, in the MR effect memory cell 1000 of both types, a pulse 533 shown in FIG. 9B corresponding to the written information was detected. Thus, it was found that the MR effect memory cell 1000 according to the present invention was realized.

EXAMPLE 11

In an eleventh example according to the present invention, a method for producing the MR effect memory cell 2000 described in the second example with reference to FIG. 3 will be described. The MR effect memory cell 2000 produced in the eleventh example includes the soft magnetic film 130 described in the fifth example with reference to FIG. 8B.

An MR portion 101 (FIG. 3) including the soft magnetic film 130 shown in FIG. 8B was produced in a manner similar to that described in the sixth example.

The MR portion 101 was produced using, as targets, $Co_{0.9}Fe_{0.1}$ or $Ni_{0.81}Fe_{0.19}$ (for the ferromagnetic films 230 and 250 in the exchange-coupled ferrimagnetic film), Ru (for the nonmagnetic film 240), Al (for the nonmagnetic insulating film 120), $Co_{0.5}Fe_{0.5}$ (for the ferromagnetic film 190), and IrMn (for the antiferromagnetic film 180, i.e., the magnetization rotation prevention layer).

Two types of MR portions 101 were produced. One type had a first basic structure of $Co_{0.9}Fe_{0.1}$ (1.9)/Ru (0.7)/$Co_{0.9}Fe_{0.1}$ (2.9)/$Al_2O_3$ (1.2)/$Co_{0.5}Fe_{0.5}$ (20)/IrMn (30). The other type had a second basic structure of $Ni_{0.81}Fe_{0.19}$ (3)/Ru (0.7)/$Ni_{0.81}Fe_{0.19}$ (2)/$Al_2O_3$ (1.2)/$Co_{0.5}Fe_{0.5}$ (20)/IrMn (30). The nonmagnetic insulating film 120 of $Al_2O_3$ was formed by method A described in the sixth example.

The MR ratio of each type of MR portion 101 was measured at room temperature at an applied magnetic field of 100 Oe. The MR ratio of the MR portion 101 of both types was about 30%. The size of the MR portion 101 in a planar direction thereof was about 0.05 μm².

It was found that the MR portion 101 in this example has a smaller anti-magnetic force than a MR portion having a basic structure of $Co_{0.9}Fe_{0.1}$ (4.8)/$Al_2O_3$ (1.2)/$Co_{0.5}Fe_{0.5}$ (20)/IrMn (30) or $Ni_{0.81}Fe_{0.19}$ (5)/$Al_2O_3$ (1.2)/$Co_{0.5}Fe_{0.5}$ (20)/InMn (30). The MR portion 101 in this example has a smaller anti-magnetic force because the influence of an anti-magnetic field is reduced by the structure shown in FIG. 8B.

The MR effect memory cell 2000 described in the second example was produced including each type of MR portion 101 having the soft magnetic film 130 shown in FIG. 8B in a manner similar to that described in the sixth example. The conductive films 141 and 150 were formed of Au and Cu, and the conductive film 170 was formed of AuCr. The insulation film 160 for insulating the MR portion 101 and the conductive film 170 was formed of $SiO_2$ in this example, but can be formed of, for example, $CaF_2$, $Al_2O_3$ or $Si_3N_4$.

Figure 10B:
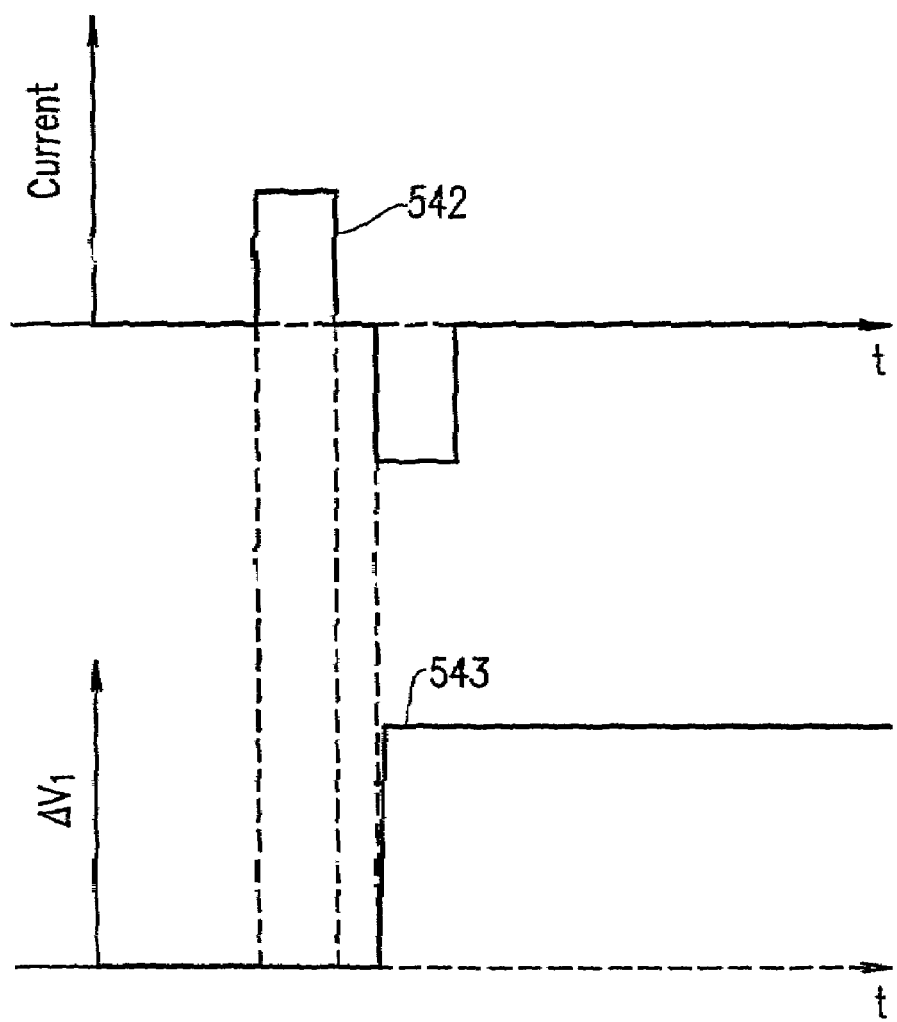

The operation of the MR effect memory cell 2000 produced in this manner was confirmed by the method described in the seventh example with reference to FIGS. 10A and 10B. As a result, in the MR effect memory cell 2000 of both types, the voltage change 543 shown in FIG. 10B corresponding to the written information was detected. Thus, it was found that the MR effect memory cell 2000 according to the present invention was realized.

The magnetization rotation prevention layer was formed of IrMn in this example, but can be formed of PtMn, $\alpha$-$Fe_2O_3$, NiO, or perovskite-based oxide such as, for example, $YFeO_3$ or $SmFeO_3$.

EXAMPLE 12

In a twelfth example according to the present invention, a method for producing the MR effect memory cell 1000 described in the first example with reference to FIG. 1 will be described. The MR effect memory cell 1000 produced in the twelfth example includes the soft magnetic film 130 described in the fifth example with reference to FIG. 8B.

An MR portion 100 including the soft magnetic film 130 shown in FIG. 8B was produced in a manner similar to that described in the sixth example. In this example, the nonmagnetic film 121 which is conductive (FIG. 6A) is used instead of the nonmagnetic insulating film 120. That is, the MR effect memory cell 1000 in this example is a GMR element.

The MR portion 100 was produced using, as targets, $Ni_{0.68}Co_{0.2}Fe_{0.12}$ (for the ferromagnetic films 230 and 250 in the exchange-coupled ferrimagnetic film), Cu (for the nonmagnetic film 121), and $Co_{0.9}Fe_{0.1}$ (for the hard magnetic film 110).

The MR portion 100 having a CPP structure had a basic structure of $Co_{0.9}Fe_{0.1}$ (20)/Cu (3)/$Ni_{0.68}Co_{0.2}Fe_{0.12}$ (2)/Ru (0.7)/$Ni_{0.68}Co_{0.2}Fe_{0.12}$ (3).

The MR ratio of the MR portion 100 was measured at room temperature at an applied magnetic field of 100 Oe. The MR ratio of the MR portion 100 was about 16%. The size of the MR portion 100 in a planar direction thereof was about 0.05 μm².

The MR effect memory cell 1000 described in the first example was produced including the MR portion 100 having the soft magnetic film 130 shown in FIG. 8B in a manner similar to that described in the sixth example. The conductive films 140 and 150 were formed of Au and Cu, and the conductive film 170 was formed of AuCr. The insulation film 160 for insulating the MR portion 100 and the conductive film 170 was formed of $SiO_2$ in this example, but can be formed of, for example, $CaF_2$, $Al_2O_3$ or $Si_3N_4$.

The operation of the MR effect memory cell 1000 produced in this manner was confirmed by the method described in the sixth example with reference to FIGS. 9A and 9B. As a result, the pulse 533 shown in FIG. 9B corresponding to the written information was detected. Thus, it was found that the MR effect memory cell 1000 according to the present invention was realized.

EXAMPLE 13

In a thirteenth example according to the present invention, a method for producing the MR effect memory cell 2000 described in the second example with reference to FIG. 3 will be described. The MR effect memory cell 2000 produced in the thirteenth example includes the soft magnetic film 130 described in the fifth example with reference to FIG. 8B.

The MR portion 101 (FIG. 3) including the soft magnetic film 130 shown in FIG. 8B was produced in a manner similar to that described in the sixth example. In this example, the nonmagnetic film 121 which is conductive (FIG. 6A) is used instead of the nonmagnetic insulating film 120. That is, the MR effect memory cell 2000 in this example is a GMR element.

The MR portion 101 was produced using, as targets, $Ni_{0.68}Co_{0.2}Fe_{0.12}$ (for the ferromagnetic films 230 and 250 in the exchange-coupled ferrimagnetic film), Cu (for the nonmagnetic film 121), $Co_{0.9}Fe_{0.1}$ (for the ferromagnetic film 190), and PtMn (for the antiferromagnetic film 180, i.e., the magnetization rotation prevention layer).

The MR portion 101 having a CPP structure had a basic structure of PtMn (30)/$Co_{0.9}Fe_{0.1}$ (20)/Cu (3)/$Ni_{0.68}Co_{0.2}Fe_{0.12}$ (2)/Ru (0.7)/$Ni_{0.68}Co_{0.2}Fe_{0.12}$ (3).

The MR ratio of the MR portion 101 was measured at room temperature at an applied magnetic field of 100 Oe. The MR ratio of the MR portion 101 was about 19%. The size of the MR portion 101 in a planar direction thereof was about 0.05 $\mu m^2$.

The MR effect memory cell 2000 described in the second example was produced including the MR portion 101 having the soft magnetic film 130 shown in FIG. 8B in a manner similar to that described in the sixth example. The conductive films 141 and 150 were formed of Au and Cu, and the conductive film 170 was formed of AuCr. The insulation film 160 for insulating the MR portion 101 and the conductive film 170 was formed of $SiO_2$ in this example, but can be formed of, for example, $CaF_2$, $Al_2O_3$ or $Si_3N_4$.

The operation of the MR effect memory cell 2000 produced in this manner was confirmed by the method described in the seventh example with reference to FIGS. 10A and 10B. As a result, the voltage change 543 shown in FIG. 10B corresponding to the written information was detected. Thus, it was found that the MR effect memory cell 2000 according to the present invention was realized.

EXAMPLE 14

Figure 12A:
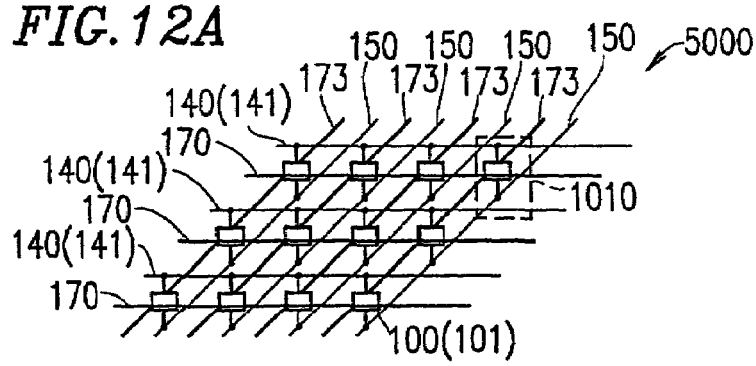
FIG. 12A is a configuration diagram of an MRAM in a fourteenth example according to the present invention.
Figure 12B:
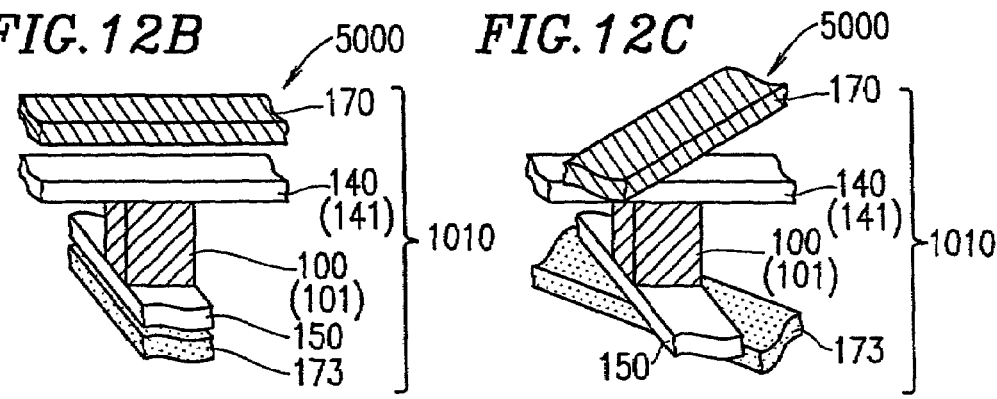
FIG. 12B is a partial isometric view of the MRAM shown in FIG. 12A.
Figure 12C:
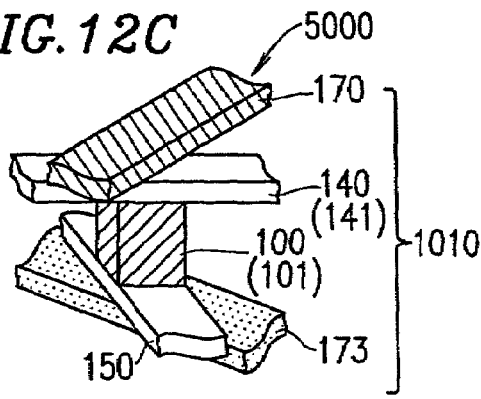
FIGS. 12C, 12D and 12E are exemplary partial isometric views of the MRAM shown in FIG. 12A.
Figure 12D:
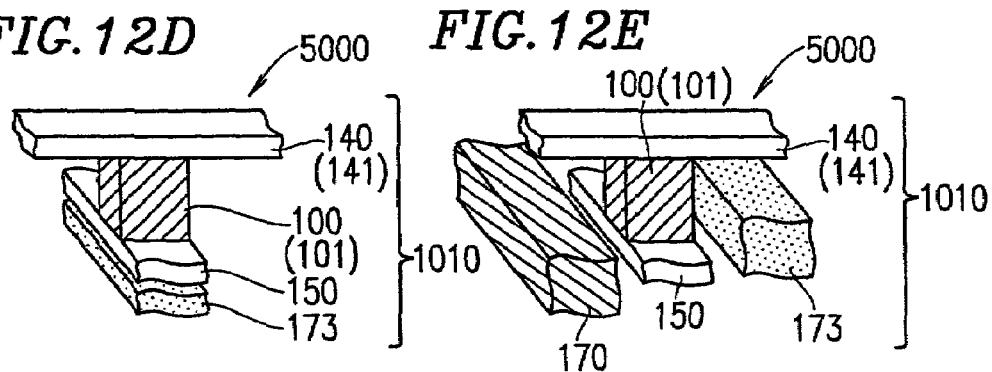
Figure 12E:
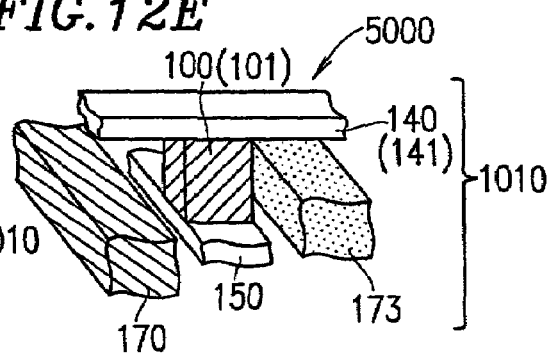
Figure 12F:
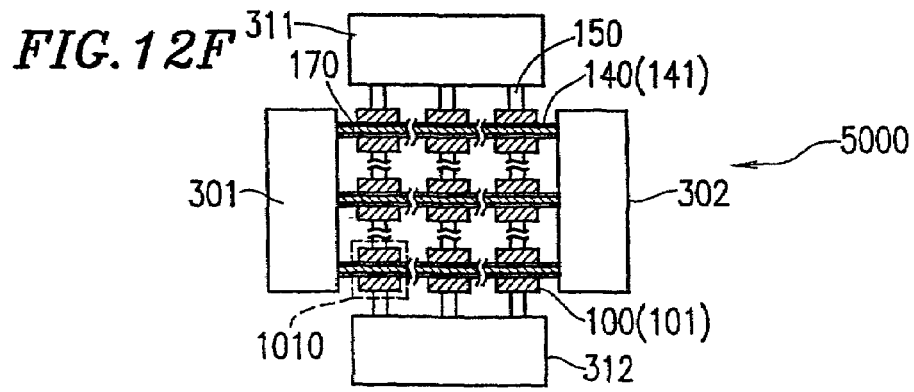
FIG. 12F is a plan view of the MRAM shown in FIG. 12A.

FIG. 12A is a configuration diagram of an MRAM 5000 in a fourteenth example according to the present invention. FIG. 12B is a partial isometric view of the MRAM 5000, and FIG. 12F is a partial plan view of the MRAM 5000.

The MRAM 5000 includes a plurality of MR effect memory cells 1010 in a matrix of 256×256 (row×column). The number of the MR effect memory cells 1010 is optional.

As shown in FIG. 12B, the MR effect memory cell 1010 includes a word line 173 in addition to the structure of the MR effect memory cell 1000 or 2000 described in the third example with reference to FIG. 5B. Preferably, the word lines 170 and 173 are respectively provided on a top surface and a bottom surface of the MR portion 100 or 101 as shown in FIG. 12B. The positions of the word lines 170 and 173 are not limited to those shown in FIG. 12B, and the word lines 170 and 173 can be positioned anywhere as long as a magnetic field can be effectively applied to the MR portion 100 (or 101). FIGS. 12C, 12D and 12E shows examples of the word lines 170 and 173.

In FIG. 12C, the word lines 170 and 173 are located offset with respect to the MR portion 100 (or 101) by a certain angle to guarantee an effective application of a magnetic field to the MR portion 100 (or 101). In this and any possible example according to the present invention, the word lines can be provided in a prescribed direction. The prescribed direction is a row direction, a column direction, and a direction having an angle, for example, an angle of 45 degrees, with respect to the row direction and the column direction. It is not necessary for the word lines to be parallel to the sense lines and the bit lines.

In FIG. 12D, the sense line 140 is used instead of the word line 170. In FIG. 12E, the word lines 170 and 173 are provided along side surfaces of the MR portion 100 (or 101). In the structure of FIG. 12E, currents are caused to flow in the word lines 170 and 173 in an identical direction. A synthesized magnetic field is generated by the word lines 170 and 173. A synthesized magnetic field, which is made of the resultant synthesized magnetic field (generated by the word lines 170 and 173) and a magnetic field generated by the sense line 140 (or 141), is used for writing information to the MR portion 100 (or 101).

First, the MR effect memory cells 1010 including the word line 173 in addition to the structure of the MR effect memory cell 1000 will be described.

The MR portion 100 of the MR effect memory cells 1010 had a structure described in the tenth example, i.e., $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (20). The inventors also produced another type of MR portion 100 having a structure of $Ni_{0.81}Fe_{0.19}$ (2)/Ru (0.7)/$Ni_{0.81}Fe_{0.19}$ (3)/$Al_2O_3$ (1.2)/$Co_{0.9}Fe_{0.1}$ (20).

The conductive films 140 and 150 were formed of Au, Cu or Al, and the conductive films 170 and 173 were formed of Cu. The insulation film 160 for insulating the MR portion 100 (or 101) and the conductive film 170 was formed of $SiO_2$ in this example, but can be formed of, for example, $CaF_2$, $Al_2O_3$ or $Si_3N_4$.

As shown in FIG. 12A, the conductive films 140 and 150 (sense lines and bit lines) are arranged in a lattice. The conductive films 170 and 173 (word lines) are arranged in a lattice. Switching sections 301 and 311 for address designation and signal detection sections 302 and 312 are provided as shown in FIG. 12F. In FIG. 12F, the conductive films 173 are not shown for clarity. The switching sections 301 and 311 select arbitrary conductive films 140 and 150 and conductive films 170 and 173. The signal detection sections 302 and 312 detect the level of the current or the value of the voltage of each conductive film.

Information is written in the MR portion 100 by causing a pulse current to flow in one conductive film 170 and one conductive film 173 (arranged in a lattice) and thus causing a magnetization state of a particular MR portion 100 to be changed by a synthesized magnetic field generated by the one conductive film 170 and the one conductive film 173.

Information write to and read from the MRAM 5000 is performed basically in a manner same as that described in the sixth example with reference to FIGS. 9A and 9B. A read operation from the MRAM 5000 in an arbitrary information storage state was confirmed in the following manner.

A particular conductive film 140, a particular conductive film 150, a particular conductive film 170, and a particular conductive film 173 were selected by the switching sections 301 and 311. While monitoring the resistance value of a MR portion 100 corresponding to the selected conductive films 140, 150, 170 and 173 (i.e., a selected MR portion 100), a magnetic field for causing magnetization inversion of the soft magnetic film 130 (FIG. 1) was applied to the selected MR portion 100. As a result, the pulse 533 shown in FIG. 9B was detected through the signal detection section 302 or 312. Since the information read was stored after the read, the read operation was confirmed to be an NDRO. Based on these results, it was found that the MRAM 5000 according to the present invention was realized.

Next, the MR effect memory cells 1010 including the word line 173 in addition to the structure of the MR effect memory cell 2000 described in the eleventh example will be described.

The MR portion 101 of the MR effect memory cells 1010 had a structure described in the eleventh example, i.e., $Ni_{0.81}Fe_{0.19}$ (3)/Ru (0.7)/$Ni_{0.81}Fe_{0.19}$ (2)/$Al_2O_3$ (1.2)/$Co_{0.5}Fe_{0.5}$ (20)/IrMn (30). The inventors also produced another type of MR portion 101 having a structure of $Ni_{0.81}Fe_{0.19}$ (2)/Ru (0.7)/$Ni_{0.81}Fe_{0.19}$ (3)/$Al_2O_3$ (1.2)/$Co_{0.5}Fe_{0.5}$ (20)/IrMn (30).

The conductive films 141 and 150 were formed of Au and Cu, and the conductive films 170 and 173 were formed of AuCr. The insulation film 160 for insulating the MR portion 101 and the conductive film 170 was formed of $SiO_2$ in this example, but can be formed of, for example, $CaF_2$, $Al_2O_3$ or $Si_3N_4$.

As shown in FIG. 12A, the conductive films 141 and 150 (sense lines and bit lines) are arranged in a lattice. The conductive films 170 and 173 (word lines) are arranged in a lattice.

Information is written in the MR portion 101 by causing a pulse current to flow in one conductive film 170 and one conductive film 173 (arranged in a lattice) and thus causing a magnetization state of a particular MR portion 101 to be changed by a synthesized magnetic field generated by the one conductive film 170 and the one conductive film 173.

Information write to and read from the MRAM 5000 is performed basically in the same manner as that described in the seventh example with reference to FIGS. 10A and 10B. A read operation from the MRAM 5000 in an arbitrary information storage state was confirmed in the following manner.

A particular conductive film 141, a particular conductive film 150, a particular conductive film 170, and a particular conductive film 173 were selected by the switching sections 301 and 311. While monitoring the resistance value of a MR portion 101 corresponding to the selected conductive films 141, 150, 170 and 173 (i.e., a selected MR portion 101), a magnetic field for causing magnetization inversion of the soft magnetic film 130 (FIG. 8B) was applied to the selected MR portion 101. The magnetization direction of the soft magnetic film 130 indicates the direction of the magnetization direction difference between the ferromagnetic films 230 and 250 (FIG. 8B). As a result of the monitoring, the voltage change 543 shown in FIG. 10B was detected through the signal detection section 302 or 312. Thus, it was found that the MRAM 5000 according to the present invention was realized.

EXAMPLE 15

In a fifteenth example according to the present invention, a method for producing the MR effect memory cell 2000 described in the second example with reference to FIG. 3 will be described. The MR effect memory cell 2000 produced in the fifteenth example includes the soft magnetic film 130 described in the fifth example with reference to FIG. 8C.

The MR portion 101 including the soft magnetic film 130 shown in FIG. 8C was produced in a manner similar to that described in the sixth example.

The MR portion 101 was produced using, as targets, $Ni_{0.81}Fe_{0.19}$ (for the ferromagnetic films 230 and 250 in the exchange-coupled ferrimagnetic film), Ru (for the nonmagnetic film 240), Al (for the nonmagnetic insulating film 120), $Co_{0.9}Fe_{0.1}$ (for the ferromagnetic films 260 and 280 in the other exchange-coupled ferrimagnetic film), and IrMn (for the antiferromagnetic film 180, i.e., the magnetization rotation prevention layer).

The MR portion 101 had a basic structure of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (2)/Ru (0.7)/$Co_{0.9}Fe_{0.1}$ (2)/IrMn (20). The nonmagnetic insulating film 120 of $Al_2O_3$ was formed by method A described in the sixth example.

The MR ratio of the MR portion 101 was measured at room temperature at an applied magnetic field of 100 Oe. The MR ratio of the MR portion 101 was about 36%. The size of the MR portion 101 in a planar direction thereof was about 0.1 $\mu m^2$.

It was found that the MR portion 101 in this example has a smaller anti-magnetic force than a MR portion having a basic structure of $Ni_{0.81}Fe_{0.19}$ (5)/$Al_2O_3$ (1.2)/$Co_{0.9}Fe_{0.1}$ (2)/Ru (0.7)/$Co_{0.9}Fe_{0.1}$ (2)/IrMn (20). The MR portion 101 in this example has a smaller anti-magnetic force because the influence of an anti-magnetic field is reduced by the structure shown in FIG. 8C.

The MR effect memory cell 2000 described in the second example was produced including the MR portion 101 having the soft magnetic film 130 shown in FIG. 8C in a manner similar to that described in the sixth example. The conductive films 141 and 150 were formed of Au and Cu, and the conductive film 170 was formed of AuCr. The insulation film 160 for insulating the MR portion 101 and the conductive film 170 was formed of $SiO_2$ in this example, but can be formed of, for example, $CaF_2$, $Al_2O_3$ or $Si_3N_4$.

The operation of the MR effect memory cell 2000 produced in this manner was confirmed by the method described in the seventh example with reference to FIGS. 10A and 10B. As a result, the voltage change 543 shown in FIG. 10B corresponding to the written information was detected. Thus, it was found that the MR effect memory cell 2000 according to the present invention was realized.

EXAMPLE 16

In a sixteenth example according to the present invention, a method for producing the MR effect memory cell 2000 described in the second example with reference to FIG. 3 will be described. The MR effect memory cell 2000 produced in the sixteenth example includes the soft magnetic film 130 described in the fifth example with reference to FIG. 8C.

The MR portion 101 including the soft magnetic film 130 shown in FIG. 8C was produced in a manner similar to that described in the sixth example.

The MR portion 101 was produced using, as targets, $Ni_{0.81}Fe_{0.19}$ (for the ferromagnetic films 230 and 250 in the exchange-coupled ferrimagnetic film), Ru (for the nonmagnetic film 240), Al (for the nonmagnetic insulating film 120), $Co_{0.9}Fe_{0.1}$ (for the ferromagnetic films 260 and 280 in the other exchange-coupled ferrimagnetic film), and IrMn (for the antiferromagnetic film 180, i.e., the magnetization rotation prevention layer). An MR portion 101 including another ferromagnetic film (not shown) at the interface between the nonmagnetic insulating film 120 and the ferromagnetic film 250 was also produced. The another ferromagnetic film was formed of $Co_{0.9}Fe_{0.1}$.

Two types of MR portions 101 were produced. One type had a first basic structure of $Ni_{0.81}Fe_{0.19}$ (3)/Ru (0.7)/ $Ni_{0.81}Fe_{0.19}$ (2)/$Al_2O_3$ (1.2)/$Co_{0.9}Fe_{0.1}$ (2)/Ru (0.7)/$Co_{0.9}Fe_{0.1}$ (2)/IrMn (20). The other type had a second basic structure of $Ni_{0.81}Fe_{0.19}$ (3)/Ru (0.7)/$Ni_{0.81}Fe_{0.19}$ (2)/$Co_{0.9}Fe_{0.1}$ (0.5)/ $Al_2O_3$ (1.2)/$Co_{0.9}Fe_{0.1}$ (2)/Ru (0.7)/$Co_{0.9}Fe_{0.1}$ (2)/IrMn (20). The nonmagnetic insulating film 120 of $Al_2O_3$ was formed by method A described in the sixth example.

The MR ratio of each type of MR portion 101 was measured at room temperature at an applied magnetic field of 100 Oe. The MR ratio of the MR portion 101 having the first basic structure was about 35%, and the MR ratio of the MR portion 101 having the second basic structure was about 37%. The size of the MR portion 101 in a planar direction thereof was about 0.1 μm².

Each MR portion 101 was heat-treated. The MR ratio of the MR portion 101 having the second basic structure reached about 41% when heated at about 280° C. This suggests that $Co_{0.9}Fe_{0.1}$ contained in the soft magnetic film 130 (free layer) suppresses mutual diffusion of Ni and Al in the $Ni_{0.81}Fe_{0.19}$ and $Al_2O_3$ layers and thus stabilizes the interface. The $Co_{0.9}Fe_{0.1}$ layer preferably has a thickness of about 1 nm or less.

The MR effect memory cell 2000 described in the second example was produced including the MR portion 101 having the soft magnetic film 130 shown in FIG. 8C in a manner similar to that described in the sixth example. The conductive films 141 and 150 were formed of Au and Cu, and the conductive film 170 was formed of AuCr. The insulation film 160 for insulating the MR portion 101 and the conductive film 170 was formed of $SiO_2$ in this example, but can be formed of, for example, $CaF_2$, $Al_2O_3$ or $Si_3N_4$.

The operation of the MR effect memory cell 2000 produced in this manner was confirmed by the method described in the seventh example with reference to FIGS. 10A and 10B. As a result, the voltage change 543 shown in FIG. 10B corresponding to the written information was detected. Thus, it was found that the MR effect memory cell 2000 according to the present invention was realized.

EXAMPLE 17

In a seventeenth example according to the present invention, a method for producing the MR effect memory cell 1000 described in the first example will be described.

The MR portion 100 shown in FIG. 1 was produced in a manner similar to that described in the sixth example.

The MR portion 100 was produced using, as targets, $Ni_{0.8}Fe_{0.2}$ (for the soft magnetic film 130), Al (for the nonmagnetic insulating film 120), and NiMnSb (for the hard magnetic film 110). The MR portion 100 having a structure of $Ni_{0.8}Fe_{0.2}$ (15)/$Al_2O_3$ (1.2)/NiMnSb (50) was produced on a sapphire c-face substrate. The nonmagnetic insulating film 120 of $Al_2O_3$ was produced by method A described in the sixth example.

The MR ratio of the MR portion 100 was measured at room temperature at an applied magnetic field of 100 Oe. The MR ratio of the MR portion 100 was about 40%. The size of the MR portion 100 in a planar direction thereof was about 0.25 μm².

In this example, a sapphire substrate was used, but a satisfactory NiMnSb film can be produced using a magnesium oxide (100) substrate.

In this example, NiMnSb was used as a material exhibiting a sufficiently high magnetic polarization ratio. When PtMnSb or PdMnSb is used, a similarly high MR ratio is exhibited and thus a satisfactory MR portion can be provided.

The MR effect memory cell 1000 described in the first example was produced including the MR portion 100 in the sapphire c-face in a manner similar to that described in the sixth example. The conductive films 140 and 150 were formed of Au and Cu, and the conductive film 170 was formed of AuCr. The insulation film 160 for insulating the MR portion 100 and the conductive film 170 was formed of $SiO_2$ in this example, but can be formed of, for example, $CaF_2$, $Al_2O_3$ or $Si_3N_4$.

The operation of the MR effect memory cell 1000 produced in this manner was confirmed by the method described in the sixth example with reference to FIGS. 9A and 9B. As a result, the pulse 533 shown in FIG. 9B corresponding to the written information was detected. Thus, it was found that the MR effect memory cell 1000 according to the present invention was realized.

EXAMPLE 18

In an eighteenth example according to the present invention, a method for producing the MR effect memory cell 1000 described in the first example will be described.

The MR portion 100 shown in FIG. 1 was produced in a manner similar to that described in the sixth example.

The MR portion 100 was produced using, as targets, $Ni_{0.8}Fe_{0.2}$ (for the soft magnetic film 130), Al (for the nonmagnetic insulating film 120), and PtMnSb (for the hard magnetic film 110). The MR portion 100 having a structure of $Ni_{0.8}Fe_{0.2}$ (15)/$Al_2O_3$ (1.2)/PtMnSb (50) was produced on a sapphire c-face substrate. Then on magnetic insulating film 120 of $Al_2O_3$ was produced by method A described in the sixth example.

First, PtMnSb was epitaxially grown on the sapphire c-face substrate at a temperature of about 500° C. The resultant PtMnSb layer exhibited a (111) orientation as a result of lattice matching with the sapphire c-face substrate. Then, Al was deposited and oxidized to form $Al_2O_3$ as described in the sixth example. Then, $Ni_{0.8}Fe_{0.2}$ was deposited, thereby forming the MR portion 100 having a structure of $Ni_{0.8}Fe_{0.2}$ (15)/$Al_2O_3$ (1.2)/PtMnSb (50).

The MR ratio of the MR portion 100 was measured at room temperature at an applied magnetic field of 100 Oe. The MR ratio of the MR portion 100 was about 40%. The size of the MR portion 100 in a planar direction thereof was about 0.25 μm².

In this example, a sapphire substrate was used, but a satisfactory PtMnSb film can be produced using a magnesium oxide (100) substrate. It was found that when the magnesium oxide (100) substrate is used, a PtMnSb film exhibiting a (100) orientation is obtained due to lattice matching.

In this example, PtMnSb was used as a material exhibiting a sufficiently high magnetic polarization ratio. When NiMnSb or PdMnSb is used, a similarly high MR ratio is exhibited and thus a satisfactory MR portion can be provided.

The MR effect memory cell 1000 described in the first example was produced including the MR portion 100 on the sapphire c-face in a manner similar to that described in the sixth example. The conductive films 140 and 150 were formed of Au and Cu, and the conductive film 170 was formed of AuCr. The insulation film 160 for insulating the MR portion 100 and the conductive film 170 was formed of $SiO_2$ in this example, but can be formed of, for example, $CaF_2$, $Al_2O_3$ or $Si_3N_4$.

The operation of the MR effect memory cell 1000 produced in this manner was confirmed by the method described in the sixth example with reference to FIGS. 9A and 9B. As a result, the pulse 533 shown in FIG. 9B corresponding to the written information was detected. Thus, it was found that the MR effect memory cell 1000 according to the present invention was realized.

EXAMPLE 19

In a nineteenth example according to the present invention, a method for producing the MR effect memory cell 2000 described in the second example will be described.

The MR portion 101 shown in FIG. 3 was produced in a manner similar to that described in the sixth example.

The MR portion 101 was produced using, as targets, $Ni_{0.8}Fe_{0.2}$ (for the soft magnetic film 130), Al (for the nonmagnetic insulating film 120), PtMnSb (for the ferromagnetic film 190), and $\alpha$-$Fe_2O_3$ (for the antiferromagnetic film 180, i.e., the magnetization rotation prevention layer).

First, $\alpha$-$Fe_2O_3$ was grown on a sapphire c-face substrate. Thus, the MR portion 101 having a structure of $Ni_{0.8}Fe_{0.2}$ (15)/$Al_2O_3$ (1.2)/PtMnSb (25)/$\alpha$-$Fe_2O_3$ (40) was formed. The nonmagnetic insulating film 120 of $Al_2O_3$ was produced by method A described in the sixth example.

The MR ratio of the MR portion 101 was measured at room temperature at an applied magnetic field of 100 Oe. The MR ratio of the MR portion 101 was about 40%. The size of the MR portion 101 in a planar direction thereof was about 0.25 $\mu m^2$ at the minimum.

In this example, PtMnSb was used as a material exhibiting a sufficiently high magnetic polarization ratio. When NiMnSb or CuMnSb is used, a similarly high MR ratio is exhibited and thus a satisfactory MR portion can be provided.

The MR effect memory cell 2000 described in the second example was produced including the MR portion 101 on the sapphire c-face in a manner similar to that described in the sixth example. The conductive films 141 and 150 were formed of Au and Cu, and the conductive film 170 was formed of AuCr. The insulation film 160 for insulating the MR portion 101 and the conductive film 170 was formed of $SiO_2$ in this example, but can be formed of, for example, $CaF_2$, $Al_2O_3$ or $Si_3N_4$.

The operation of the MR effect memory cell 2000 produced in this manner was confirmed by the method described in the seventh example with reference to FIGS. 10A and 10B. As a result, the voltage change 543 shown in FIG. 10B corresponding to the written information was detected. Thus, it was found that the MR effect memory cell 2000 according to the present invention was realized.

EXAMPLE 20

In a twentieth example according to the present invention, a method for producing the MR effect memory cell 2000 described in the second example will be described. The MR effect memory cell 2000 produced in the twentieth example includes the soft magnetic film 130 described in the fifth example with reference to FIG. 8C.

An MR portion 101 including the soft magnetic film 130 shown in FIG. 8C was produced in a manner similar to that described in the sixth example.

The MR portion 101 was produced using, as targets, $Ni_{0.81}Fe_{0.19}$ (for the ferromagnetic films 230 and 250 in the exchange-coupled ferrimagnetic film), Ru (for the nonmagnetic film 240), Al (for the nonmagnetic insulating film 120), $Co_{0.9}Fe_{0.1}$ (for the ferromagnetic films 260 and 280 in the other exchange-coupled ferrimagnetic film), and IrMn (for the antiferromagnetic film 180, i.e., the magnetization rotation prevention layer).

The MR portion 101 having a structure of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (2)/Ru (0.7)/$Co_{0.9}Fe_{0.1}$ (2)/IrMn (20) was formed. The nonmagnetic insulating film 120 of $Al_2O_3$ was produced by method A described in the sixth example.

The MR ratio of the MR portion 101 was measured at room temperature at an applied magnetic field of 100 Oe. The MR ratio of the MR portion 101 was about 35%. The size of the MR portion 101 in a planar direction thereof was about 0.05 $\mu m^2$.

The MR effect memory cell 2000 described in the second example was produced including the MR portion 101 in a manner similar to that described in the sixth example. The conductive films 141 and 150 were formed of Cu, and the conductive film 170 was formed of Cu. The insulation film 160 for insulating the MR portion 101 and the conductive film 170 was formed of $SiO_2$ in this example, but can be formed of, for example, $CaF_2$, $Al_2O_3$ or $Si_3N_4$.

Figure 13:
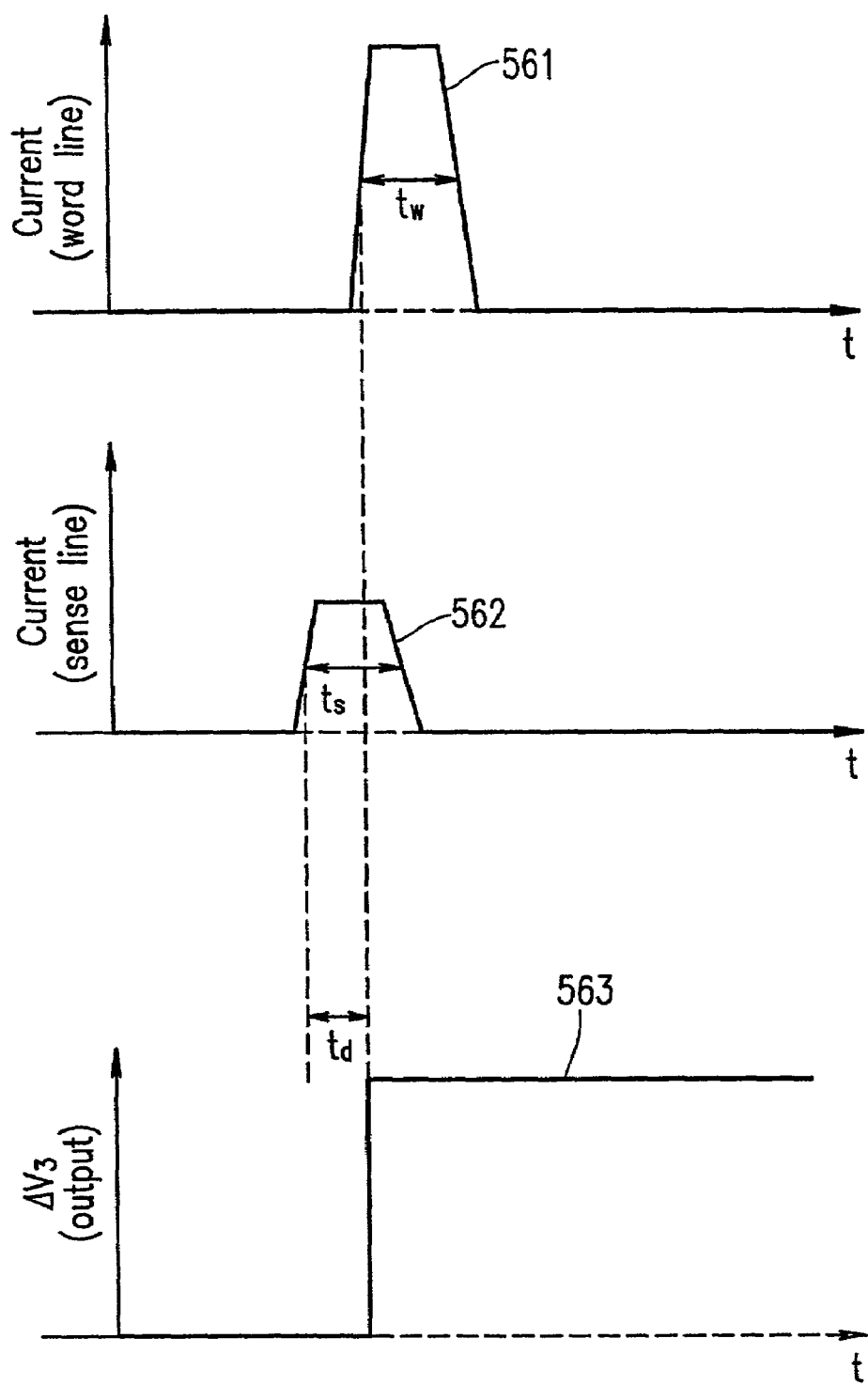
FIG. 13 is a graph illustrating an operation of an MR effect memory cell in a twentieth example according to the present invention.

In order to confirm the high speed operation of the MR effect memory cell 2000 produced in this manner, a pulse current 561 (FIG. 13) was caused to flow in the conductive film 170 (word line) and a pulse current 562 (FIG. 13) was caused to flow in the conductive film 150 (sense line in this case) to monitor a change in the voltage value $\Delta V_3$ of the MR portion 101. As a result, a voltage change 563 shown in FIG. 13 corresponding to the written information was detected.

In this example, the magnetic field generated by an application of a current to the sense line is in an axial direction in which magnetization rotation is relatively difficult, and the magnetic field generated by an application of a current to the word line is in an axial direction in which magnetization rotation is relatively easy. In other words, the MR portion 101 tends to be magnetized in the direction of a magnetic field generated by the word line than in the direction of a magnetic field generated by the sense line.

It was found that a difference in the output voltage appears by applying a pulse current to the sense line and the word line at different trigger timings. A larger pulse current was applied to the word line than to the sense line. The pulse width $t_s$ of the pulse current applied to the sense line is preferably about 0.1 ns or more, and the pulse width $t_w$ of the pulse current applied to the word line is preferably about 0.1 ns or more. A timing difference $t_d$ of the pulse applied to the sense word line with respect to the pulse applied to the sense line is preferably about 0.1 ns or more and about 50 ns or less. It was found that by applying the pulse to the word line and the sense line at different trigger timings, a sufficiently high MR ratio is guaranteed and thus a sufficiently high output is provided.

Such an output characteristic indicates that it is effective in providing a sufficiently high output to apply a magnetic field in an axial direction in which magnetization rotation is relatively difficult before a magnetic field is applied in an axial direction in which magnetization rotation is relatively easy, not to apply a magnetic field only in the axial direction in which magnetization rotation is relatively easy (or the axial direction in which magnetization rotation is relatively difficult), when the magnetization direction is rotated at 180 degrees. It is considered that such a manner of magnetic field application causes a magnetic torque against the magnetization inversion in the axial direction, in which magnetization rotation is relatively easy, to be applied more easily.

The MR portion 101 can tend to be magnetized in the direction of a magnetic field generated by the sense line than in the direction of a magnetic field generated by the word line.

When a magnetic field is applied using both a word line and a sense line which are substantially perpendicular to each other, an asteroid-type magnetic field curve 1401 shown in FIG. 14 determines a strength $H_s$ of the magnetic field generated by the sense line and a strength $H_w$ of the magnetic field generated by the word line. Thus, application of a magnetic field using both of the word line and the sense line (or two word lines) perpendicular to each other can reduce the level of the current required to flow in the sense line and the word line in order to generate a magnetic field as well as in order to select the address of a particular MR portion.

Figure 15A:
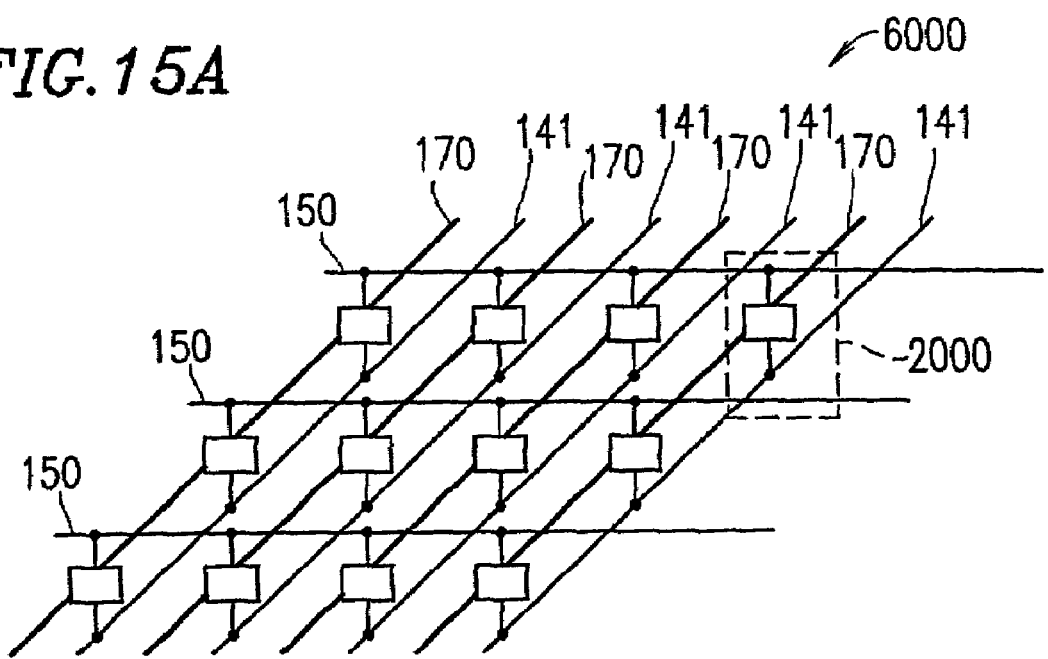
FIG. 15A is a configuration diagram of an MRAM in the twentieth example.
Figure 15B:
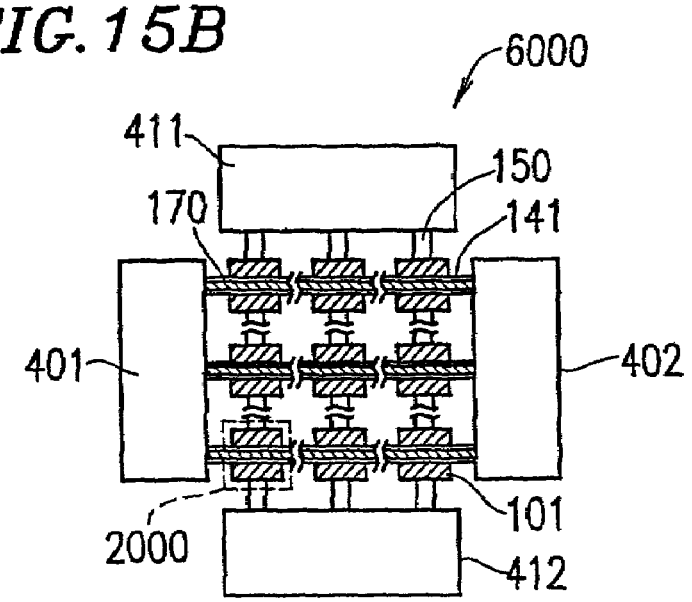
FIG. 15B is a plan view of the MRAM in the twentieth example.

FIG. 15A shows a configuration diagram of an MRAM 6000 including a plurality of MR effect memory cells 2000 in a matrix of 512×512 (row×column), and FIG. 15B is a partial plan view of the MRAM 6000. The number of the MR effect memory cells 2000 is optional.

As shown in FIG. 15B, switching sections 401 and 411 for address designation and signal detection sections 402 and 412 are provided. The switching sections 401 and 411 select arbitrary conductive films 141, 150 and 170. The signal detection sections 402 and 412 detect the level of the current or the value of the voltage of each conductive film. The conductive films 141 and 150 (sense lines and bit lines) are arranged in a lattice as shown in FIG. 15A. The conductive films 170 and 173 (word lines) are arranged in a lattice. The word line 170 is preferably provided on a top surface of the MR portion 101 as shown in FIG. 15B, but can be provided on a side surface of the MR portion 101 as shown in FIG. 15A. The position of the word line is not limited to those that shown in FIG. 15B, and the word line can be positioned anywhere as long as a magnetic field is effectively applicable to the MR portion 101.

Information is written in the MR portion 101 by causing a pulse current to flow in one conductive film 150 and one conductive film 170 (arranged in a lattice) and thus causing a magnetization state of a particular MR portion 101 to be changed by a synthesized magnetic field generated by the one conductive film 150 and the one conductive film 170. In this example, the conductive film 150 (sense line) is used instead of the conductive film 173 (word line) shown in the fourteenth example.

A read operation from the MRAM 6000 in an arbitrary information storage state was confirmed in the following manner.

A particular conductive film 141, a particular conductive film 150, and a particular conductive film 170 were selected by the switching sections 401 and 411. The resistance value of a MR portion 101 corresponding to the selected conductive films 141, 150 and 170 (i.e., a selected MR portion 101) was monitored. As described in the second example, a difference between the resistance value of the selected MR portion 101 and the reference resistance value was monitored through a differential circuit (not shown; preferably built into the signal detection sections 402 and 412). Thus, the written state was read corresponding to the difference. Based on these results, it was found that the MRAM 6000 according to the present invention was realized.

EXAMPLE 21

Figure 16A:
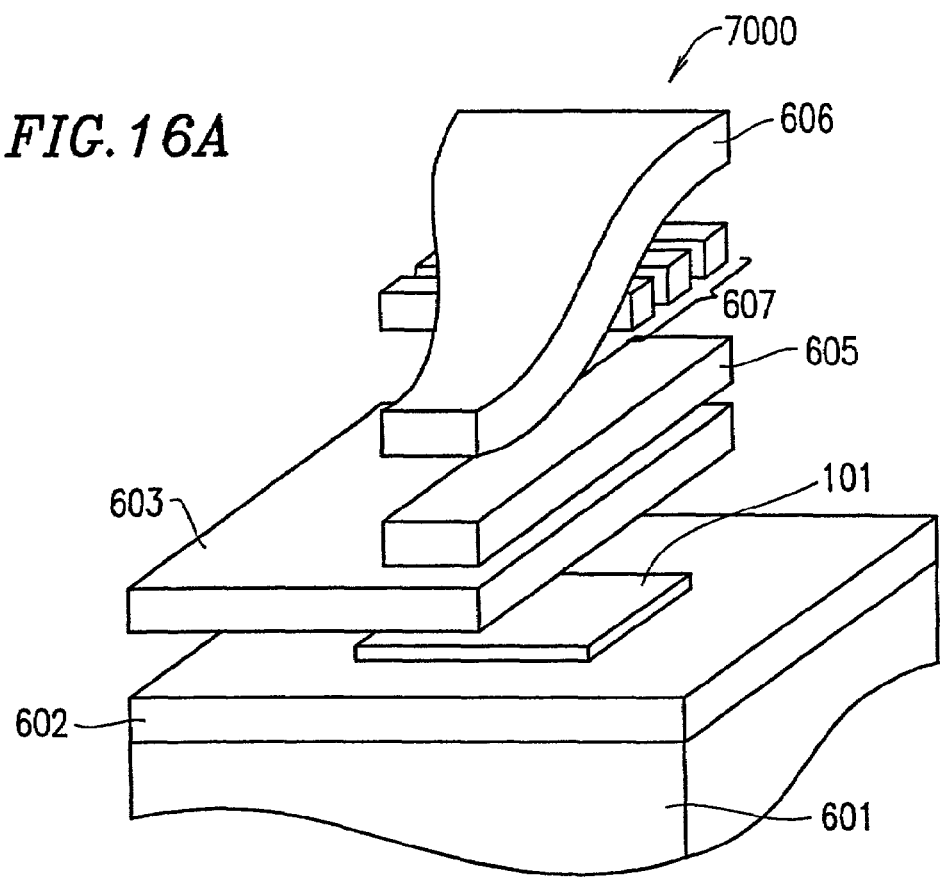
FIG. 16A is a partial isometric view of an MR effect head in a twenty-first example according to the present invention.
Figure 16B:
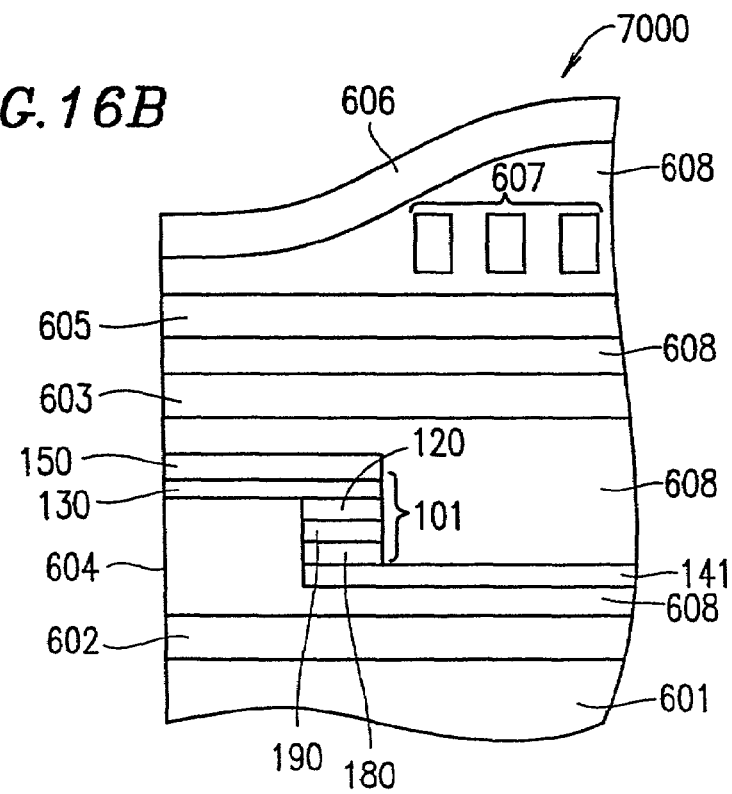
FIG. 16B is a cross-sectional view of the MR effect head shown in FIG. 16A.

FIG. 16A is a partial isometric view of an MR effect head 7000 including the tunneling MR portion 101 described in the second example with reference to FIG. 3. FIG. 16B is a cross-sectional view of the MR effect head 7000. The MR portion 101 in the MR effect head 7000 includes the soft magnetic film 130 described in the fifth example with reference to FIG. 8B.

The MR portion 101 was produced in a manner similar to that described in the sixth example.

The MR portion 101 was produced using, as targets, $Co_{0.9}Fe_{0.1}$ or $Ni_{0.81}Fe_{0.19}$ (for the ferromagnetic films 230 and 250 in the exchange-coupled ferrimagnetic film), Ru (for the nonmagnetic film 240), Al (for the nonmagnetic insulating film 120), $Co_{0.9}Fe_{0.1}$ (for the ferromagnetic film 190), and IrMn (for the antiferromagnetic film 180, i.e., the magnetization rotation prevention layer).

The MR portion 101 having a structure of $Ni_{0.81}Fe_{0.19}$ (3)/Ru (0.7)/$Ni_{0.81}Fe_{0.19}$ (2)/$Al_2O_3$ (1.2)/$Co_{0.9}Fe_{0.1}$ (20)/IrMn (30) was formed. The nonmagnetic insulating film 120 of $Al_2O_3$ was produced by method A described in the sixth example.

The MR ratio of the MR portion 101 was measured at room temperature at an applied magnetic field of 100 Oe. The MR ratio of the MR portion 101 was about 30%. The size of the MR portion 101 in a planar direction thereof was about 0.25 μm².

The MR effect head 7000 includes the tunneling MR portion 101, a substrate 601, for a slider, formed of a sintered material containing $Al_2O_3$.TiC as a main component, shield layers 602 and 603, writing magnetic poles 605 and 606 formed of a NiFe alloy, a coil 607 formed of Cu, and gap layers 608 formed of $Al_2O_3$. The gap layers 608 are located between two adjacent layers. The shield layers 602 and 603 each have a thickness of about 1 μm. The writing magnetic poles 605 and 606 each have a thickness of about 3 μm. The gap layers 608 between the shield layer 602 and the MR portion 101 and between the shield layer 603 and the MR portion 101 each have a thickness of about 0.1 μm, and the gap layer 608 between writing magnetic poles 605 and 606 is about 0.2 μm. The distance between the conductive layer 150 and the writing magnetic pole 605 is about 4 μm, and the coil 607 has a thickness of about 3 μm.

The MR portion 101 is located between the shield layers 602 and 603, and is not exposed to a surface 604 of the MR effect head 7000.

A bias current is applied to the MR portion 101 through the conductive films 141 and 150. The soft magnetic films 130 and the ferromagnetic film 190 are set to have magnetization directions directed perpendicular to each other.

Thus, changes in the magnetization direction corresponding to reproduction signals are detected at a sufficiently high sensitivity.

Figure 17A:
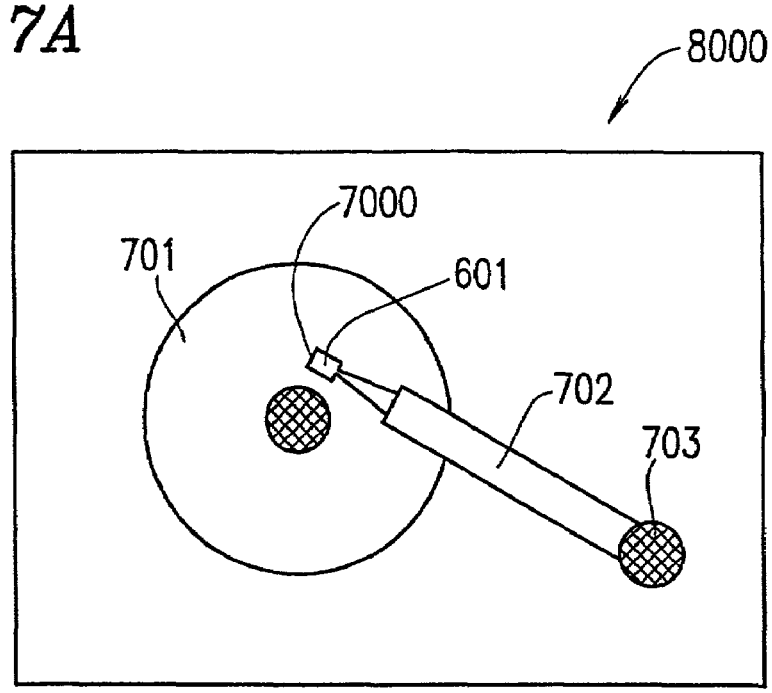
FIG. 17A is a plan view of a magnetic disk apparatus in the twenty-first example.
Figure 17B:
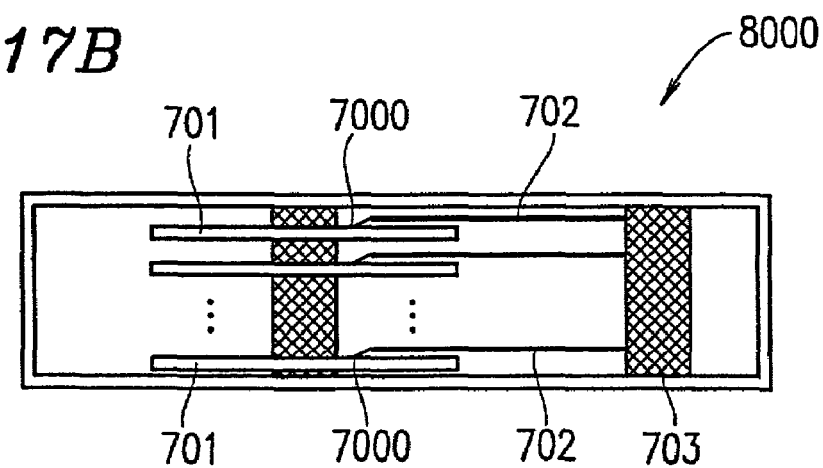
FIG. 17B is a cross-sectional view of the magnetic disk apparatus shown in FIG. 17A.

FIG. 17A is a plan view of a magnetic disk apparatus 8000 including a plurality of MR effect heads 7000. FIG. 17B is a cross-sectional view of the magnetic disk apparatus 8000.

A magnetic recording medium 701 is formed of a Co—Ni—Pt—Ta alloy. The MR effect head 7000 is supported by a magnetic head supporting section 702, and driven by a magnetic head driving section 703. The tracking width of the MR effect head 7000 is set to be 5 μm.

The MR effect head 7000 according to the present invention has a higher resistance change ratio than a GMR effect head which is a conventional CIPMR element. Accordingly, the MR effect head 7000 has a sufficiently large reproduction output and thus is very effective as a magnetic head for reproduction. Since the magnetic disk apparatus 8000 detected voltage changes corresponding to the information recorded in the magnetic recording medium at a sufficiently high level of sensitivity, it was found that the MR effect head 7000 according to the present invention was realized.

The MR portions 100, 101, 102 and 200 in all the examples in this specification are usable as an MR effect head as described in this example.

According to the present invention, a MR effect memory cell or element using an antiferromagnetic film or hard magnetic film are provided.

According to one aspect of the present invention, a free layer in which the magnetization direction is relatively easily rotatable by the external magnetic field includes a ferromagnetic film having a small magnetic coercive force even though being thin, and an amorphous film. According to another aspect of the present invention, a free layer includes a synthesized ferrimagnetic film including ferromagnetic films which are antiferromagnetically exchange-coupled to each other. By forming the free layer to have such structures, the MR effect memory cell or element can operate at a sufficiently high sensitivity even through being microscopic and also can have a sufficiently large output even when the level of the current is low. An MRAM including a plurality of such MR effect memory cells arranged in a matrix and integrated at a high density can also be provided.

According to still another aspect of the present invention, information can be efficiently read from the MR effect memory cell. An NDRO can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magneto-resistive effect element, comprising:
    a first ferromagnetic film;
    a second ferromagnetic film; and
    a nonmagnetic film interposed between the first ferromagnetic film and the second ferromagnetic film,
    wherein:
    the first ferromagnetic film has a magnetization more easily rotatable than a magnetization of the second ferromagnetic film by an external magnetic field, and
    the first ferromagnetic film includes:
        an amorphous magnetic film, and
        a third ferromagnetic film in contact with the nonmagnetic film and interposed between the amorphous magnetic film and the nonmagnetic film.

2. A magneto-resistive effect element according to claim 1, wherein at least one of the first ferromagnetic film and the second ferromagnetic film has a magnetization direction in a planar direction thereof.

3. A magneto-resistive effect element according to claim 1, wherein the nonmagnetic film is an insulating film.

4. A magneto-resistive effect element, comprising:
    a first ferromagnetic film;
    a second ferromagnetic film; and
    a first nonmagnetic film interposed between the first ferromagnetic film and the second ferromagnetic film,
    wherein:
    the first ferromagnetic film has a magnetization more easily rotatable than a magnetization of the second ferromagnetic film by an external magnetic field, and
    the first ferromagnetic film includes:
        a second nonmagnetic film,
        a third ferromagnetic film, and
        a fourth ferromagnetic film,
        wherein the third ferromagnetic film and the fourth ferromagnetic film are antiferromagnetically exchange-coupled with each other through the second nonmagnetic film.

5. A magneto-resistive effect element according to claim 4, wherein at least one of the first ferromagnetic film and the second ferromagnetic film has a magnetization direction in a planar direction thereof.

6. A magneto-resistive effect element according to claim 4, wherein the third ferromagnetic film and the fourth ferromagnetic film have different strengths of saturated magnetization from each other.

7. A magneto-resistive effect element according to claim 4, wherein the third ferromagnetic film and the fourth ferromagnetic film have different thicknesses from each other.

8. A magneto-resistive effect element according to claim 4, wherein the third ferromagnetic film and the fourth ferromagnetic film are magnetization-rotated while being kept anti-parallel to each other.

9. A magneto-resistive effect element according to claim 4, wherein the second ferromagnetic film includes:
    a third nonmagnetic film,
    a fifth ferromagnetic film, and
    a sixth ferromagnetic film,
    wherein the fifth ferromagnetic film and the sixth ferromagnetic film are antiferromagnetically exchange-coupled with each other through the third nonmagnetic film.

10. A magneto-resistive effect element according to claim 4, wherein the first nonmagnetic film is an insulating film.

11. A magneto-resistive effect memory cell, comprising:
    a first ferromagnetic film;
    a second ferromagnetic film;
    a first nonmagnetic film interposed between the first ferromagnetic film and the second ferromagnetic film; and
    at least one conductive film for causing a magnetization rotation of at least the first ferromagnetic film,
    wherein:
    the first ferromagnetic film has a magnetization more easily rotatable the a magnetization of the second ferromagnetic film by an external magnetic field, and
    the first ferromagnetic film includes:
        an amorphous magnetic film, and
        a third nonmagnetic film in contact with the first nonmagnetic film and interposed between the amorphous film and the first nonmagnetic film.

12. A magneto-resistive effect memory cell according to claim 11, wherein at least one of the first ferromagnetic film and the second ferromagnetic film has a magnetization direction in a planar direction thereof.

13. A magneto-resistive effect memory cell according to claim 11, wherein the first nonmagnetic film is an insulating film.

14. A magneto-resistive effect memory cell according to claim 11, wherein:
at least two layer structures are provided, each layer structure including the first ferromagnetic film, the second ferromagnetic film, and the first nonmagnetic film interposed between the first ferromagnetic film and the second ferromagnetic film, and
the at least two layer structures are stacked with at least one second nonmagnetic film interposed therebetween.

15. A magneto-resistive effect memory cell according to claim 14, wherein the second ferromagnetic films of the at least two layer structures have different magnetic coercive forces from each other.

16. An MRAM, comprising a plurality of magneto-resistive effect memory cells according to claim 11, wherein the plurality of conductive films are arranged in at least one prescribed direction.

17. A magneto-resistive effect memory cell, comprising:
a first ferromagnetic film;
a second ferromagnetic film;
a first nonmagnetic film interposed between the first ferromagnetic film and the second ferromagnetic film; and
at least one conductive film for causing a magnetization rotation of at least the first ferromagnetic film,
wherein
the first ferromagnetic film has a magnetization more easily rotatable than a magnetization of the second ferromagnetic film by an external magnetic field, and
the first ferromagnetic film includes:
a second nonmagnetic film,
a third ferromagnetic film, and
a fourth ferromagnetic fibs,
wherein the third ferromagnetic film and the fourth ferromagnetic film are antiferromagnetically exchange-coupled with each other through the second nonmagnetic film.

18. A magneto-resistive effect memory cell according to claim 17, wherein at least one of the first ferromagnetic film and the second ferromagnetic film has a magnetization direction in a planar direction thereof.

19. A magneto-resistive effect memory cell according to claim 17, wherein the third ferromagnetic film and the fourth ferromagnetic film have different strengths of saturated magnetization from each other.

20. A magneto-resistive effect memory cell according to claim 17, wherein the third ferromagnetic film and the fourth ferromagnetic film have different thicknesses from each other.

21. A magneto-resistive effect memory cell according to claim 17, wherein the third ferromagnetic film and the fourth ferromagnetic film are magnetization-rotated while being kept anti-parallel to each other.

22. A magneto-resistive effect memory cell according to claim 17, wherein the second ferromagnetic film includes:
a third nonmagnetic film,
a fifth ferromagnetic film, and
a sixth ferromagnetic film,
wherein the fifth ferromagnetic film and the sixth ferromagnetic film are antiferromagnetically exchange-coupled with each other through the third nonmagnetic film.

23. A magneto-resistive effect memory cell according to claim 17, wherein the first nonmagnetic film is an insulating film.

24. A magneto-resistive effect memory cell according to claim 17, wherein:
at least two layer structures are provided, each layer structure including the first ferromagnetic film, the second ferromagnetic film, and the first nonmagnetic film interposed between the first ferromagnetic film and the second ferromagnetic film, and
the at least two layer structures are stacked with at least one fourth nonmagnetic film interposed therebetween.

25. A magneto-resistive effect memory cell according to claim 24, wherein the second ferromagnetic films of the at least two layer structures have different magnetic coercive forces from each other.

26. An MRAM, comprising a plurality of magneto-resistive effect memory cells according to claim 17, wherein the plurality of conductive films are arranged in at least one prescribed direction.

27. A method for writing information to and reading information from a magneto-resistive effect memory cell, the magneto-resistive effect memory cell including:
a first ferromagnetic film,
a second ferromagnetic film,
a nonmagnetic film interposed between the first ferromagnetic film and the second ferromagnetic film, end at least one conductive film,
wherein the first ferromagnetic film has a magnetization more easily rotatable than a magnetization of the second ferromagnetic film by en external magnetic field,
the method comprising the steps of:
causing a first current to flow in the at least one conductive film to cause a magnetization rotation of at least the first ferromagnetic film, thereby writing information in the magneto-resistive effect memory cell; and
causing a second current to flow in the first ferromagnetic film, the nonmagnetic film, and the second ferromagnetic film; and causing a third current, which is a combination of a positive bias current and a negative bias current, to flow in the at least one conductive film, thereby reading a voltage value corresponding to the second current and thus reading information written in the magneto-resistive element memory call.

28. A method according to claim 27, wherein the third current has a level which causes a magnetization rotation of the first ferromagnetic film but does not cause a magnetization rotation of the second ferromagnetic film.

29. A method for writing information to and reading information from an MRAM including a plurality of magneto-resistive effect memory cells, each magneto-resistive effect memory cell including:
a first ferromagnetic film,
a second ferromagnetic film,
a nonmagnetic film interposed between the first ferromagnetic film and the second ferromagnetic film, and at least one conductive film,
wherein the first ferromagnetic film has a magnetization more easily rotatable than a magnetization of the second ferromagnetic film by an external magnetic field,
the plurality of conductive films being arranged in at least one prescribed direction, the method comprising the steps of:

causing a first current to flow in the at least one conductive film of a first magneto-resistive effect memory cell of the plurality of magneto-resistive effect memory cells to cause a magnetization rotation of at least the first ferromagnetic film of the first magneto-resistive effect memory cell, thereby writing information in the first magneto-resistive effect memory cell; and causing a second current to flow in the first ferromagnetic film, the nonmagnetic film, and the second ferromagnetic film of the first magneto-resistive effect memory cell; and causing a third current, which is a combination of a positive bias current and a negative bias current, to flow in the at least one conductive film of the first magneto-resistive effect memory cell, thereby reading a voltage value corresponding to the second current and thus reading information written in the first magneto-resistive effect memory cell.

30. A method according to claim 29, wherein the third current has a level which causes a magnetization rotation of the first ferromagnetic film but does not cause a magnetization rotation of the second ferromagnetic film.

31. A method according to claim 29, further comprising the step of causing a fourth current to flow in the at least one conductive film of a second magneto-resistive effect memory cell other than the first magneto-resistive effect memory cell, the fourth current flowing in a direction for canceling a magnetic field leaked to a third magneto-resistive effect memory cell other than the first magneto-resistive effect memory cell.

32. A method according to claim 31, wherein the second magneto-resistive effect memory cell is identical with the third magneto-resistive effect memory cell.

33. A method for reading information from a magneto-resistive effect memory cell, the magneto-resistive effect memory cell including:
a first ferromagnetic film,
a second ferromagnetic film,
a nonmagnetic film interposed between the first ferromagnetic film and the second ferromagnetic film, and
at least one conductive film,
wherein the first ferromagnetic film has a magnetization more easily rotatable than a magnetization of the second ferromagnetic film by an external magnetic field,
the method comprising the step of:
causing a first current to flow in the first ferromagnetic film, the nonmagnetic film, and the second ferromagnetic film; and causing a second current, which is a combination of a positive bias current and a negative bias current, to flow in the at least one conductive film, thereby reading a voltage value corresponding to the first current and thus reading information written in the magneto-resistive effect memory cell.

34. A method according to claim 33, wherein the second current has a level which causes a magnetization rotation of the first ferromagnetic film but does not cause a magnetization rotation of the second ferromagnetic film.

35. A method for reading information from an MRAM including a plurality of magneto-resistive effect memory cells, each magneto-resistive effect memory cell including:
a first ferromagnetic film,
a second ferromagnetic film,
a nonmagnetic film interposed between the first ferromagnetic film and the second ferromagnetic film, and
at least one conductive film,
wherein the first ferromagnetic film has a magnetization more easily rotatable than a magnetization of the second ferromagnetic film by an external magnetic field, the plurality of conductive films being arranged in at least one prescribed direction, the method comprising the step of:
causing a first current to flow in the first ferromagnetic film, the nonmagnetic film, and the second ferromagnetic film of a first magneto-resistive effect memory cell of the plurality of magneto-resistive effect memory cells; and causing a second current, which is a combination of a positive bias current and a negative bias current, to flow in the at least one conductive film of the first magneto-resistive effect memory cell, thereby reading a voltage value corresponding to the first current and thus reading information written in the first magneto-resistive effect memory cell.

36. A method according to claim 35, wherein the second current has a level which causes a magnetization rotation of the first ferromagnetic film but does not cause a magnetization rotation of the second ferromagnetic film.

37. A method according to claim 35, further comprising the step of causing a third current to flow in the at least one conductive film of a second magneto-resistive effect memory cell other than the first magneto-resistive effect memory cell, the third current flowing in a direction for canceling a magnetic field leaked to a third magneto-resistive effect memory cell other than the first magneto-resistive effect memory cell.

38. A method according to claim 37, wherein the second magneto-resistive effect memory cell is identical with the third magneto-resistive effect memory cell.

39. A method for writing multiple levels of a signal to and reading multiple levels of a signal from a magneto-resistive effect memory cell, the magneto-resistive effect memory cell including:
at least two layer structures;
at least one first nonmagnetic film interposed between the at least two layer structures; and
at least one conductive film,
wherein:
each of the at least two layer structures includes a first ferromagnetic film, a second ferromagnetic film, and a second nonmagnetic film interposed between the first ferromagnetic film and the second ferromagnetic film, and
the first ferromagnetic film has a magnetization more easily rotatable than a magnetization of the second ferromagnetic film,
the method comprising the steps of:
causing a first current in the at least one conductive film to cause a magnetization rotation of at least one of the first ferromagnetic film and the second ferromagnetic film of each of the at least two layer structures, or to cause a magnetization rotation of none of the first ferromagnetic film and the second ferromagnetic film of each of the at least two layer structures, thereby writing multiple levels of a signal in the magneto-resistive effect memory cell; and
causing a second current to each of the at least two layer structures to compare a resistance value corresponding to the second current and a reference resistance value, thereby reading the multiple levels of the signal written in the magneto-resistive effect memory cell.

40. A method according to 39, further comprising the step of causing a current which rises in a gradually increasing manner to flow in the at least one conductive film.

41. A method for writing multiple levels of a signal to a magneto-resistive effect memory cell, the magneto-resistive effect memory cell including:

at least two layer structures;
at least one first nonmagnetic film interposed between the at least two layer structures; and
at least one conductive film,
wherein:
each of the at least two layer structures includes a first ferromagnetic film, a second ferromagnetic film, and a second nonmagnetic film interposed between the first ferromagnetic film and the second ferromagnetic film, and
the first ferromagnetic film has a magnetization more easily rotatable than a magnetization of the second ferromagnetic film,
the method comprising the steps of:
causing a first current to flow in the at least one conductive film to cause a magnetization rotation of at least one of the first ferromagnetic film and the second ferromagnetic film of each of the at least two layer structures, or to cause a magnetization rotation of none of the first ferromagnetic film and the second ferromagnetic film of each of the at least two layer structures, thereby writing multiple levels of a signal in the magneto-resistive effect memory cell.

42. A method for reading multiple levels of a signal from a magneto-resistive effect memory cell, the magneto-resistive effect memory cell including:
at least two layer structures;
at least one first nonmagnetic film interposed between the at least two layer structures; and
at least one conductive film,
wherein:
each of the at least two layer structures includes a first ferromagnetic film, a second ferromagnetic film, and a second nonmagnetic film interposed between the first ferromagnetic film and the second ferromagnetic film, and
the first ferromagnetic film has a magnetization more easily rotatable than a magnetization of the second ferromagnetic film,
the method comprising the steps of:
causing a first current to flow in each of the at least two layer structures to compare a resistance value corresponding to the first current and a reference resistance value, thereby reading multiple levels of a signal written in the magneto-resistive effect memory cell.

43. A method according to 42, further comprising the step of causing a current which rises in a gradually increasing manner to flow in the at least one conductive film.

44. A method for writing multiple levels of a signal to and reading multiple levels of a signal from an MRAM including a plurality of magneto-resistive effect memory cells, each magneto-resistive effect memory cell, including:
at least two layer structures;
at least one first nonmagnetic film interposed between the at least two layer structures; and
at least one conductive film,
wherein:
each of the at least two layer structures includes a first ferromagnetic film, a second ferromagnetic film, and a second nonmagnetic film interposed between the first ferromagnetic film and the second ferromagnetic film, and
the first ferromagnetic film has a magnetization more easily rotatable than a magnetization of the second ferromagnetic film,
the plurality of conductive films being arranged in at least one prescribed direction, the method comprising the steps of:
causing a first current to flow in the at least one conductive film of a first magneto-resistive effect memory cell of the plurality of magneto-resistive effect memory cells to cause a magnetization rotation of at least one of the first ferromagnetic film and the second ferromagnetic film of each of the at least two layer structures of the first magneto-resistive effect memory cell, or to cause a magnetization rotation of none of the first ferromagnetic film and the second ferromagnetic film of each of the at least two layer structures of the first magneto-resistive effect memory cell, thereby writing multiple levels of a signal in the first magneto-resistive effect memory cell; and
causing a second current to flow in each of the at least two layer structures of the first magneto-resistive effect memory cell to compare a resistance value corresponding to the second current and a reference resistance value, thereby reading the multiple levels of the signal written in the first magneto-resistive effect memory cell.

45. A method according to 44, further comprising the step of causing a current which rises in a gradually increasing manner to flow in the at least one conductive film.

46. A method according to 44, further comprising the step of causing a third current to flow in the at least one conductive film of a second magneto-resistive effect memory cell other than the first magneto-resistive effect memory cell, the third current flowing in a direction for canceling a magnetic field leaked to a third magneto-resistive effect memory cell other than the first magneto-resistive effect memory cell.

47. A method according to 46, wherein the second magneto-resistive effect memory cell is identical with the third magneto-resistive effect memory cell.

48. A method for writing multiple levels of a signal in an MRAM including a plurality of magneto-resistive effect memory cells, each magneto-resistive effect memory cell including:
at least two layer structures;
at least one first nonmagnetic film interposed between the at least two layer structures; and
at least one conductive film,
wherein:
each of the at least two layer structures includes a first ferromagnetic film, a second ferromagnetic film, and a second nonmagnetic film interposed between the first ferromagnetic film and the second ferromagnetic film, and
the first ferromagnetic film has a magnetization more easily rotatable than a magnetization of the second ferromagnetic film,
the plurality of conductive films being arranged in at least one prescribed direction, the method comprising the steps of:
causing a first current of flow in the at least one conductive film of a first magneto-resistive effect memory cell of the plurality of magneto-resistive effect memory cells to cause a magnetization rotation of at least one of the first ferromagnetic film and the second ferromagnetic film of each of the at least two layer structures of the first magneto-resistive effect memory cell, or to cause a magnetization rotation of none of the first ferromagnetic film and the second ferromagnetic film of each of the at least two layer structures of the first magneto-resistive effect memory cell, thereby writing multiple levels of a signal in the first magneto-resistive effect memory cell.

49. A method according to claim 48, further comprising the step of causing a second current to flow in the at least one conductive film or a second magneto-resistive effect memory cell other than the first magneto-resistive effect memory cell, the second current flowing in a direction for canceling a magnetic field leaked to a third magneto-resistive effect memory cell other than the first magneto-resistive effect memory cell.

50. A method according to claim 49, wherein the second magneto-resistive effect memory cell is identical with the third magneto-resistive effect memory cell.

51. A method for reading multiple levels of a signal from an MRAM including a plurality of magneto-resistive effect memory cells, each magneto-resistive effect memory cell including:
- at least two layer structures;
- at least one first nonmagnetic film interposed between the at least two layer structures; and
- at least one conductive film, wherein:
each of the at least two layer structures includes a first ferromagnetic film, a second ferromagnetic film, and a second nonmagnetic film interposed between the first ferromagnetic film and the second ferromagnetic film, and the first ferromagnetic film has a magnetization more easily rotatable than a magnetization of the second ferromagnetic film, the plurality of conductive films being arranged in at least one prescribed direction, the method comprising the steps of:

causing a first current to flow in each of the at least two layer structures of a first magneto-resistive effect memory cell of the plurality of magneto-resistive effect memory cells to compare a resistance value corresponding to a the first current and a reference resistance value, thereby reading multiple levels of a signal written in the first magneto-resistive effect memory cell.

52. A method according to claim 51, further comprising the step of causing a current which rises in a gradually increasing manner to flow in the at least one conductive film.

53. A method according to claim 51, further comprising the step of causing a second current to flow in the at least one conductive film of a second magneto-resistive effect memory call other than the first magneto-resistive effect memory cell, the second current flowing in a direction for canceling a magnetic field leaked to a third magneto-resistive effect memory cell other than the first magneto-resistive effect memory cell.

54. A method according to claim 53, wherein the second magneto-resistive effect memory cell is identical with the third magneto-resistive effect memory cell.

55. A magneto-resistive effect element according to claim 1, wherein the first ferromagnetic film has an effective magnetic thickness of about 2 nm or less.

* * * * *

UNITED STATES PATENT AND TRADEMARK OFFICE
CERTIFICATE OF CORRECTION

PATENT NO. : 7,018,725 B2
APPLICATION NO. : 10/034895
DATED : March 28, 2006
INVENTOR(S) : Odagawa et al.

It is certified that error appears in the above-identified patent and that said Letters Patent is hereby corrected as shown below:

Col. 42 Claim 11, line 11, replace "rotatable the a magnetization" with --rotatable than a magnetization--.
Col. 43 Claim 17, line 16, replace "ferromagnetic fibs," with --ferromagnetic film,--.
Col. 44 Claim 27, line 24, replace "memory call" with --memory cell--.
Col. 46 Claim 40, line 1, replace "to 39," with --to claim 39,--.
Col. 47 Claim 43, line 1, replace "to 42," with --to claim 42,--.
Col. 48 Claim 45, line 1, replace "to 44," with --to claim 44,--.
Col. 48 Claim 46, line 1, replace "to 44," with --to claim 44,--.
Col. 48 Claim 47, line 1, replace "to 46," with --to claim 46,--.
Col. 49 Claim 49, line 3, replace "film or a" with --film of a--.
Col. 49 Claim 51, line 25, replace "to a the" with --to the--.
Col. 50 Claim 53, line 4, replace "memory call other" with --memory cell other--.

Signed and Sealed this

Twenty-fifth Day of July, 2006

JON W. DUDAS
*Director of the United States Patent and Trademark Office*